United States Patent [19]

Cunningham et al.

[11] Patent Number: 5,659,680
[45] Date of Patent: Aug. 19, 1997

[54] PC COMPATIBLE MODULAR BASED DIAGNOSTIC SYSTEM

[75] Inventors: Glen B. Cunningham, Boston, Mass.; Andrew R. Reading, Rochester Hills; Michael F. Kapolka, Sterling Heights, both of Mich.

[73] Assignee: Micro Processor Systems, Inc., Sterling Heights, Mich.

[21] Appl. No.: 491,341

[22] Filed: Jun. 30, 1995

[51] Int. Cl.$^6$ .................................................. G06F 11/00
[52] U.S. Cl. .................................. 395/183.01; 395/281
[58] Field of Search ........................... 395/183.01, 183.2, 395/183.22, 180, 800, 280, 281, 282

[56] References Cited

U.S. PATENT DOCUMENTS

| | | | |
|---|---|---|---|
| 4,551,801 | 11/1985 | Sokol | 364/424 |
| 4,628,437 | 12/1986 | Poschmann et al. | 364/131 |
| 4,658,370 | 4/1987 | Erman et al. | 364/513 |
| 4,837,764 | 6/1989 | Russello | 395/183.2 |
| 4,853,850 | 8/1989 | Krass, Jr. et al. | 364/200 |
| 4,868,763 | 9/1989 | Masui et al. | 364/513 |
| 4,943,919 | 7/1990 | Aslin et al. | 365/424.03 |
| 4,953,165 | 8/1990 | Jackson | 395/183.2 |
| 5,003,477 | 3/1991 | Abe et al. | 364/424.03 |
| 5,111,402 | 5/1992 | Brooks et al. | 364/424.04 |
| 5,162,675 | 11/1992 | Olsen et al. | 307/465 |
| 5,214,582 | 5/1993 | Gray | 364/424.03 |
| 5,270,931 | 12/1993 | Appleford | 364/424.01 |
| 5,297,000 | 3/1994 | Freige et al. | 361/692 |
| 5,305,215 | 4/1994 | Brekkestran et al. | 364/424.1 |
| 5,319,767 | 6/1994 | Lau | 395/280 |
| 5,325,464 | 6/1994 | Pechanek et al. | 395/27 |
| 5,347,425 | 9/1994 | Herron et al. | 361/683 |
| 5,361,628 | 11/1994 | Marko et al. | 73/116 |
| 5,365,436 | 11/1994 | Schaller et al. | 364/424.03 |
| 5,377,357 | 12/1994 | Nishigaki et al. | 395/800 |
| 5,404,443 | 4/1995 | Hirata | 395/161 |
| 5,408,412 | 4/1995 | Hogg et al. | 364/424.03 |
| 5,410,717 | 4/1995 | Floro | 395/800 |
| 5,426,739 | 6/1995 | Lin et al. | 395/309 |
| 5,428,806 | 6/1995 | Pocrass et al. | 395/800 |
| 5,430,847 | 7/1995 | Bradley et al. | 395/281 |
| 5,463,742 | 10/1995 | Kobiyashi | 395/281 |
| 5,488,572 | 1/1996 | Belmont | 395/325 |
| 5,513,329 | 4/1996 | Pecone | 395/281 |
| 5,517,623 | 5/1996 | Farrell et al. | 395/281 |

*Primary Examiner*—Robert W. Beausoliel, Jr.
*Assistant Examiner*—Joseph E. Palys
*Attorney, Agent, or Firm*—Foley and Lardner

[57] ABSTRACT

A PC-based diagnostic system is modular-based, and includes a motherboard, a backplane board, a PCMCIA board, and a keypad adapter board. The motherboard communicates with I/O modules connected to the backplane board, PCMCIA modules connected to the PCMCIA board, and with a keypad or a mouse through the keypad adapter board. Based on the type of device to be tested, various diagnostic programs can be accessed internally to provide the signals used to perform the test. A system controller and a processor are provided on the motherboard to control the transfer of data and control from the motherboard, through the backplane, and to the I/O modules. Additional select lines are provided to select one or more I/O modules during a test. An ISA bus is also provided in a standard arrangement.

14 Claims, 56 Drawing Sheets

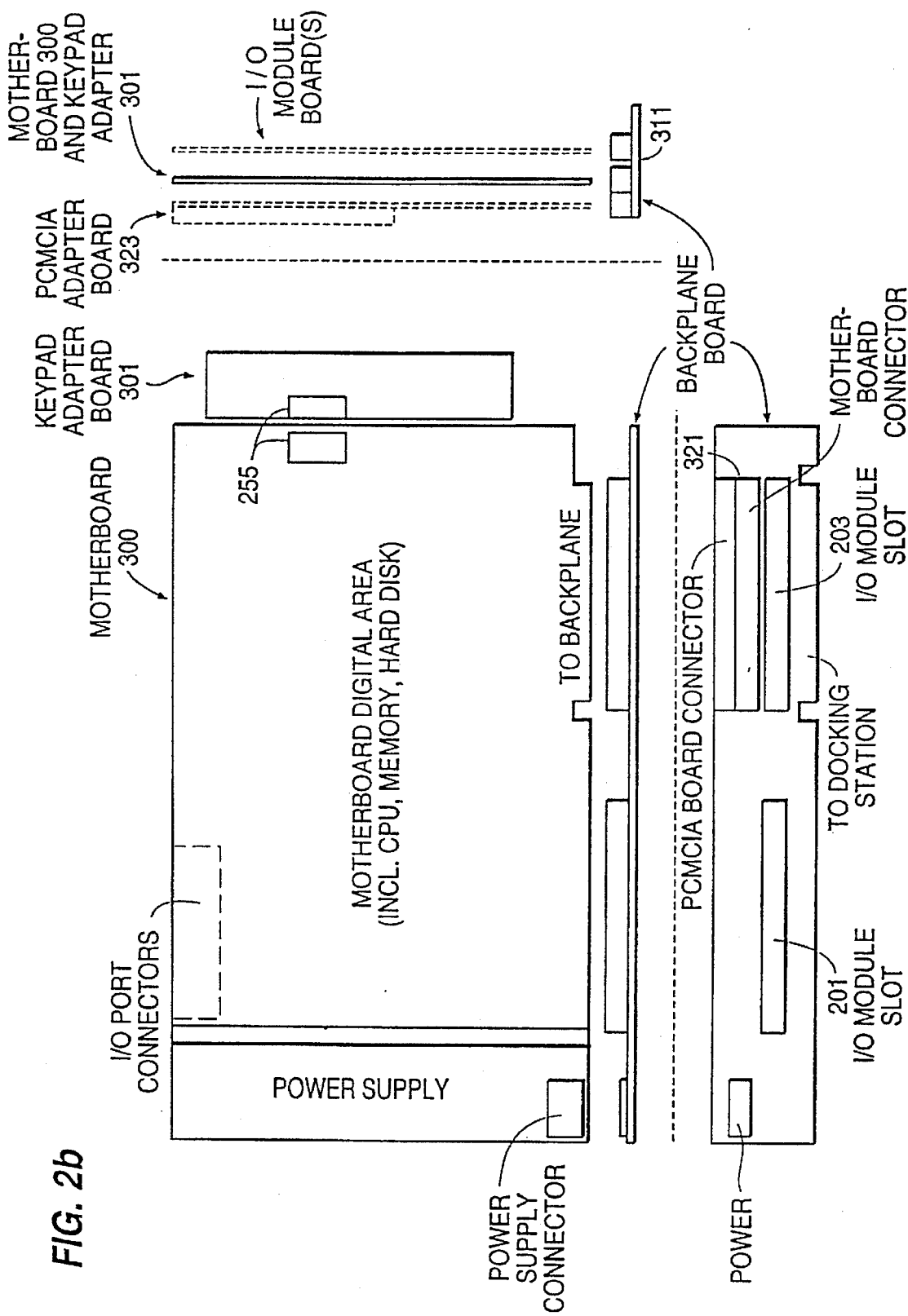

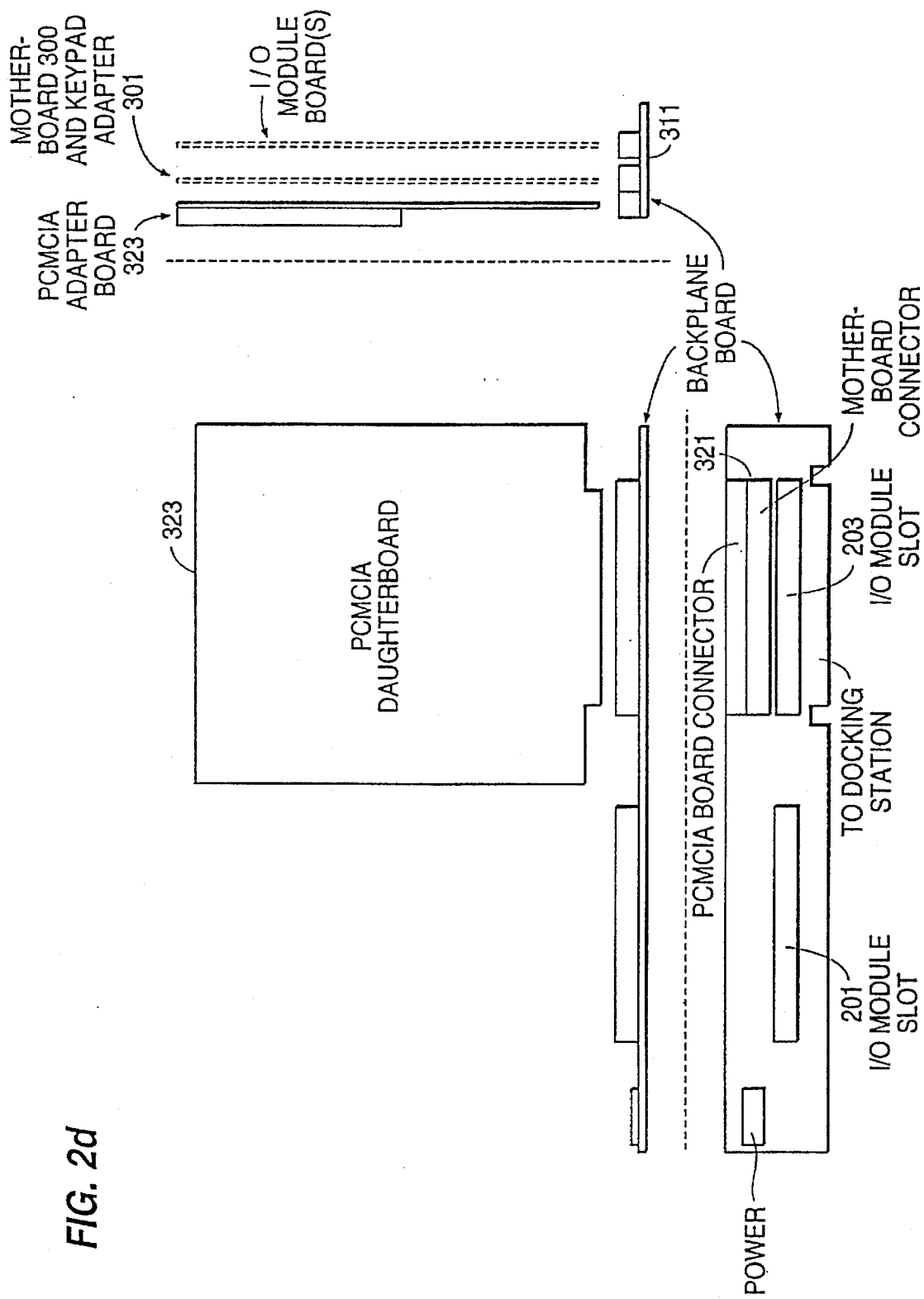

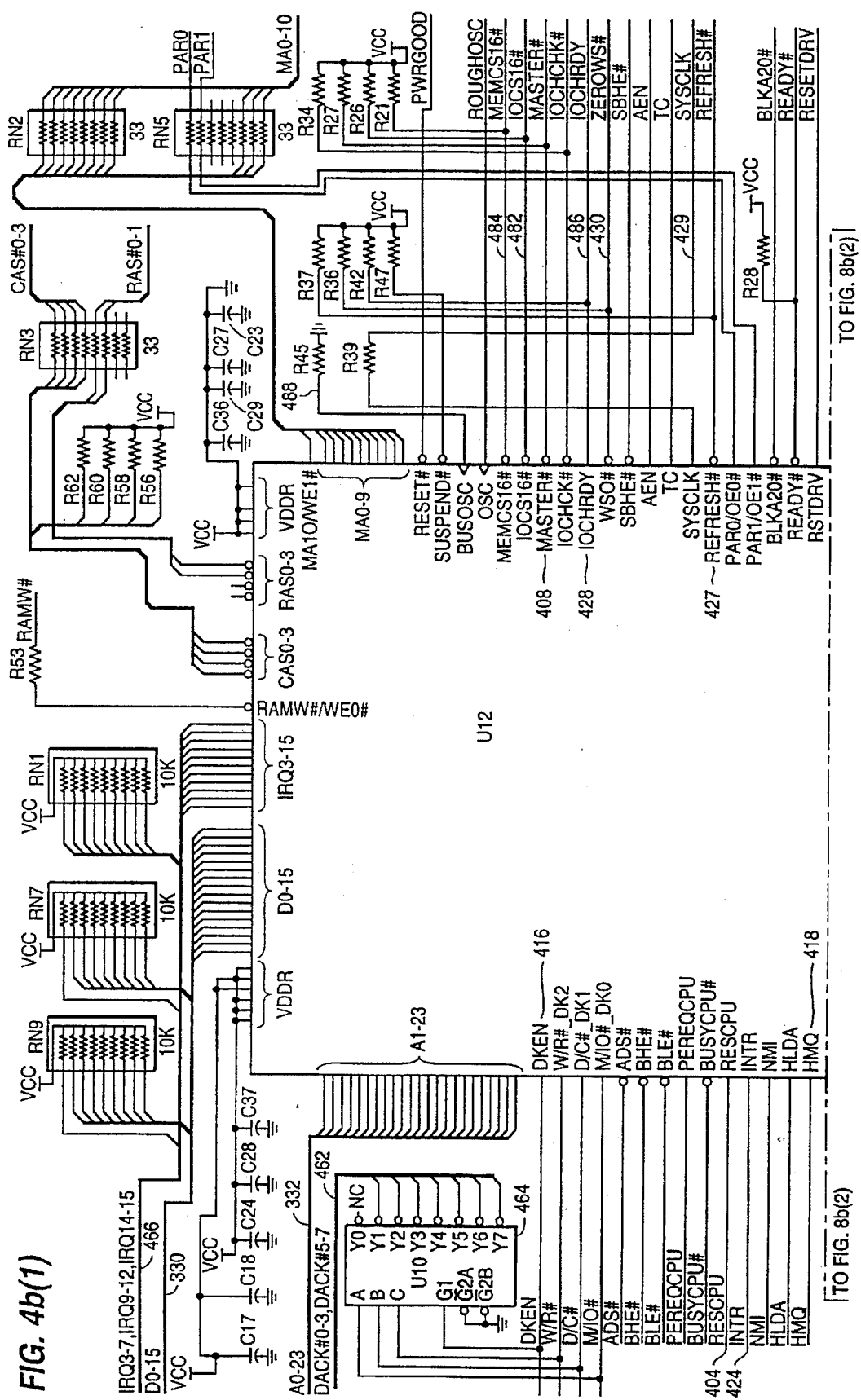
FIG. 4b(1)

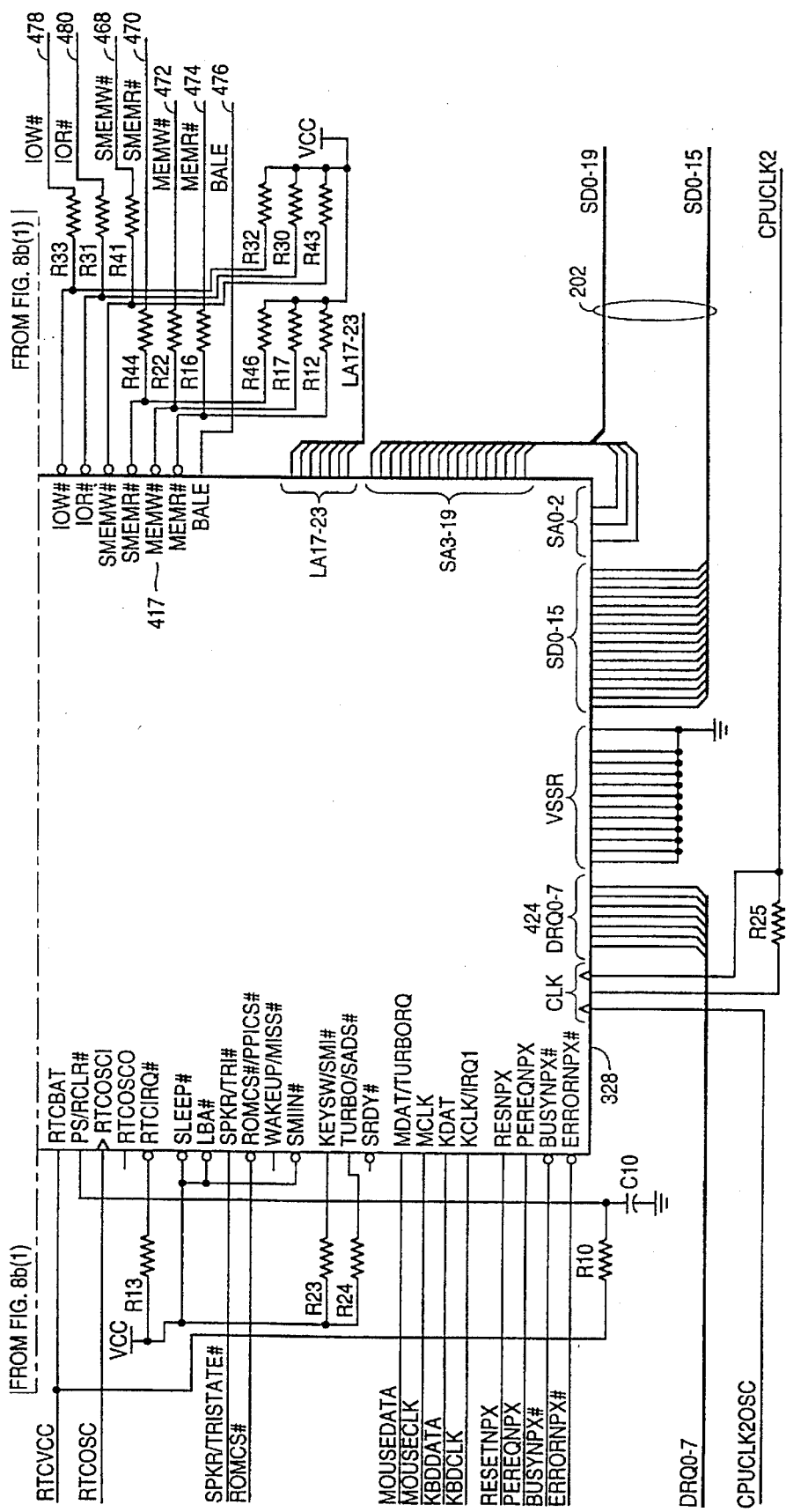
FIG. 4b(2)

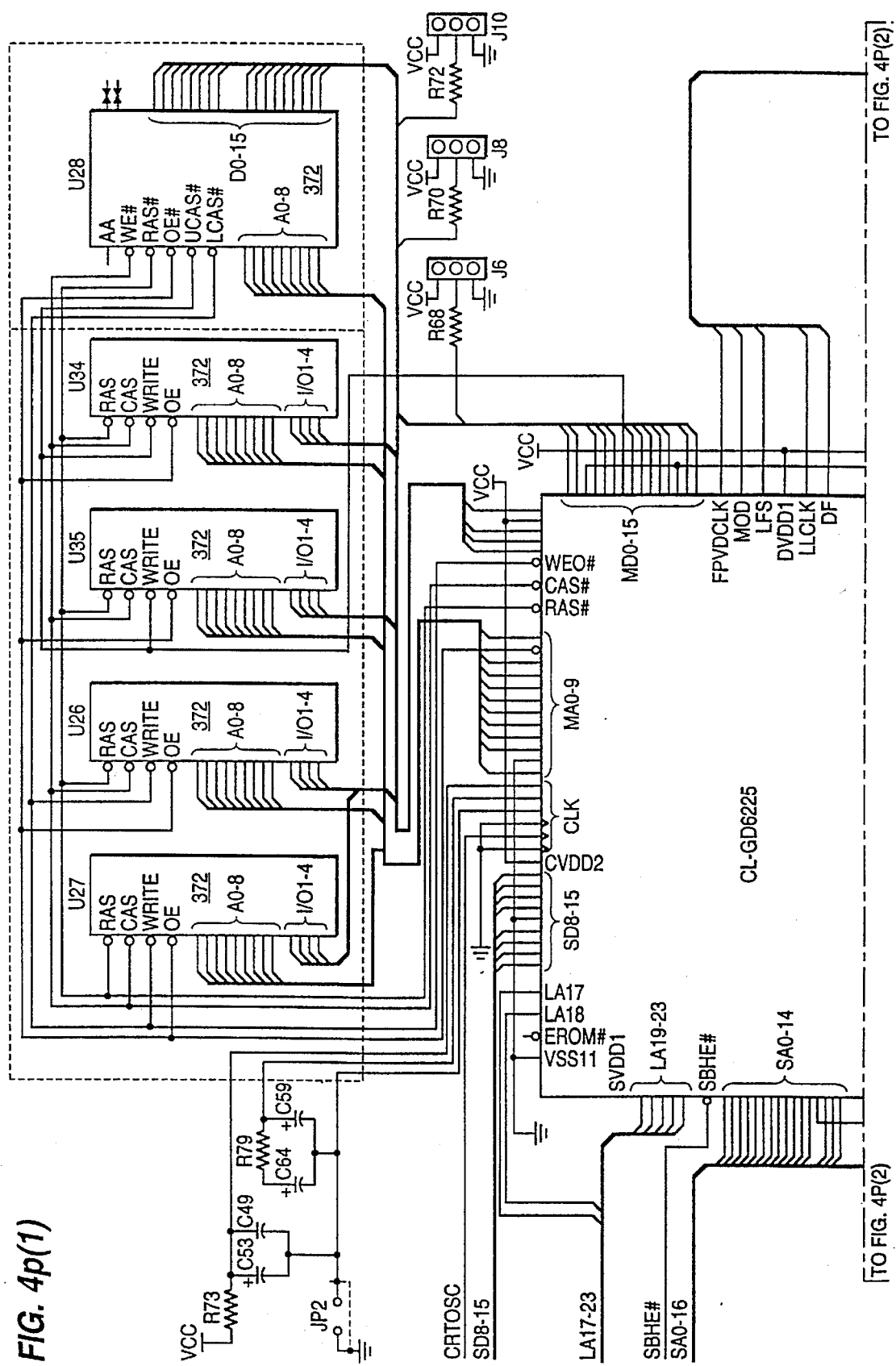
FIG. 4p(1)

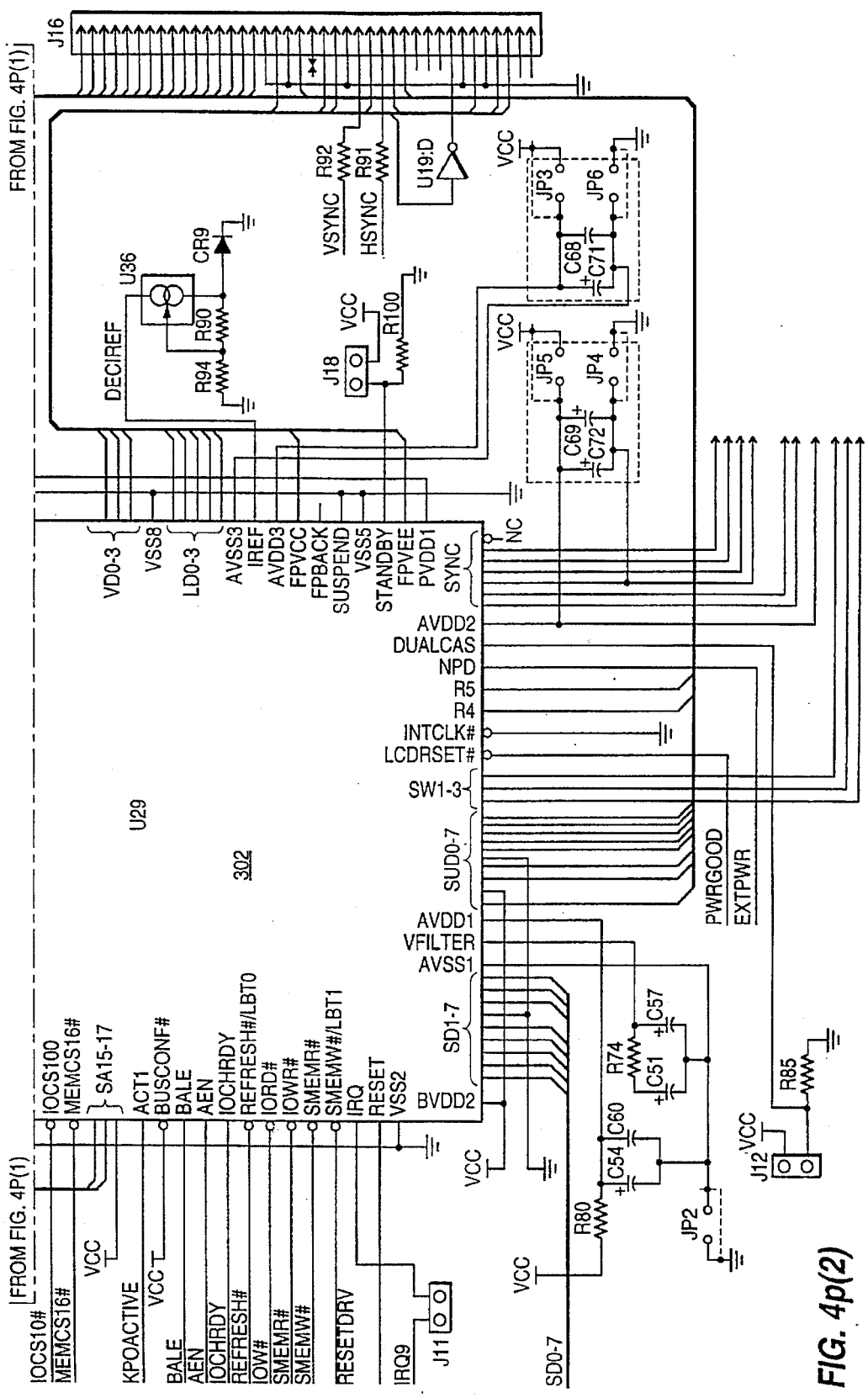
FIG. 4p(2)

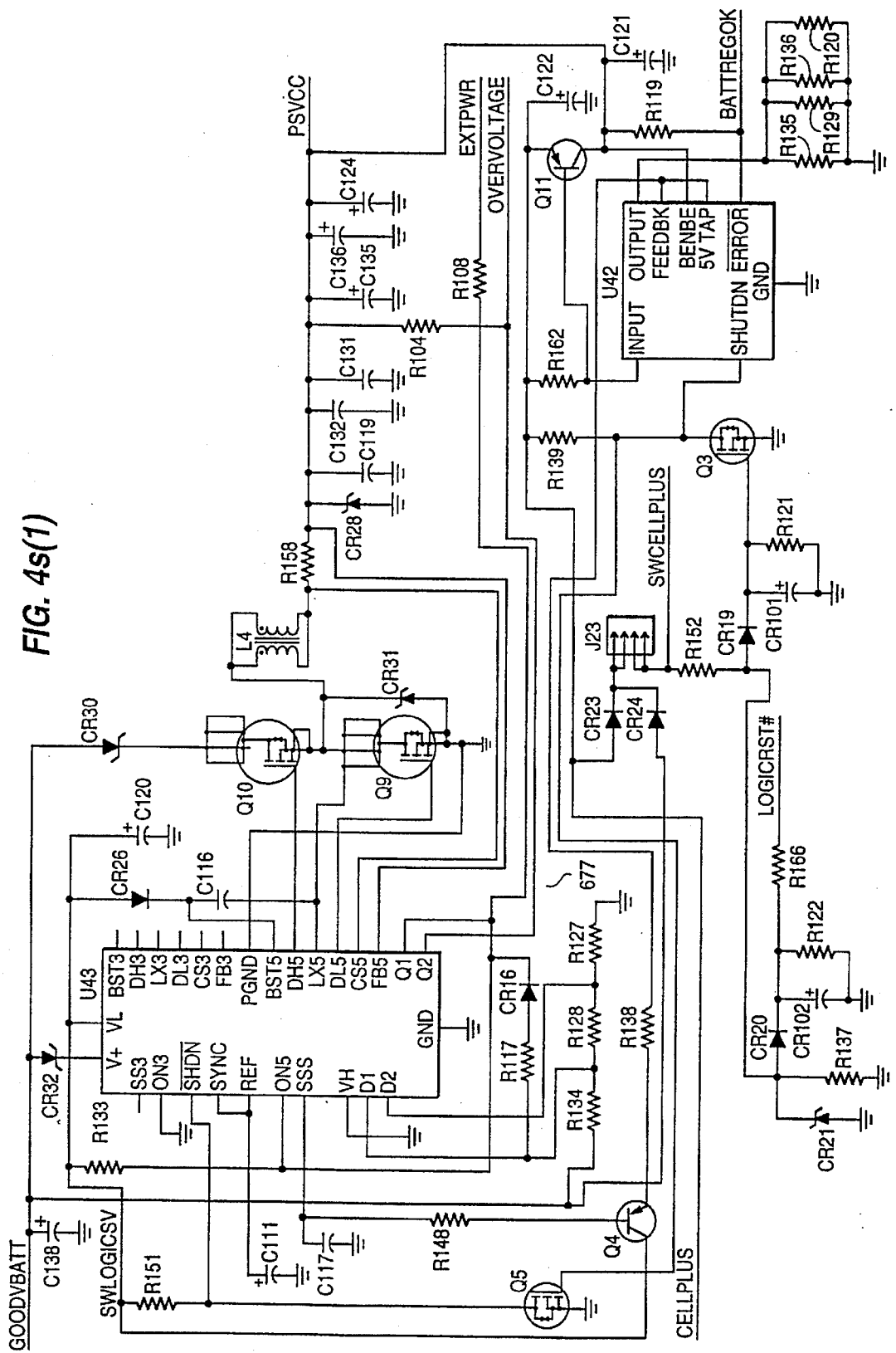
FIG. 4s(1)

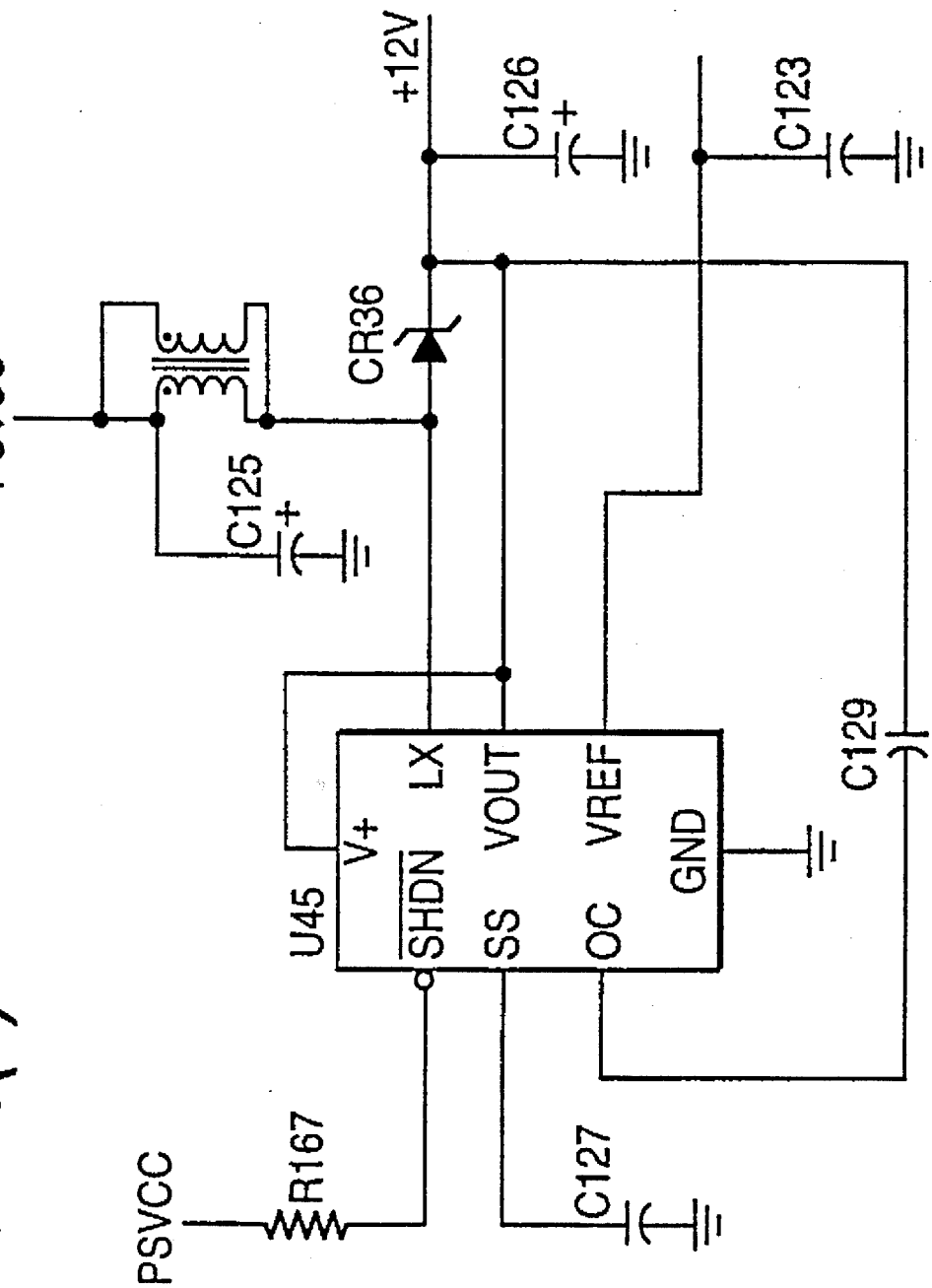
FIG. 4s(2)

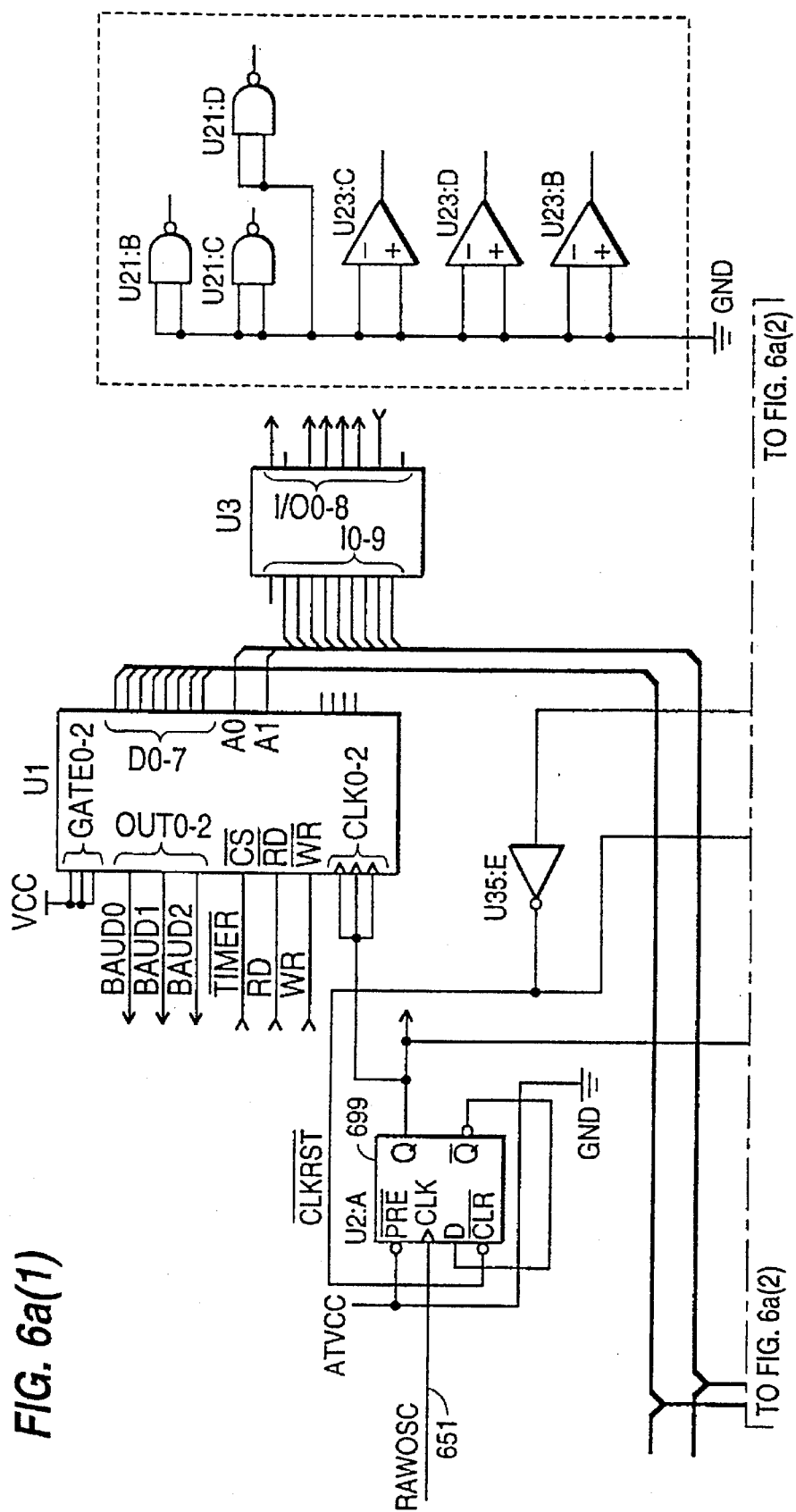
FIG. 6a(1)

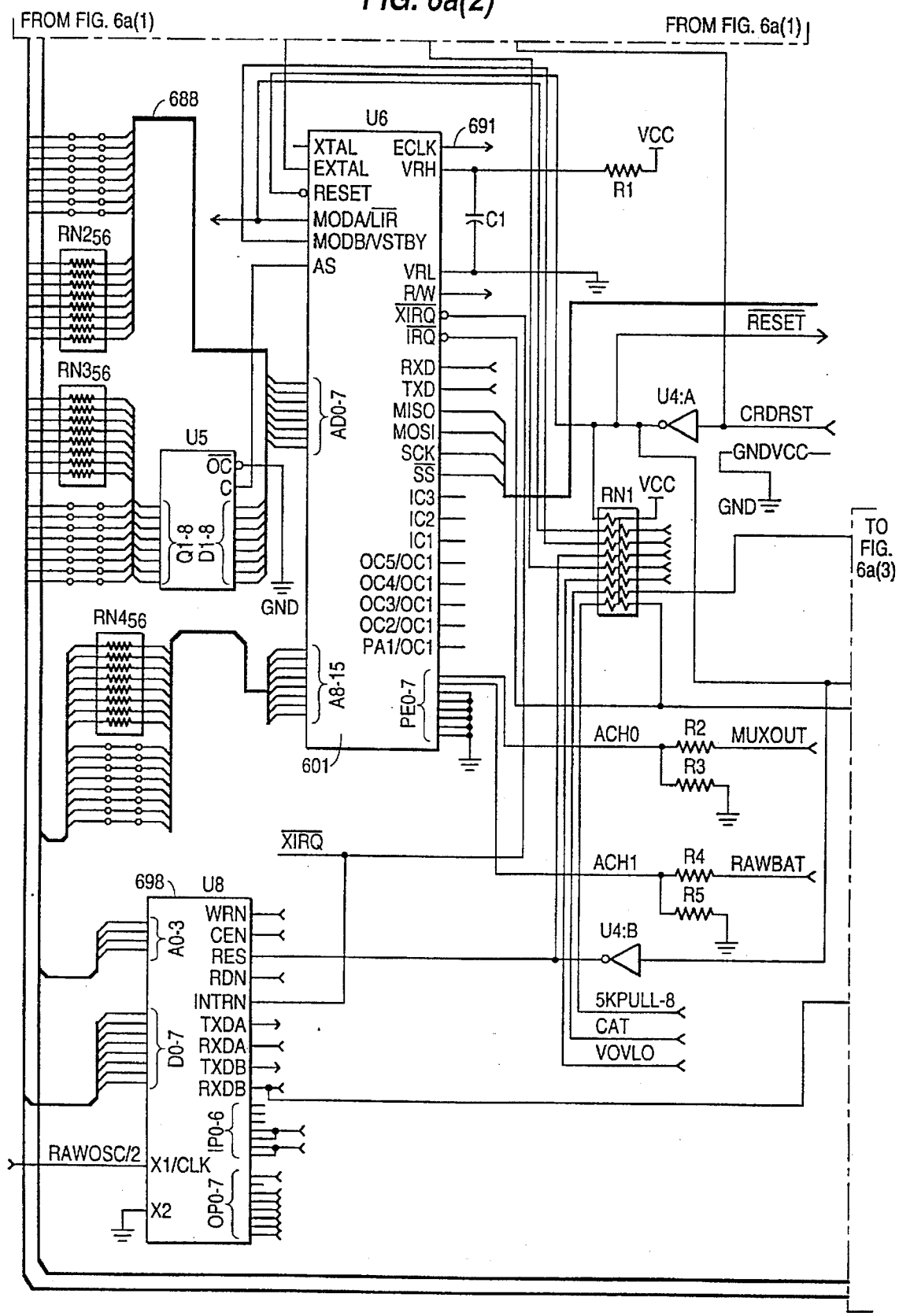
FIG. 6a(2)

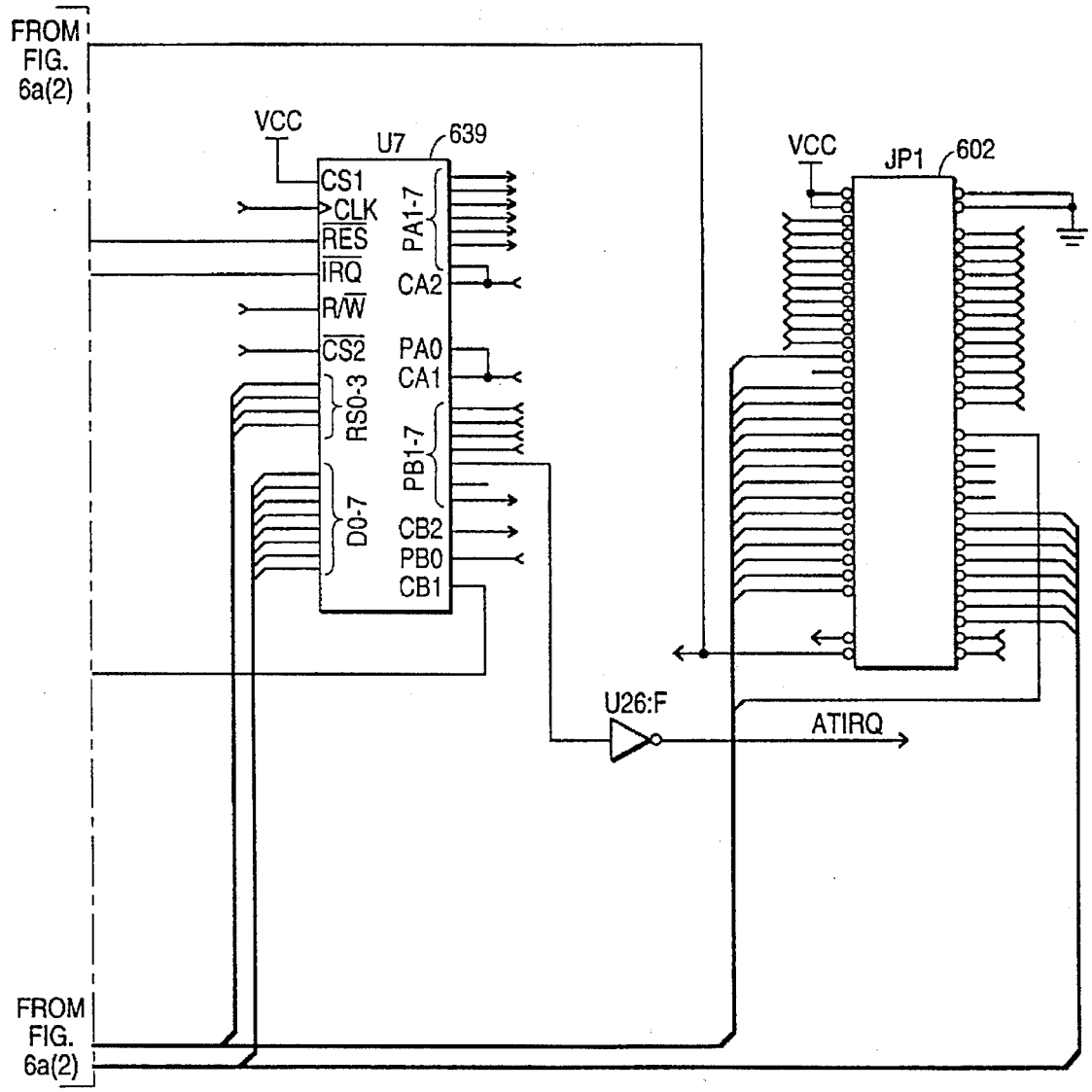
FIG. 6a(3)

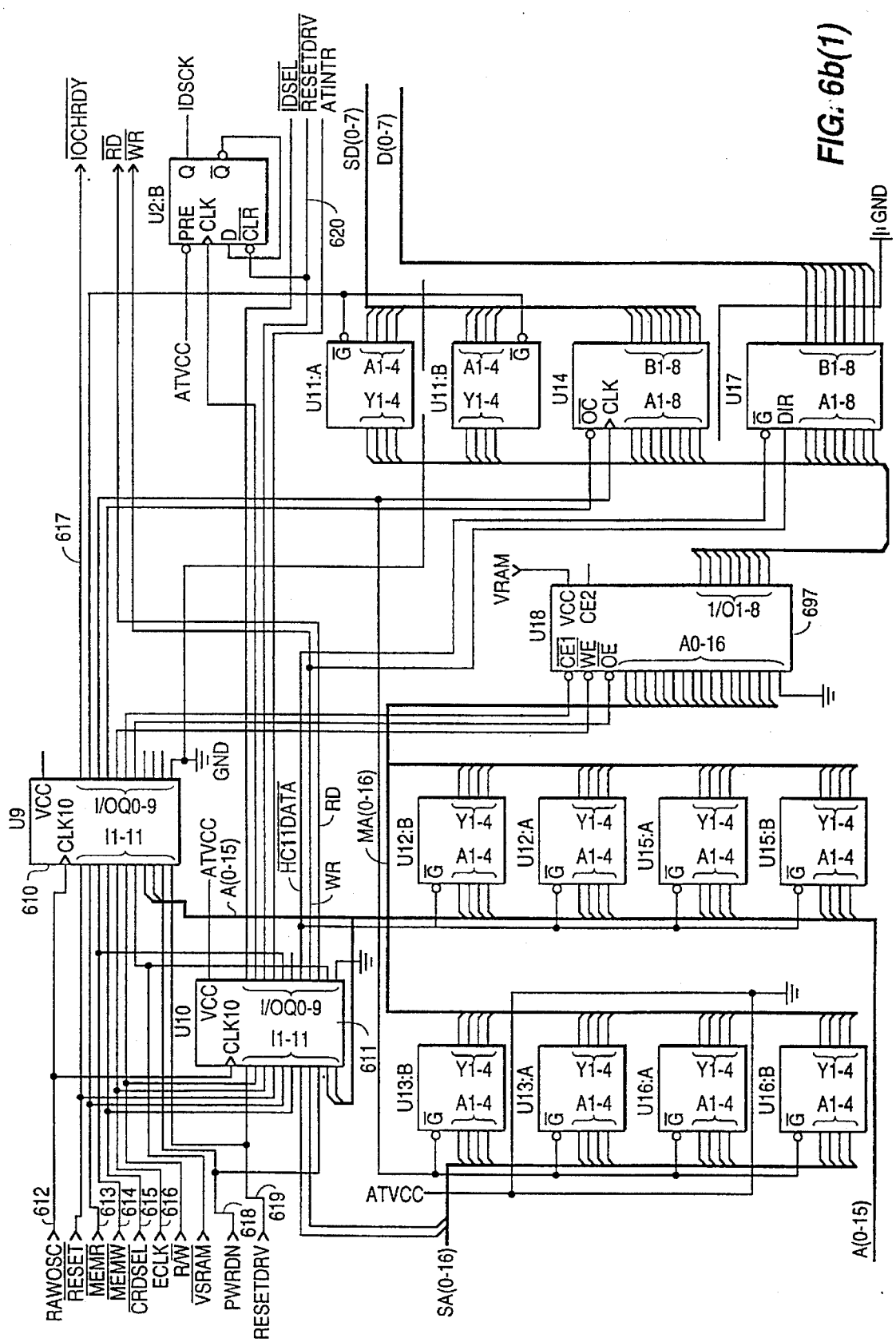
FIG. 6b(1)

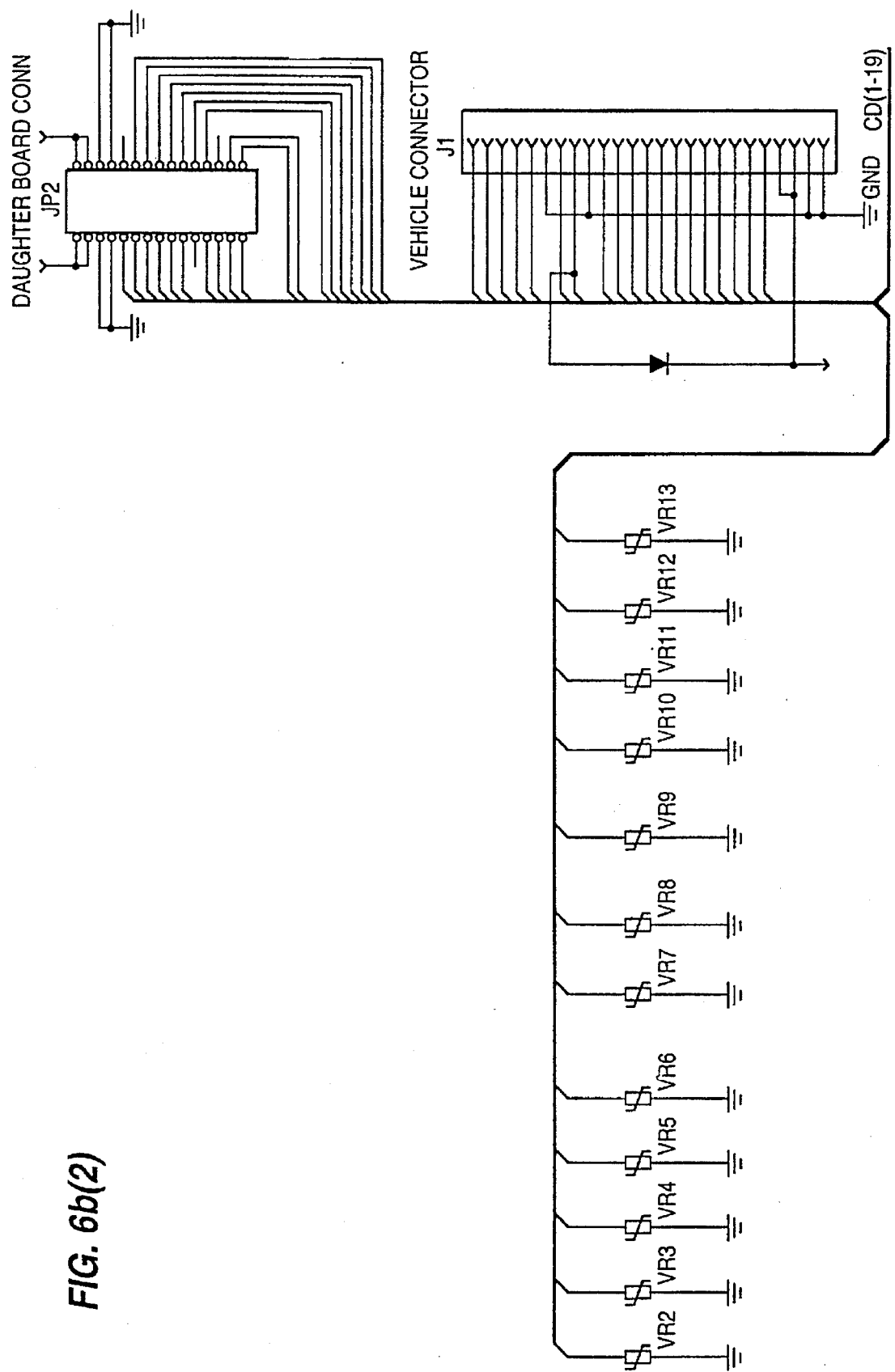
FIG. 6b(2)

FIG. 6c(1)
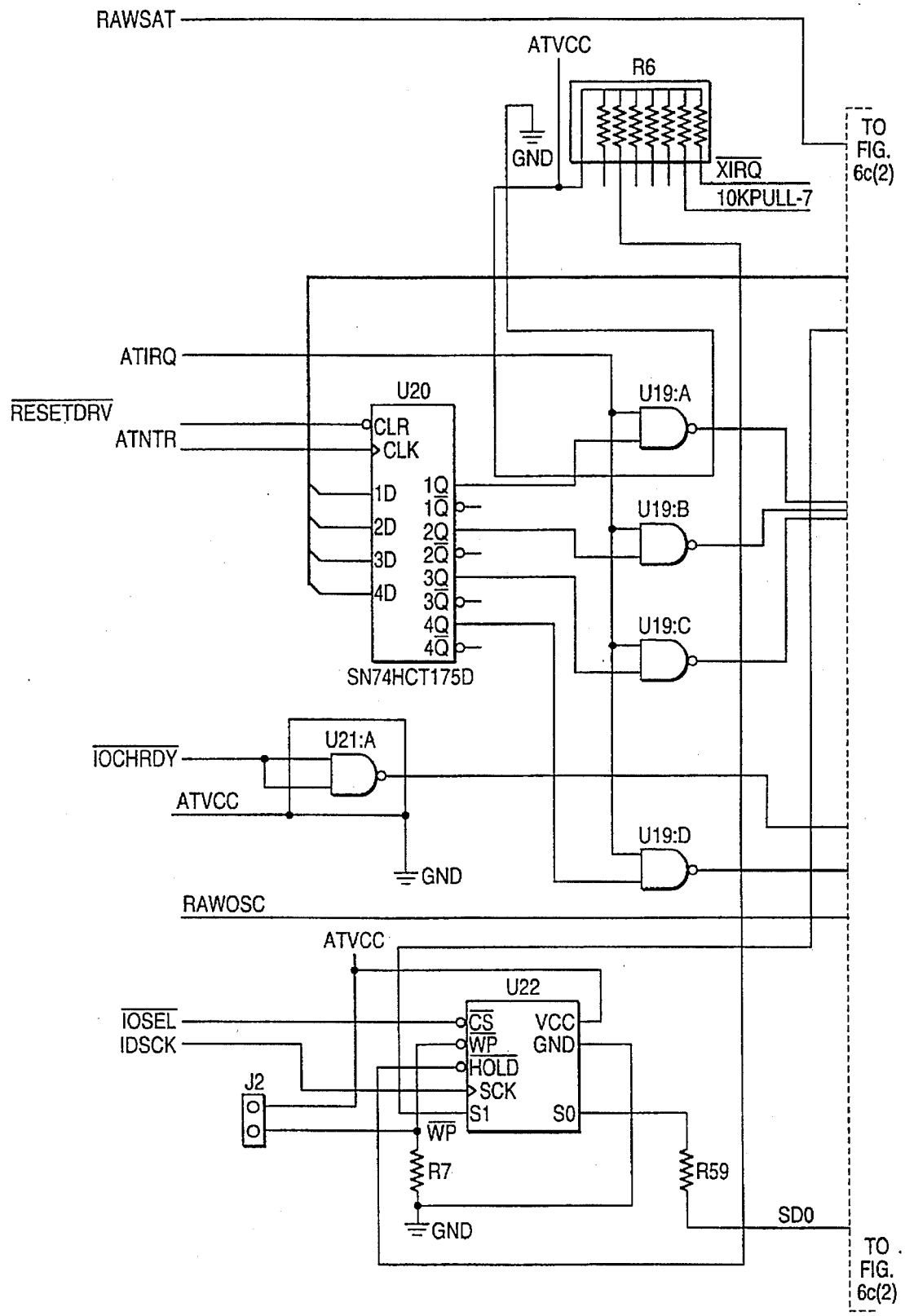

FIG. 6c(2)
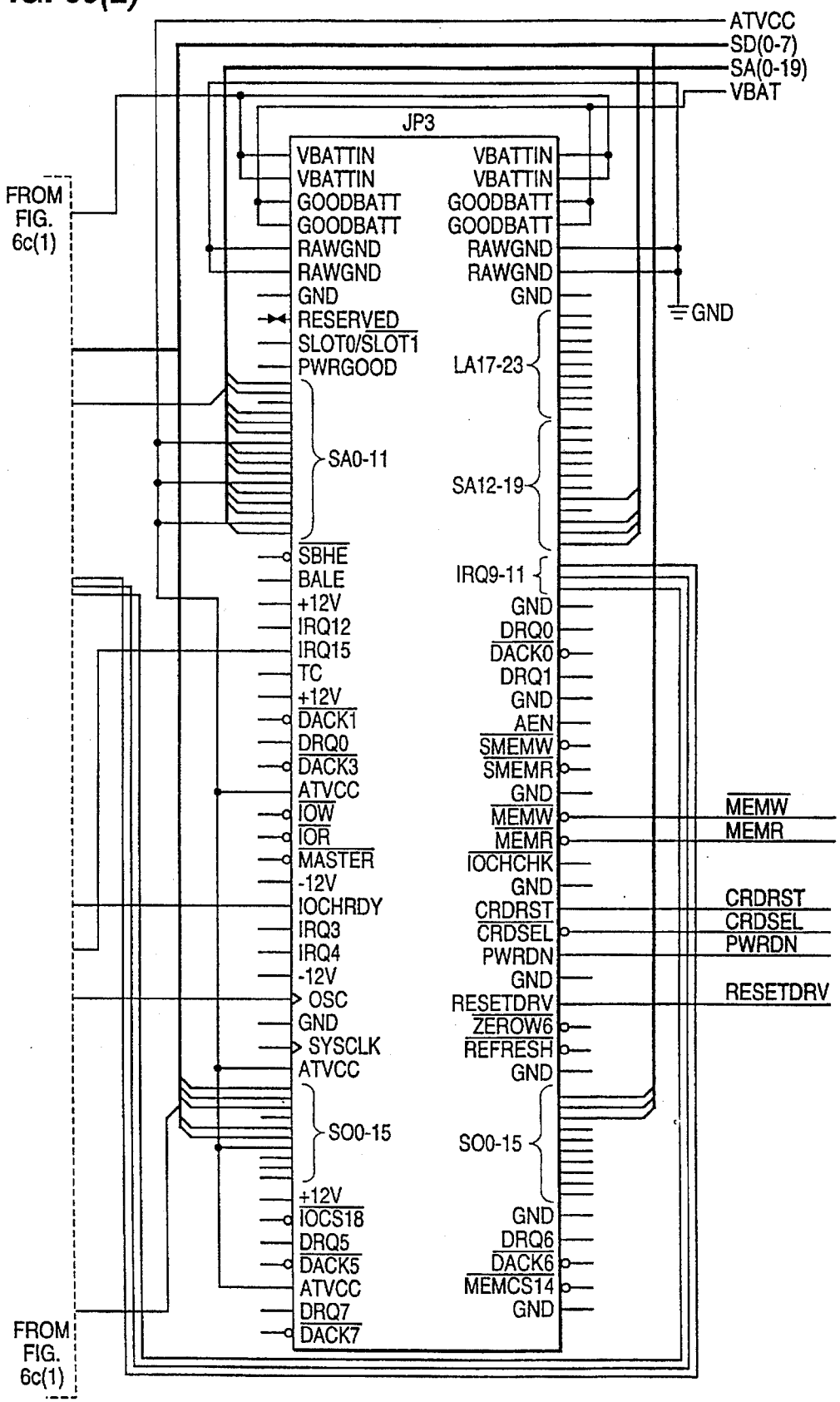

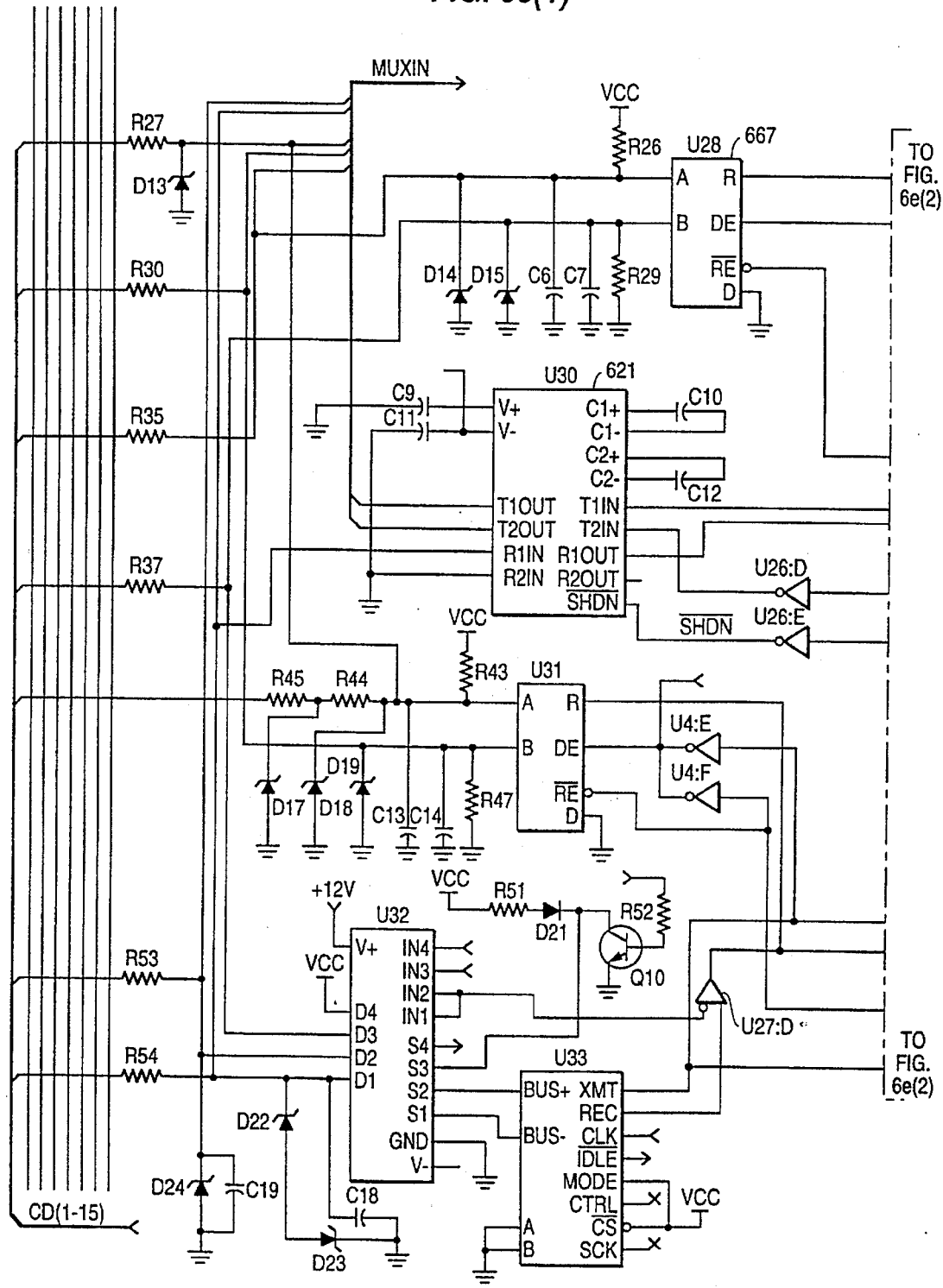
FIG. 6e(1)

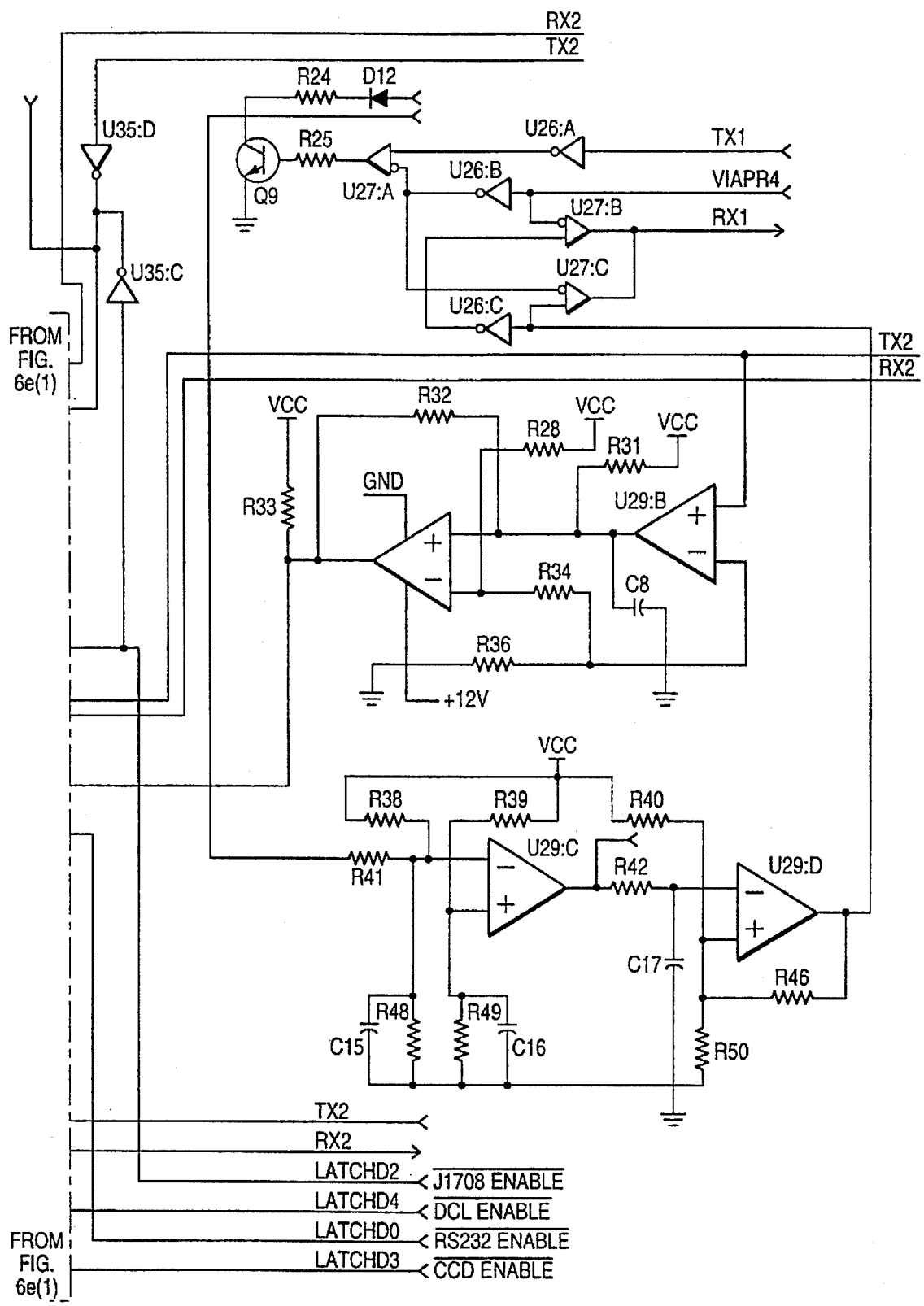
FIG. 6e(2)

FIG. 6g

Write to address 2 (enable prom)
Read address 0 (Bit 2^7 (MSB) of command)
Read address 0
Read address 0 (Bit 2^6 of command)
Read address 0
Read address 0 (Bit 2^5 of command)
Read address 0
Read address 0 (Bit 2^4 of command)
Read address 0
Read address 0 (Bit 2^3 of command)
Read address 0
Read address 0 (Bit 2^2 of command)
Read address 1
Read address 1 (Bit 2^1 of command)
Read address 1
Read address 1 (Bit 2^0 of command)
Read address 0
Read address 0 (Bit 2^7 (MSB) of address)
Read address 0
Read address 0 (Bit 2^6 of address)
Read address 0
Read address 0 (Bit 2^5 of address)
Read address 0
Read address 0 (Bit 2^4 of address)
Read address 0
Read address 0 (Bit 2^3 of address)
Read address 0
Read address 0 (Bit 2^2 of address)
Read address 0
Read address 0 (Bit 2^1 of address)
Read address 0
Read address 0 (Bit 2^0 of address)
Read address 0
Read address 0
Read address 0 (Bit 2^7 (MSB) of data)
Read address 0
Read address 0 (Bit 2^6 of data)
Read address 0
Read address 0 (Bit 2^5 of data)
Read address 0
Read address 0 (Bit 2^4 of data)
Read address 0
Read address 0 (Bit 2^3 of data)
Read address 0
Read address 0 (Bit 2^2 of data)
Read address 0
Read address 0 (Bit 2^1 of data)
Read address 0
Read address 0 (Bit 2^0 of data)

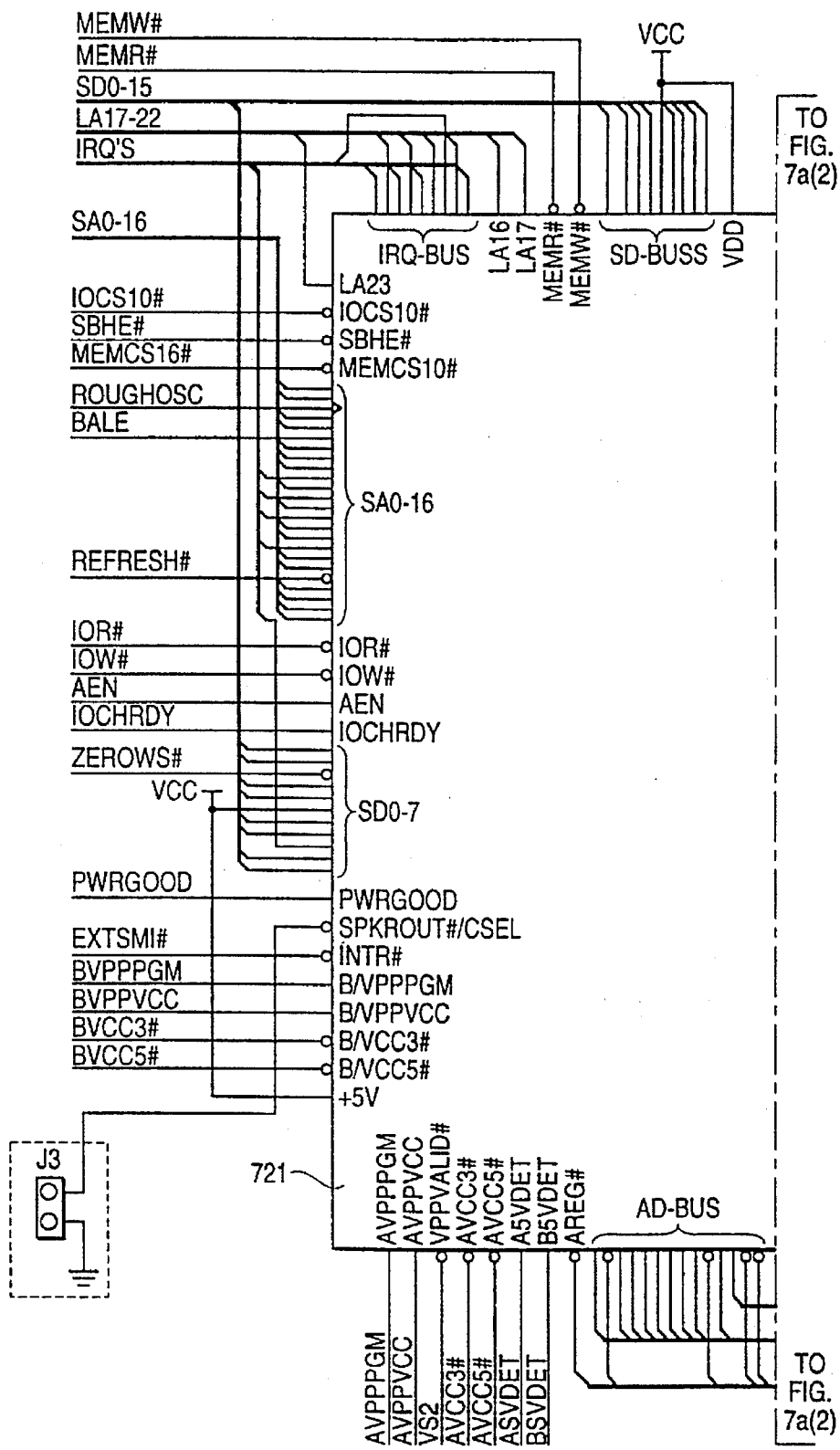
FIG. 7a(1)

FIG. 7a(2)
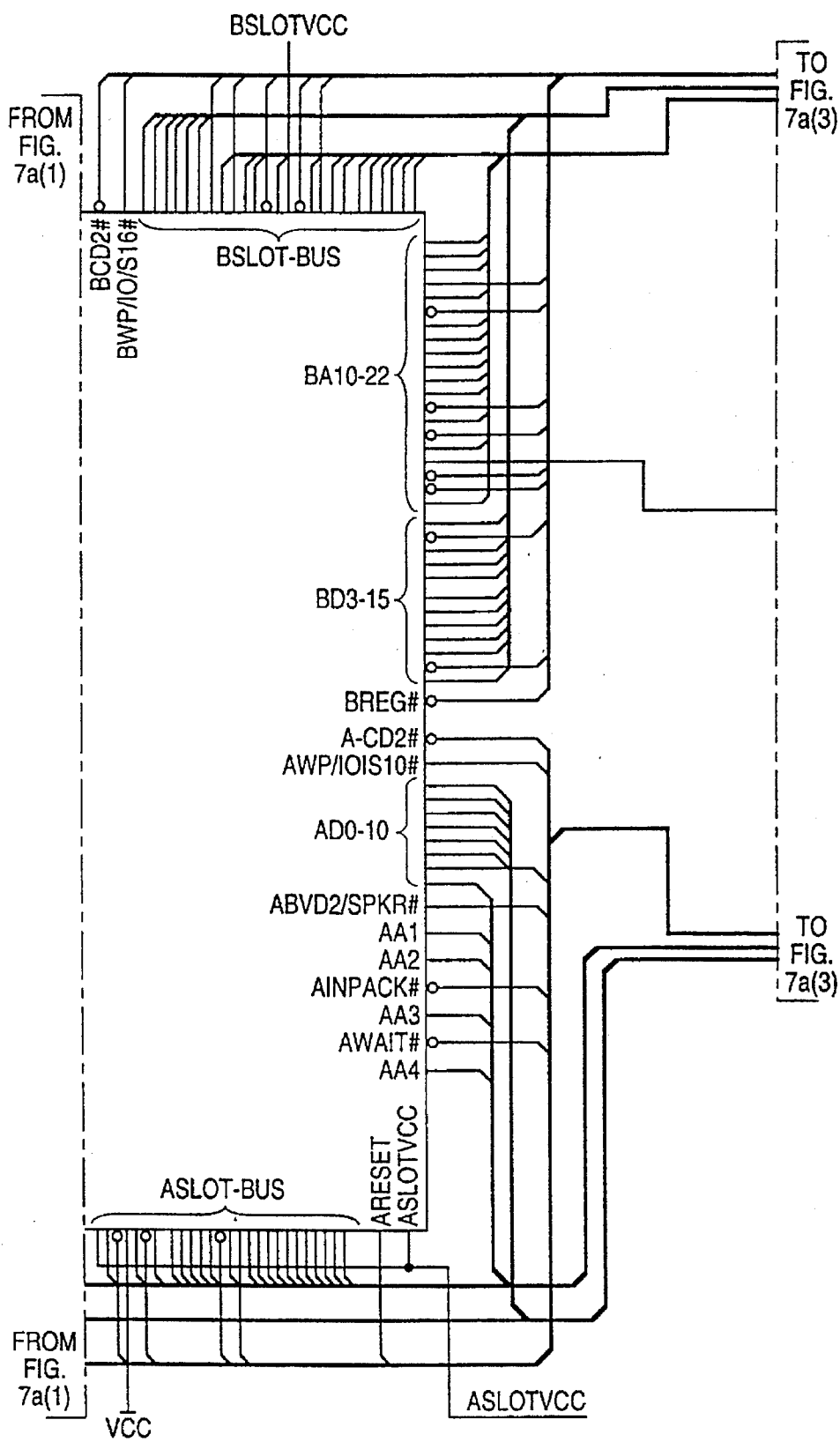

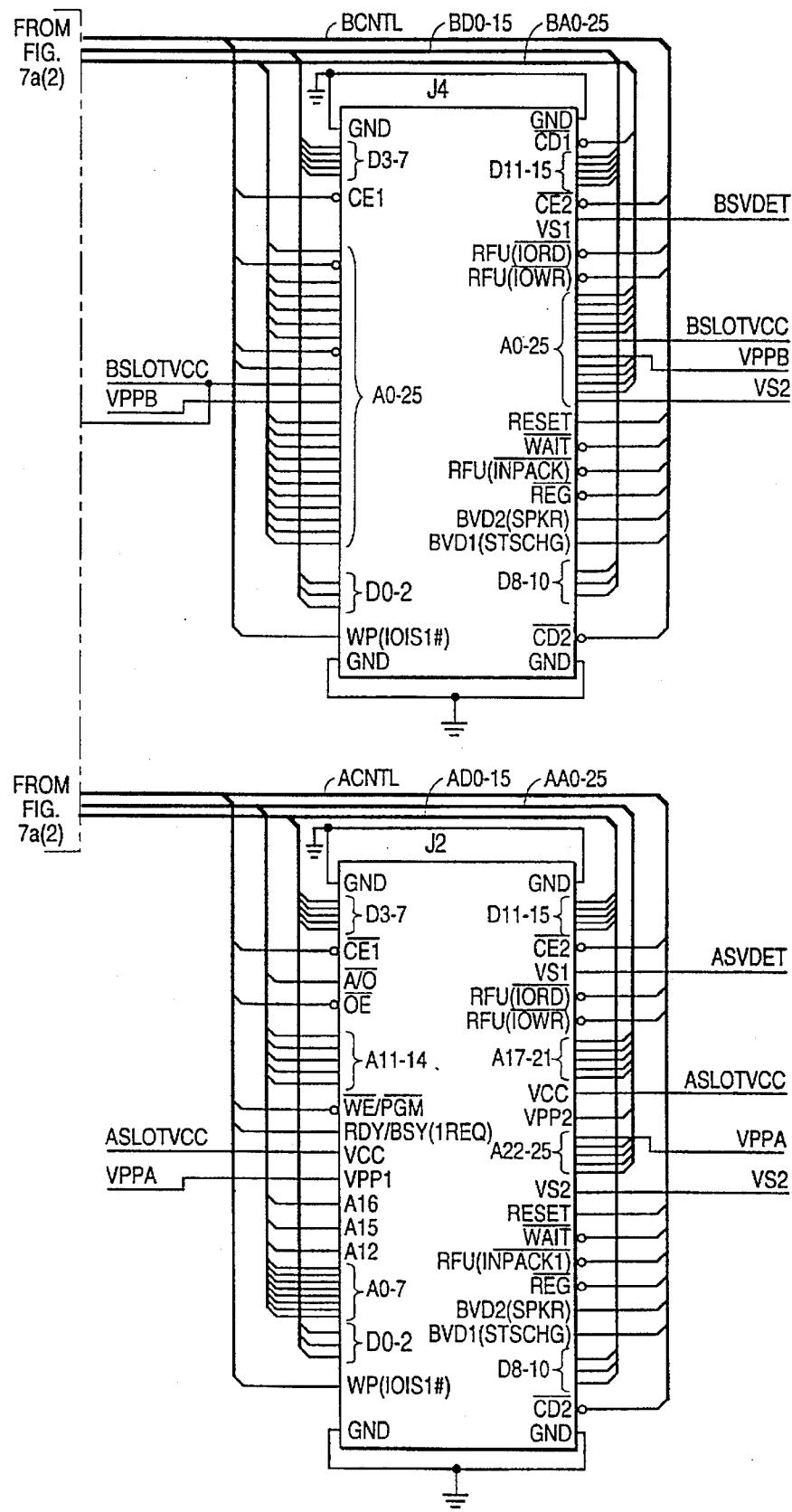
FIG. 7a(3)

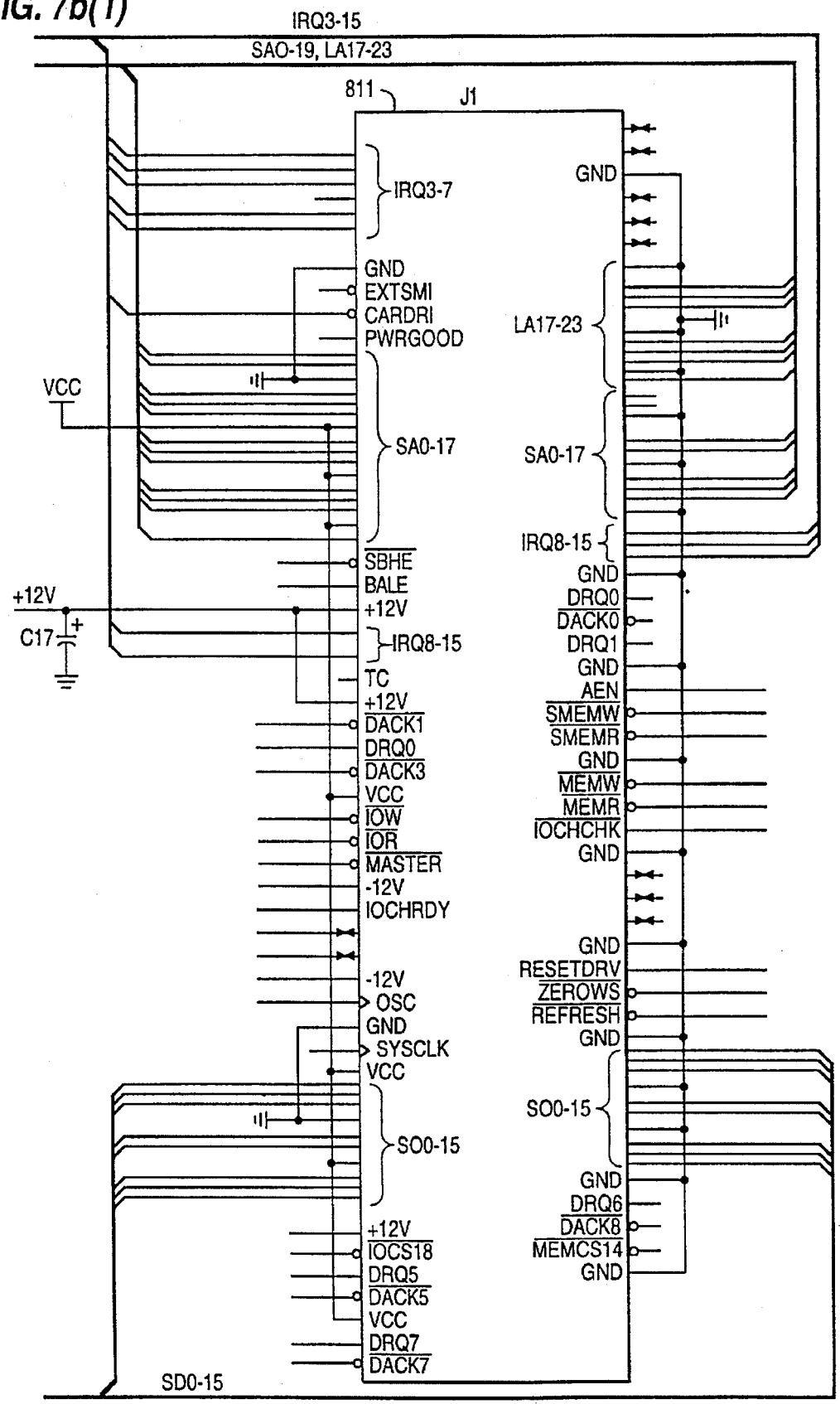
FIG. 7b(1)

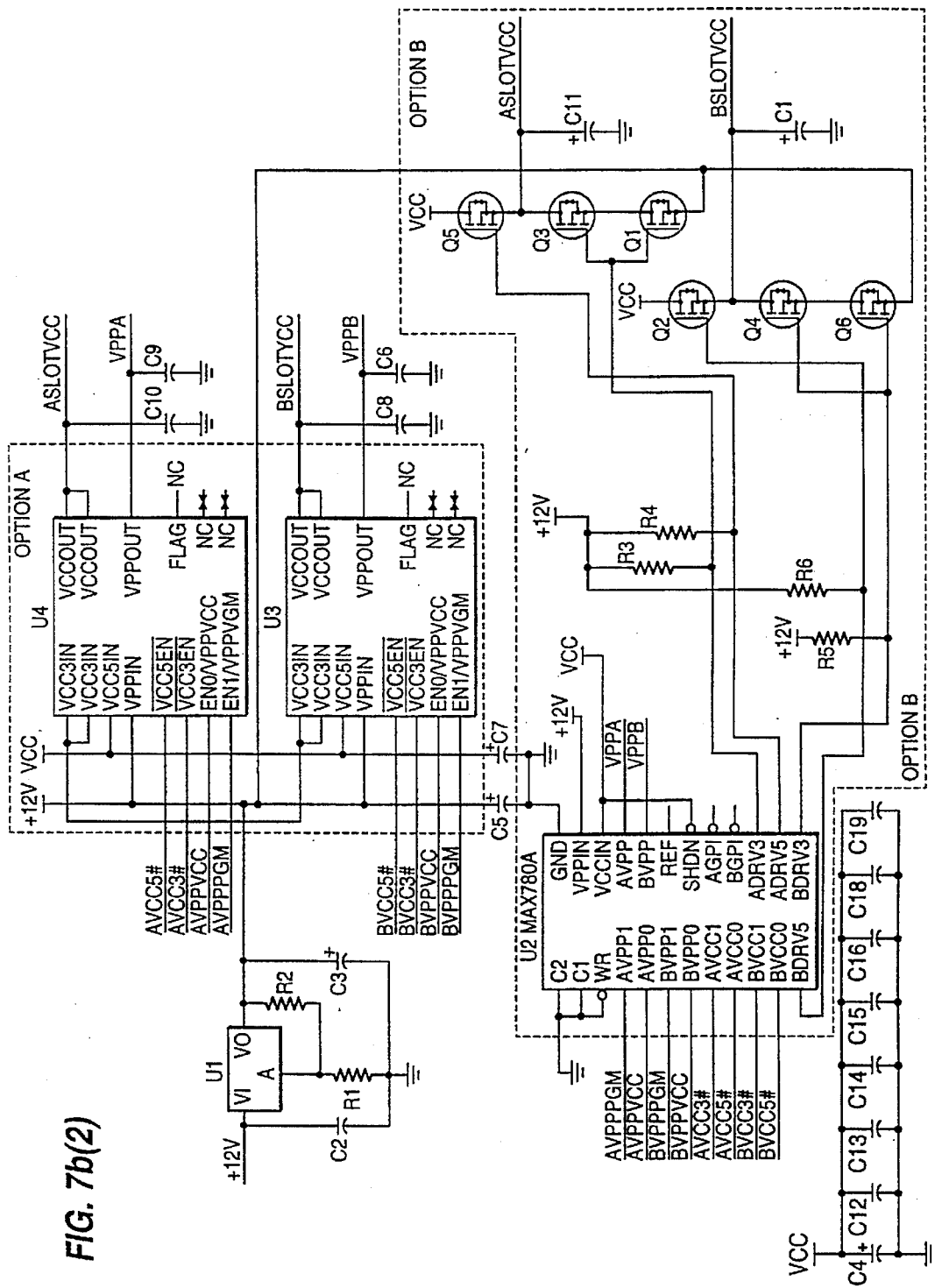
FIG. 7b(2)

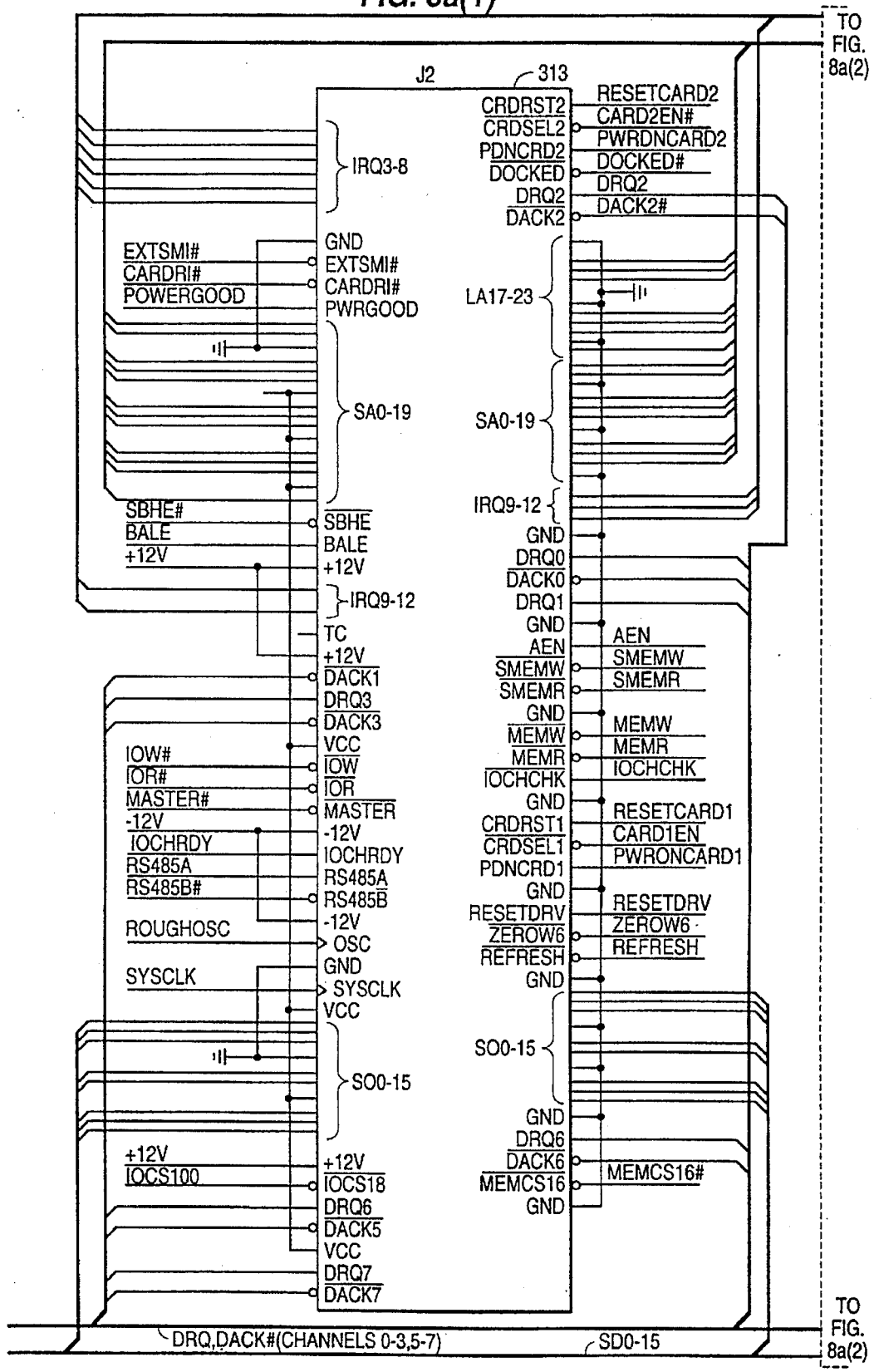
FIG. 8a(1)

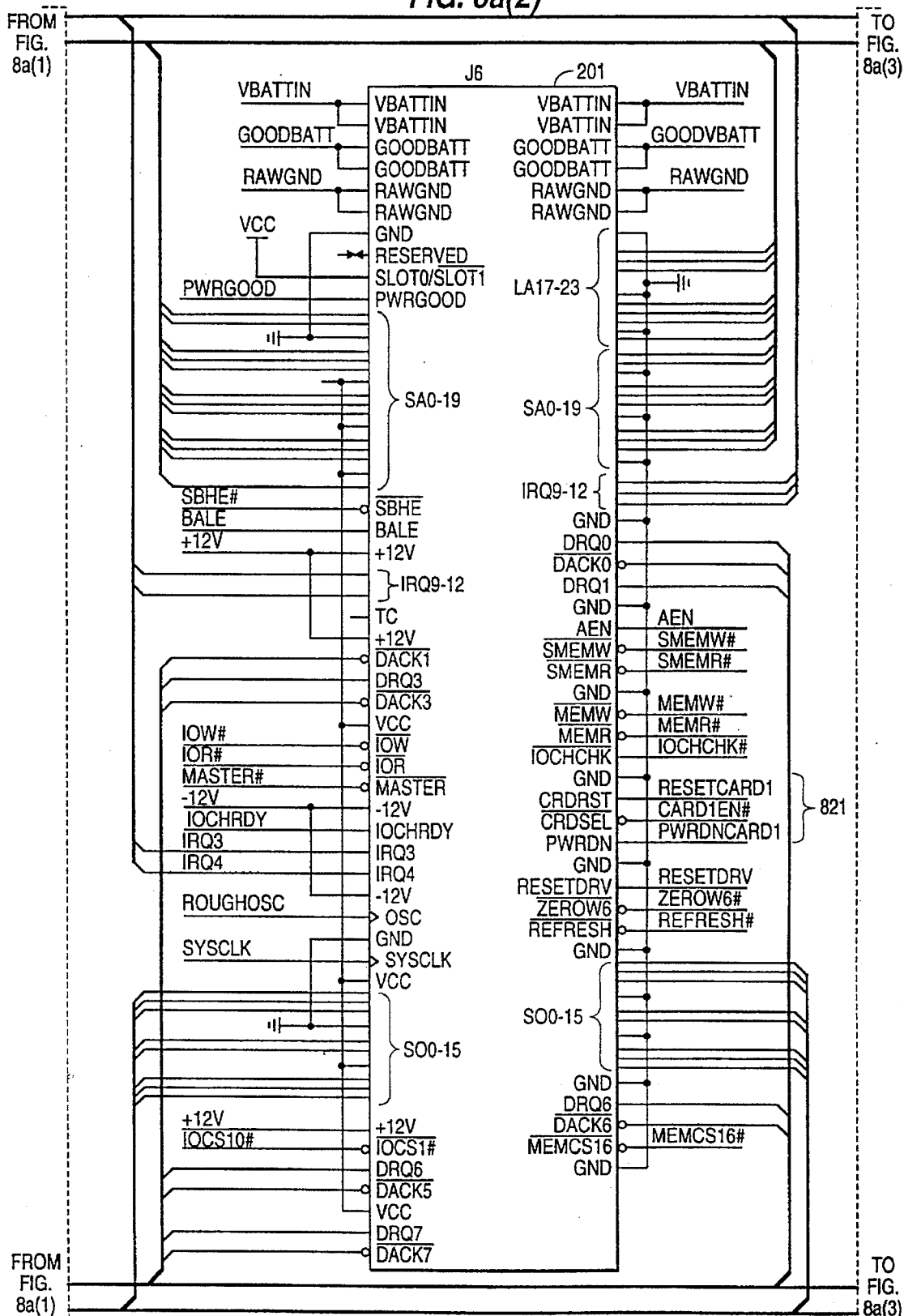
FIG. 8a(2)

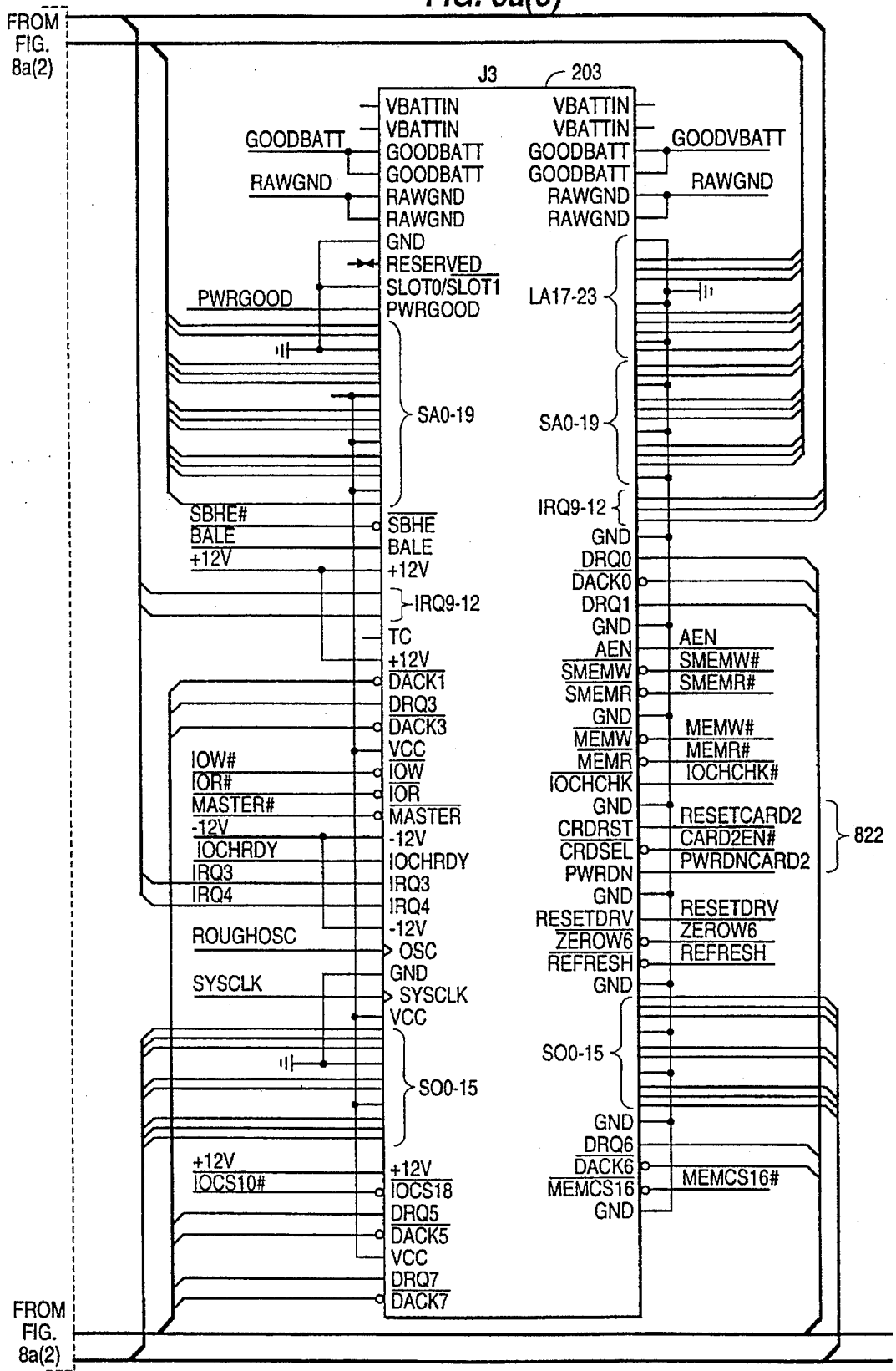
FIG. 8a(3)

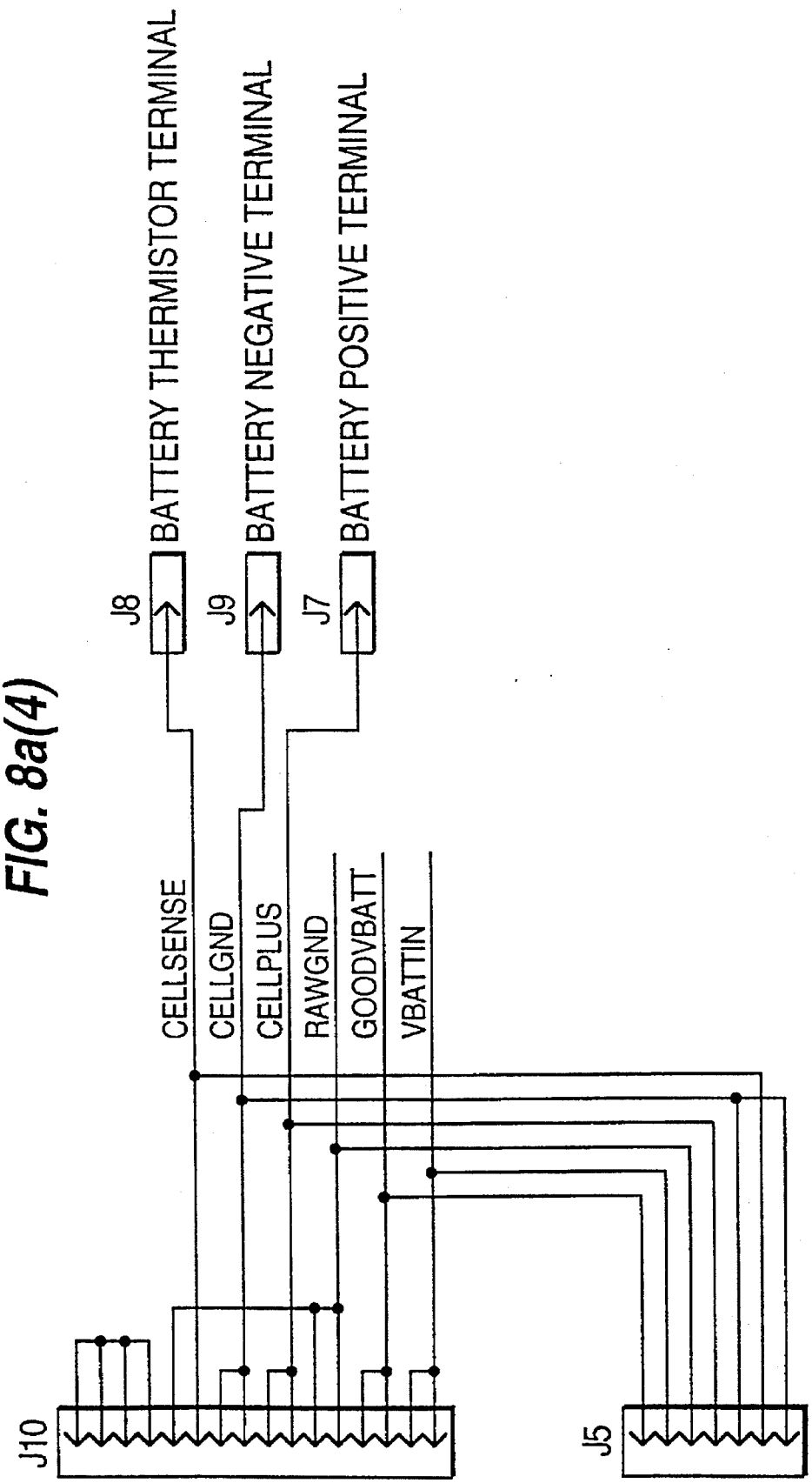
FIG. 8a(4)

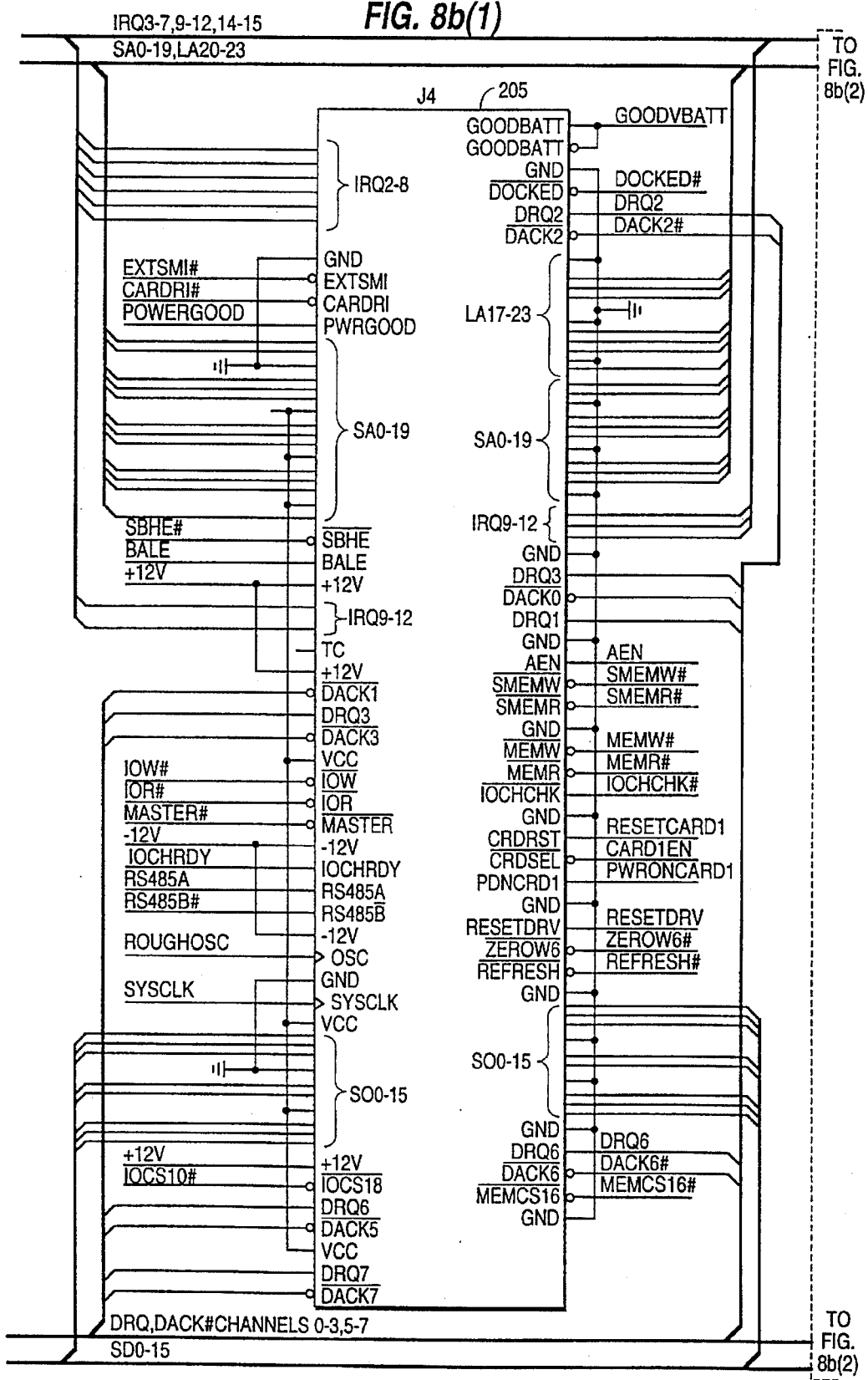

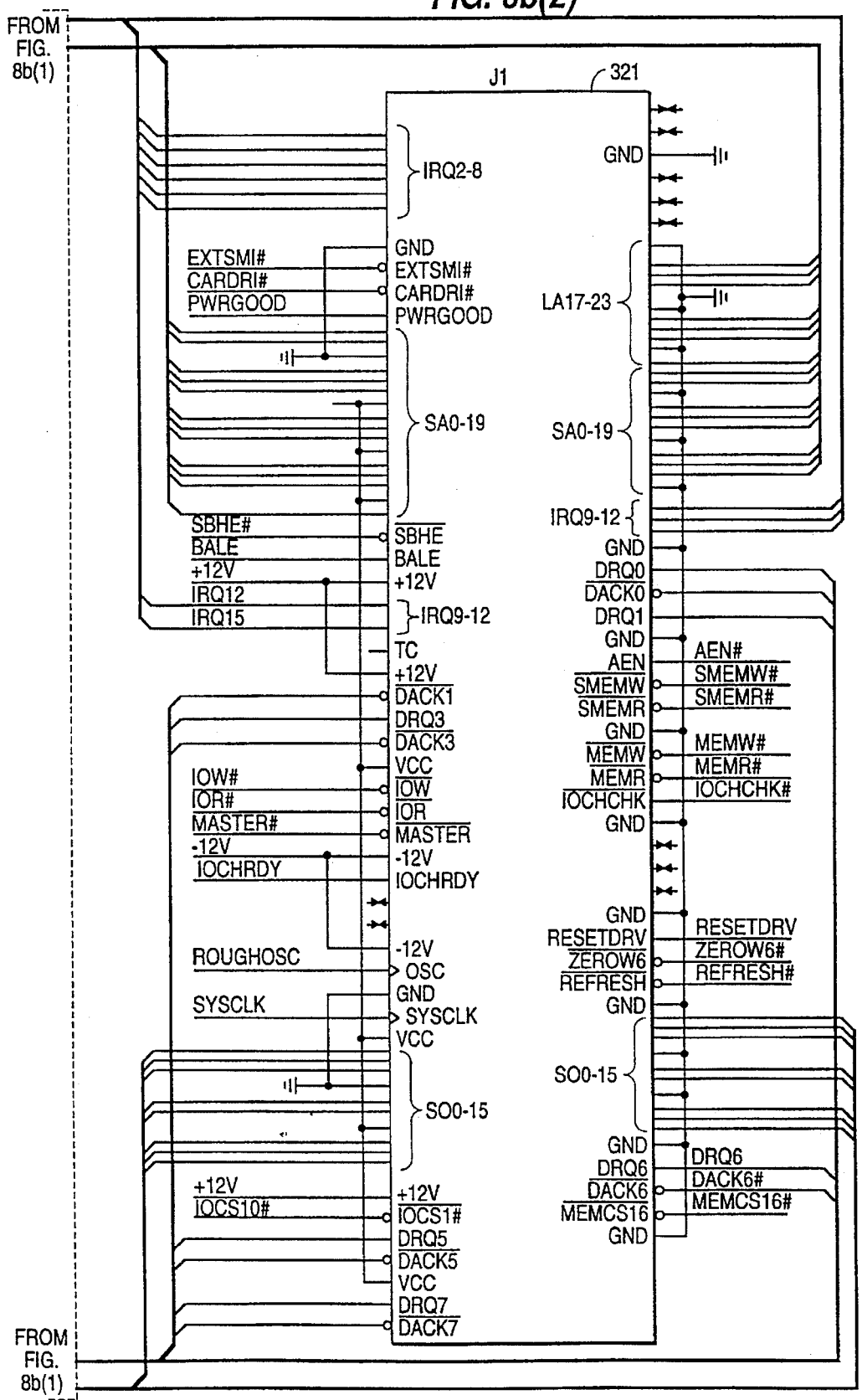
FIG. 8b(2)

PC COMPATIBLE MODULAR BASED DIAGNOSTIC SYSTEM

BACKGROUND OF THE INVENTION

1. Field of the Invention

The invention relates to a PC-based diagnostic system that is adaptable to test a variety of systems. In particular, the invention relates to a laptop computer diagnostic system with connector ports to I/O modules, expansion modules, and PCMCIA boards, to provide flexibility in testing different types of systems.

2. Description of the Related Art

Conventional diagnostic systems are typically dedicated to testing a particular element, or system. That is, a typical computer-based diagnostic system has one or more ports dedicated to testing a particular system.

For example, U.S. Pat. No. 5,408,412, invented by George Hogg et al., discloses a diagnostic system for troubleshooting an aircraft engine using information obtained during flight. This system is totally dedicated to one use, and cannot be reconfigured to test other types of systems.

U.S. Pat. No. 5,361,628, invented by Kenneth Marko et al., discloses a system for processing test measurements collected from an engine vehicle. Again, the information received from the unit-under-test is of one type, and the system cannot be readily reconfigured to test other types of systems.

U.S. Pat. No. 4,853,850, invented by James Krass et al., discloses an adapter that is provided between a vehicle and a diagnostic computer that is testing the vehicle. A dual-port memory is utilized that is selectable within the memory space of the test computer, and does not conflict with the diagnostic program that is running on the test computer. While the software may be upgradable, this system also is not readily compatible to test other devices.

While all of the devices described above provide diagnostic capability, they do not provide the flexibility that is most desirable for testing a variety of different system, in a quick and simple manner.

SUMMARY OF THE INVENTION

According to the invention, there is a PC-based diagnostic system. The PC-based diagnostic system includes a motherboard housed on a first printed circuit board. The diagnostic system also includes a backplane housed on a second printed circuit board and coupled to said motherboard through a first ISA bus, control lines and power lines, with the second printed circuit board including a first and a second I/O module connection port. The diagnostic system further includes a PCMCIA connection circuit housed on a third printed circuit board and connected to the backplane through a second ISA bus. The diagnostic system also includes a keyboard adapter circuit housed on a fourth printed circuit board and connected to the motherboard through a data and control bus. By this configuration, the backplane board provides data and instruction transfer between a processor housed on the motherboard and one of an I/O module connected to the backplane board and a PCMCIA module connected to the PCMCIA connection circuit.

The motherboard in the system according to the invention further includes a local control bus, address bus, and data bus, with a system controller connected to the processor by the local control bus, address bus, and data bus. The system controller provides a data and control signal interface between the processor and an externally-mounted keyboard. The system controller also provides an ISA bus interface between the motherboard and the backplane. The motherboard also includes a power supply connected to an external power source for providing power to the system. The motherboard still further includes a plurality of BIOS ROMs for storing input/output programs. The motherboard even still further includes an address decoder for retrieving the input/output programs from the BIOS ROMS on command from the system controller. Lastly, the motherboard includes a super I/O chip for providing a parallel port interface, an RS-232 port interface, a floppy drive interface, a hard disk drive interface, a keyboard interface, a mouse interface, and an RS-485 interface.

According to the invention, the backplane further includes a first I/O module connector for providing a connection to a first I/O module. The backplane also includes a second I/O module connector for providing a connection to a second I/O module. The backplane further includes an expansion connector for providing a connection to a docking station. Lastly, the backplane includes a PCMCIA board connector for providing a connection to a PCMCIA board. By this configuration, the first I/O module connector outputs a power line to the power supply of the motherboard to provide an alternative source of power to the system from the first I/O module.

BRIEF DESCRIPTION OF THE DRAWINGS

For a description of an apparatus according to the invention, reference is made to the following description and accompanying drawing, in which:

FIG. 2b is a diagram of the system layout at the motherboard level;

FIG. 2d is a diagram of the system layout at the PCMCIA board level;

FIG. 4b is a schematic diagram of the system controller that is housed in the motherboard according to the invention;

FIG. 4l is a schematic diagram of the keyboard port, the mouse port and the RS-485 serial port all connected to a Female DB-9 port, with all of these components housed in the motherboard according to the invention;

FIG. 4p is a schematic diagram of the display controller that is housed in the motherboard according to the invention;

FIG. 4s is a schematic diagram of the main power supply section that is housed in the motherboard according to the invention;

FIG. 6a is a schematic diagram of the CPU used in a flexible vehicle interface (FVI) that connects to the system according to the invention;

FIG. 6b is a schematic diagram of a dual port RAM housed in the FVI that interfaces with the system according to the invention;

FIG. 6c is a schematic diagram of the industry standard architecture (ISA) bus interface for the FVI in order to connect to the system according to the invention;

FIG. 6e is a schematic diagram of the second I/O section of the FVI;

FIG. 6g illustrates a sequence of a read operation for reading one byte from an address of the ID PROM of the FVI connected to the system according to the invention;

FIG. 7a is a schematic diagram of part of the circuitry housed in the PCMCIA connector interface in the system according to the invention;

FIG. 7b is a schematic diagram of part of the circuitry housed in the PCMCIA connector interface in the system according to the invention;

FIG. 8a is a schematic diagram of part of the circuitry housed in the backplane board in the system according to the invention; and FIG. 8b is a schematic diagram of part of the circuitry housed in the backplane board in the system according to the invention.

DETAILED DESCRIPTION OF THE PREFERRED EMBODIMENTS

Figure 1:
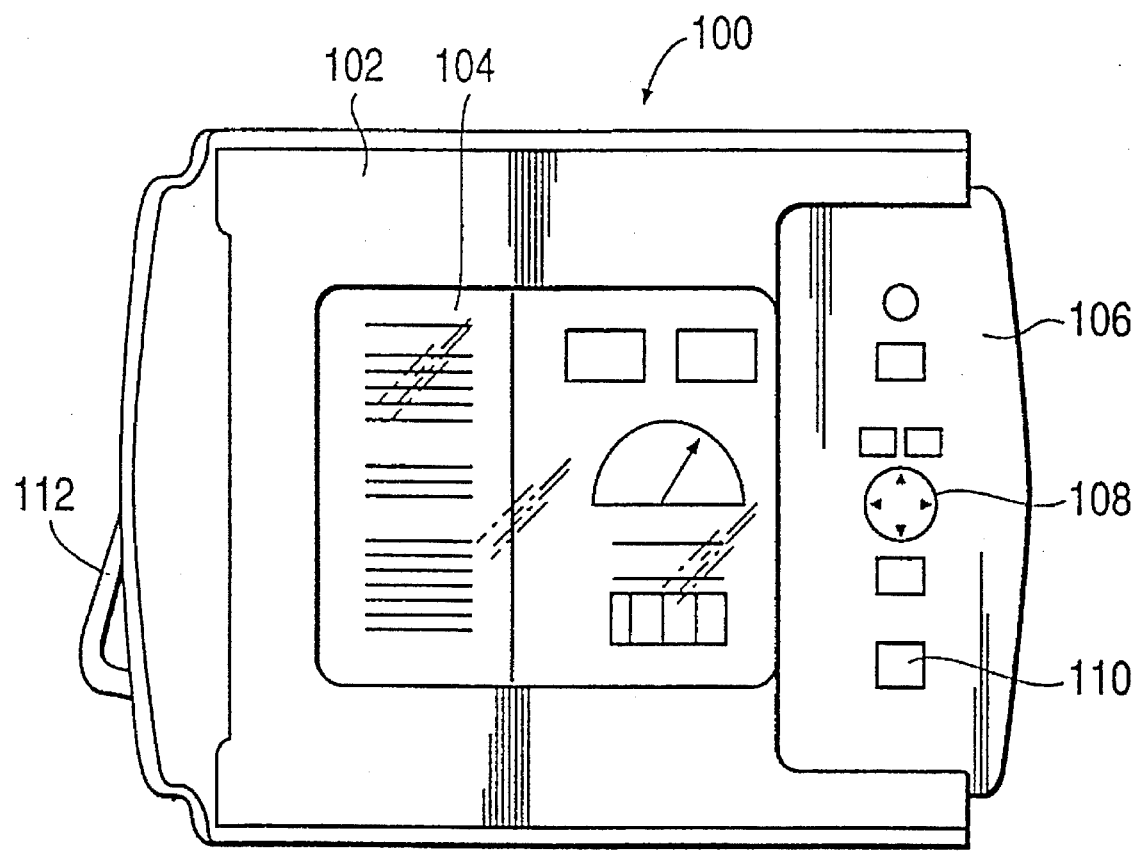
FIG. 1 is a diagram of the housing of the NGT diagnostic system according to the invention.

FIG. 1 illustrates a diagnostic test system 100 constructed in accordance with an embodiment of the instant invention. The system 100 is a specialized PC compatible portable computer with added features adapted to diagnostic test environments, such as vehicular diagnostics and maintenance. The system 100 overcomes the above drawbacks of conventional diagnostic systems. The system 100 includes a rugged housing 102 and a display 104 integral in the housing. The display 104 is always visible and does not employ hinges as used in conventional laptop computers to improve durability and ease of use. A sealed rubber keypad 106 may include an integral pointing device 108 and function keys 110. The keypad 106 is located on a side of the system 100, making it easier to hold and operate. The system 100 also includes a hinged support member 112 for supporting the system 100 when placed on a table or stand. The system 100 is constructed of durable material to survive the bumps, spills, and greasy hands commonly found in many test environments.

On the rear face of the system 100 (not shown in FIG. 1), standard PC compatible ports are arranged. These ports include serial and parallel ports, PCMCIA (Personal Computer Memory Card Industry Association) slots, and a VGA CRT connector. Also, a special port connector, which includes signal lines for an external mouse and/or keyboard, as well as an RS-485 link is also provided. These ports are more fully described below. The integral keypad 106 emulates standard keyboard and mouse protocols to allow software to be developed on a standard PC using the powerful software development tools currently available.

On the bottom of the device 100, two I/O slots (not shown in FIG. 1) are provided. The I/O slots are used to attach sophisticated I/O modules to the system 100 and interface the systems being diagnosed or tested to the PC compatible components of the system 100. As more fully described below, the slot connections include the same signals as the industry standard architecture (ISA) bus, with several additional signals added to support a large, high-speed, dual port interface and individual module level reset and power management control.

Figure 2A:
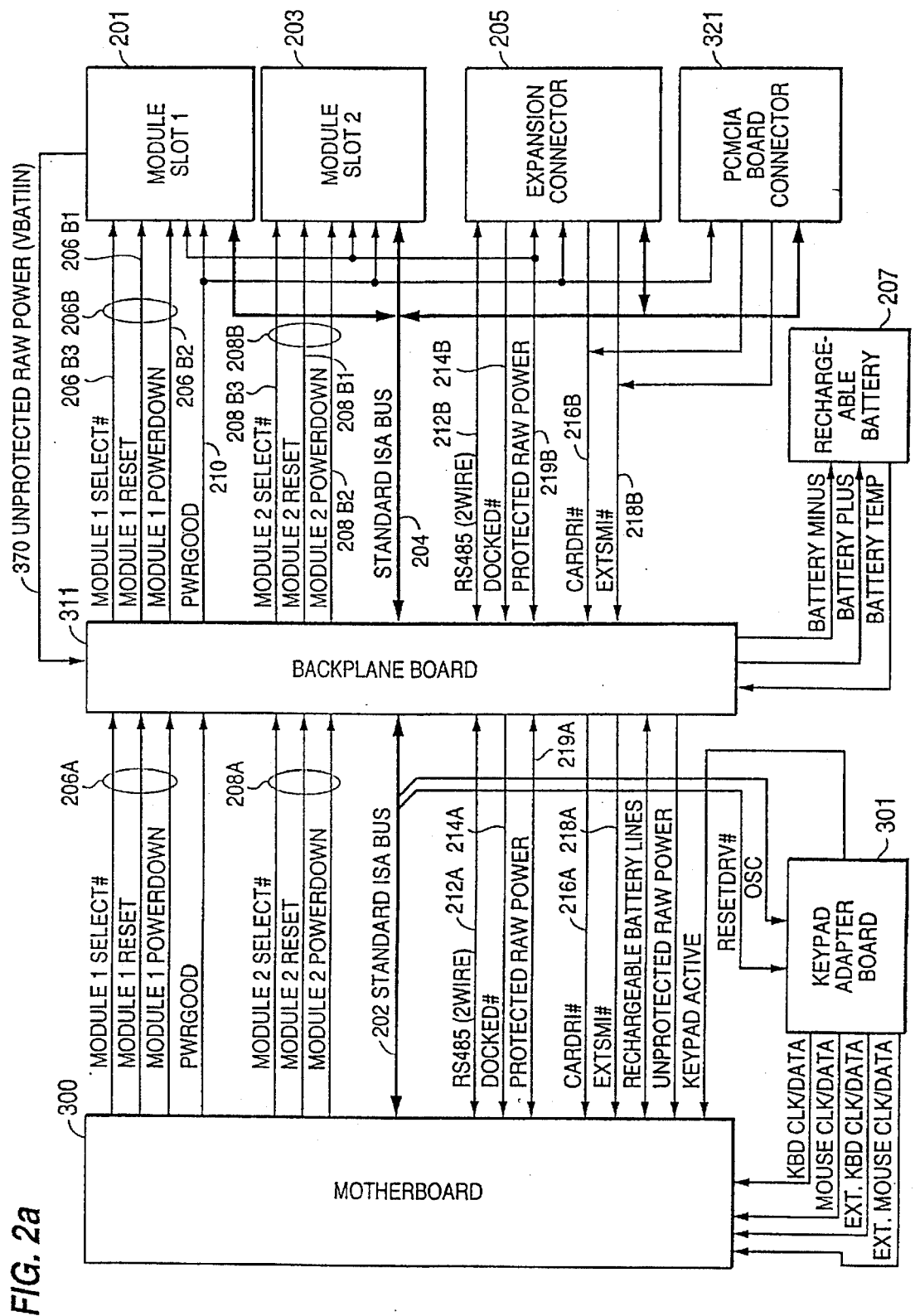
FIG. 2a is a high level diagram of the connections between the main components of the system according to the invention.

FIG. 2a illustrates the internal layout of the system 100 depicted in FIG. 1. The system includes four primary circuit boards, namely, a motherboard 300, a keypad adapter 301, a backplane 311 and a PCMCIA adapter board 323 (see FIG. 3) coupled to the PCMCIA board connector 321 of the backplane 311.

Figure 3:
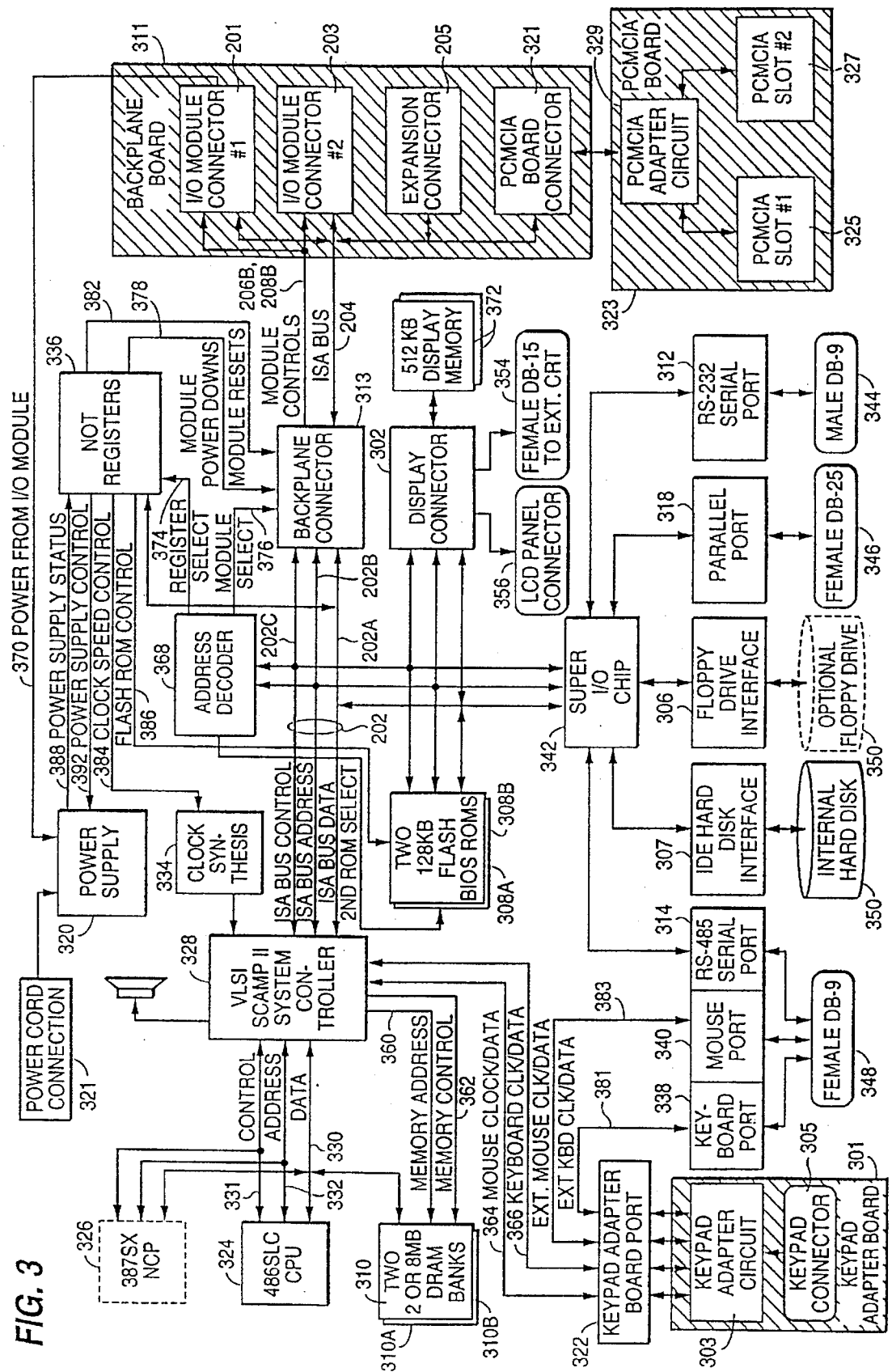
FIG. 3 is a more detailed diagram of the internal components of the motherboard, the backplane board, the keypad adapter board, and the PCMCIA board, along with the bus connections between these devices.

FIG. 3 gives a more detailed description of the internal components of each of the boards shown in FIG. 2a. FIG. 3 shows standard local bus connections of a SCAMP II controller 328 to a CPU 324, including a local address bus 332, data bus 330, and control bus 331. These are separate and distinct buses than the industry standard architecture (ISA) bus data 202A, the ISA bus address 202B, and the ISA bus control 202C, in order to keep the trace lengths and capacitance down for higher speeds, as well as providing a buffer for other signal routings. The optional floating point numeric coprocessor 326 (shown as a dashed box to indicate that it is an optional component) shares the local buses 330, 331, and 332 with the CPU 324 in a standard arrangement. System DRAM (dynamic random access memory) memory banks 310A, 310B also reside on the local CPU data bus 330, but have separate memory address lines 360 and memory control lines 362 to facilitate advanced features controlled by the SCAMP II controller 328. These advanced features include: memory paging, DMA, automatic memory refresh, and various performance optimizations.

The SCAMP II controller 328 is coupled to a keyboard adapter port 322 with standard keyboard BIOS code contained in an on-board ROM. By this configuration, the SCAMP II controller 328 communicates to industry standard keyboard and mouse controllers by a standardized protocol. In order to provide for an integrated keypad and/or pointing device on the system 100, as well as an external standard keyboard and mouse, mouse clock/data signals 364 and keyboard clock/data signals 366 are routed to and from the keyboard controller (not shown) of the SCAMP II controller 328 through the keyboard adapter port 322. The keyboard adapter board 301 has a keyboard adapter circuit 303 which is coupled to the keyboard adapter board port 322, and is responsible for scanning the local keypad and pointing device (not shown), and converting the user inputs into signals sent to the SCAMP II controller 328 via lines 364 and 366 that emulate a standard keyboard or mouse signal protocol. The keyboard adapter board 301 is also responsible for routing signals between the external keyboard or mouse (not shown) and the SCAMP II controller 328, and merging lines 381, 383 with its own signals as appropriate, and sent back to the SCAMP II controller 328 via lines 364, 366.

The SCAMP II controller 328 is also connected to the ISA bus 202 common to all PC compatible computers. Like the control bus 331, the address bus 332 and the data bus 330 that connects the CPU 324 to the SCAMP II controller 328, the ISA bus 202 includes an ISA control bus 202C, an ISA address bus 202B, and an ISA data bus 202A. The ISA control bus 202C includes several different control lines, such as read and write enables, interrupt lines, etc.

The expansion slots of a PC compatible desktop computer provide a connection to the complete ISA bus, as well as power and ground. Laptops may also provide connections to the ISA bus 202, but they generally do not since there usually is no provision for expansion boards other than memory cards (which use a different bus) or PCMCIA boards (which use the PCMCIA bus standard).

However, the system 100 is unique amongst laptop style computers, since it provides a backplane board 311 with the complete ISA bus 204 and extensions and enhancements to that bus. The right side of FIG. 3 shows a backplane board 311 with two slots 201, 203 for I/O modules, as well as a connection 321 for a PCMCIA adapter board 323, and an expansion port 205 for a docking station or other system expansions.

The bottom center of FIG. 3 shows the connections of the Super I/O chip 342. The Super I/O chip 342 integrates the functions of several highly integrated chips into a single chip that provides all the major system I/O functions of a standard PC, including two serial ports 312, 314, a parallel (printer) port 318, a floppy disk interface 306, and an IDE (integrated drive electronics) hard disk interface 307. The Super I/O chip 342 is primarily used in a conventional manner, except that the second serial port 314 is wired to support an RS-485 style serial port rather than the usual RS-232 port. The hard disk connection 307 is a 68-pin PCMCIA style connector, but the pinout conforms to the ATA removeable standards set by the PCMCIA committee, which maps the standard IDE or ATA signals to the pins of a PCMCIA card-style connector, rather than the usual 40-pin dual row header. This allows the system 100 to use the very small profile PCMCIA style hard disks that have a dual interface front end that automatically configures as a PCMCIA bus interface or an ATA removeable interface based on whether one of the pins is grounded or not. The PCMCIA style hard disks are built to withstand extremely high shock and vibration such as may be experienced in the environments the system 100 is exposed to, and are designed to use a minimum amount of power.

The port connections on the back of the system 100 use standard connectors and pinouts, except for the female DB-9 348 which combines the signals of the external mouse and keyboard connections with the RS-485 serial port 314.

The PCMCIA daughterboard 323 is shown in the shaded area on bottom right portion of FIG. 3. The system 100 contains a PCMCIA connector board 323 that provides two PCMCIA card slots 325, 327, one of which accepts up to Type II size cards, and the other of which accepts either Type I, II or III size cards. A PCMCIA adapter circuit 329 implements the PCMCIA standard bus interface on the one side, and the ISA bus interface on the other side. The adapter circuit 329 also controls the switching and generation of the various voltages required by various PCMCIA cards that may be inserted in the slots 325, 327 of the system 100. The PCMCIA circuits are partitioned on a separate circuit board 323 from the motherboard 300 in order to provide easy configuration of systems with different numbers of PCMCIA card slots, or none, as the application or customer requires. Since the ISA bus 204 is available at the PCMCIA daughterboard connector 321 on the backplane 311, other types of boards may replace the PCMCIA card 323 in the future if the need for other types of internal I/O devices appear.

The backplane board 311 is shown diagrammatically in the shaded area on the right side portion of FIG. 3. The backplane board 311 provides slot connections for two I/O module boards via the I/O Module Connectors 201 and 203. The backplane board 311 further provides a PCMCIA board connector 321 for a PCMCIA daughterboard 323. The backplane board 311 also provides an edge board connection 205 for an expansion module under a docking station, such as those available for many laptop computers which provide for a stationary network connection site along with a standard keyboard, floppy drives, and large devices, such as tape and CD-ROM drives that are difficult to integrate into a portable device.

The use and positioning of a backplane board 311 in the system 100 is not only advantageous for mechanical packaging reasons, but also to partition the system 100 to facilitate system design changes in the future, if needed. For example, it would be relatively easy to change the number of PCMCIA board connections and/or I/O module slots by simply replacing the existing backplane board 311 with one of a different design. Of course, those of ordinary skill in the art will recognize that if more I/O module slots were added, additional address decoding (performed by the address decoder 368) and slot control registers (performed by the NGT register block 336) would be required in order to supplement the support for two slots built into the motherboard 300.

The bus specifications used for the system 100 define the I/O module connector pinouts as being the same except for the three slot specific control lines (reset, powerdown, and slot select) 206B, 208B connecting the I/O module slots 201, 203 to the backplane board 311, and the fact that raw external power is only drawn from one slot, e.g., line 370 connecting the power supply to the first slot connector 201.

The power connection 370 from the first I/O module connector 201 to the power supply 320 in FIG. 3 serves as an alternate to drawing power from a power cord connection or from the internal rechargeable battery. The power supply 320 typically draws power from a conventional power source, such as a cigarette lighter in a vehicle. However, the power connection 370 provides an alternative way of obtaining power for the system 100.

Many diagnostic connection points for the cabling from the I/O modules will have raw power available, and it is more convenient to tap into the target system's power there than having to run a separate cord to another power tap point, such as a battery connection, power adapter, or cigarette lighter plug. The power supply circuit 320 preferably includes diode protection (not shown) to prevent damage in the case of an accidental reversal of the voltage polarity of the incoming supply. To prevent the possibility of shorts between two mismatched power taps in two different I/O module connections 201, 203, the backplane 311 only routes power from one the slots via line 370. After passing through the diode and other protection circuitry such as surge suppression and current limiting (not shown in FIG. 3) of the power supply 320, this raw supply current is passed back as protected raw power to all of the I/O module slots as well as the expansion connector 205, via lines 219A and 219B of FIG. 2a. This raw current is used for activating external target system devices, such as high-side driven solenoids, as opposed to the more limited internal regulated supplies (not shown) of the system 100.

Returning back to FIG. 3, the display controller 302 is a typical laptop display controller, and is attached in a standard fashion to support both an internal liquid crystal display (LCD) panel 356 and an external CRT monitor 354. The display controller 302 manages its own local display memory 372, including memory refresh, screen refresh, paging, and other operations. The 512 kilobyte size of the display memory 372 is typical for a laptop computer, and provides a wide range of resolutions and pixel color depth combinations. The display controller 302 preferably can support a wide range of LCD panel types as well.

Two Basic Input Output System (BIOS) ROMs 308A, 308B are both connected to the ISA bus 202. The BIOS ROMs 308A, 308B typically hold the system program code and data necessary to boot the system and provide the lower levels of software-to-hardware interface. In the system 100, and for most laptop computers, the system BIOS chip 308A, 308B also contains the display controller BIOS (VGA BIOS) as well. Desktop computers which have the display controller on a removeable card in an ISA bus slot rely on the card to have a separate VGA BIOS chip to match the particular card and controller. In the system 100 according to the invention, the VLSI SCAMP II system controller chip 328 provides the chip decoding to map the addresses of the standard VGA BIOS locations into the system BIOS chip.

The two 128 kB Flash BIOS ROMs 308A, 308B hold BIOS code and other information. Since the SCAMP II system controller chip 328 only provides a chip decode for one chip (i.e., chip 308A) of up to 128 kB, the address decoder 368 provides this additional non-standard decode for the other chip. The second chip (i.e, 308B) is accessible near the top of the system address space, rather than in the lower 1 MB like the first chip, in order to avoid cluttering up the already tight memory allocation of the lower 1 MB of a typical PC compatible system.

The address decoder 368 also provides a few additional signals that are unique to the system 100. The NGT extension I/O register select line 374 and the I/O module slot select lines 376 are part of a scheme that accounts for the higher potential I/O performance levels of the NGT system 100 which is useful in the diagnostic environment that can have very high data rates.

The NGT extension registers 336 are I/O ports that allow for the control (writes) and status monitoring (reads) of the NGT specific devices and features that are not supported by the standard decodes and registers of the SCAMP II system controller 328 and the Super I/O controller chip 342. The NGT registers 336 control the powerdown and reset lines of the individual I/O modules via lines 378 and 382, respectively, the CPU clock synthesizer speed control options via line 384, the Flash BIOS write enable and powerdown lines 386, and some power supply functions via line 392. A read register (not shown) internal to the NGT Register Block 336 monitors the many status lines of the different sections of the power supply 320 through the status line 388.

The module select lines 206B, 208B for the two I/O module slots 201 and 203 provide the necessary address decoding to implement either a dual port RAM or memory mapped I/O area in the I/O module circuits (not shown) that are connected to the I/O module connectors 201, 203. This scheme enables a much higher performance data transfer between the module (not shown) and the processor 324 than the traditional I/O bus cycle transfers or DMA transfers that the I/O bus is limited to.

I/O port address space is severely limited on the standard PC architecture, so a traditional I/O card commonly uses only one or very few I/O port addresses, and resorts to indexed registers to expand the effective number of registers. Indexed registers are typically implemented with one register I/O address port, either one or two bytes wide, accepting and holding an index pointer, while a second register I/O address port provides the window to read or write into the register that the first register points to. This traditional scheme is even slower than the already slow ISA bus I/O cycles, compared with memory writes, since the software must make two or more I/O writes.

DMA transfers are a good but not great alternative for high speed I/O for several reasons. DMA usually requires that the processor set up the transfer of a block of data when the I/O module is ready to transfer, which necessitates an interrupt scheme, and then during the transfer, some of the bandwidth of the ISA bus is used to accomplish the transfer. This means that other processes may be slowed down. At any given time, the CPU may only need a few pieces of the large block that has been transferred, yet due to the serial nature of the transfers (PC architecture restricts the DMA to I/O port to memory transfers only, rather than memory to memory transfers), the whole block is usually sent. This would work well for a device such as a disk driver or tape drive, but for the types of devices that are to be used with the NGT system 100 in the diagnostic environment, such as a high speed digital oscilloscope module, random access of only that data that is needed to be read would be much more efficient in terms of bus bandwidth and programming.

Direct random access of a very large data area in the NGT I/O modules (that are connected to the I/O module connectors 201, 203) is accomplished by the use of a dual port RAM or memory mapped I/O design in the modules, supported by the address decode of a separate data area for each slot, generated by the address decoder 368 in the motherboard 300. The motherboard 300 configuration, controlled by the BIOS (code stored in the ROMs 308A, 308B) and the VLSI SCAMP II controller chip 328, opens a window in the system memory area for memory of the NGT I/O modules connected to the I/O module connectors 201, 203. These windows are preferably set at 64 kB each, which is much larger than the 1 kB I/O address space of a standard PC. The CPU 324 can read or write to these areas as fast as any other memory area (subject to any wait state generation that may be done by the module's circuits), and has completely random access rather than a sequential or serial access mode.

One of the uses of a large dual port I/O scheme in an NGT I/O module is to use part of the memory as a dual port data transfer area (which is very fast), complete with semaphore flags and asynchronous circular buffers implemented in software, and use the rest of the memory as code space for CPU of the local module. This allows application and driver code specific to the target system being diagnosed to be downloaded to the module at runtime. The I/O module typically has no program ROM. It is placed in reset via the corresponding reset line (206B1, 208B1 of FIG. 2a) upon boot up of the NGT system 100, and when an application starts that needs the I/O module, it first downloads or copies the appropriate code for the module's CPU and the target system and data protocols to the dual port memory of the module, and then releases the appropriate reset line to allow the CPU internal to the module to start executing the specific code. The module may be put in reset at any time to allow other pieces of code to be downloaded, if desired.

The signals shown between the elements in FIG. 2a will now be explained in detail. These signals include standard signals, and signals that are unique to the NGT system 100. The ISA bus signals that are common to PC compatible computers are all grouped together and shown by the thick bus lines 202, 204, through the center of FIG. 2a and out of the connectors of the backplane board 311.

Three module-specific control lines, SELECT#, RESET, and POWERDOWN 206B, 208B, are respectively routed to each of the module slots 201, 203. These lines 206B, 208B are used to control the state of the module and enable any on board memory or dual port memory being used for data transfers and downloaded program storage as described earlier. Separate module control lines are sent to each of the module slots 201, 203 so that each may be controlled separately from the other (or others), including being put in reset or powerdown states independently of the state of other modules.

Both I/O module slots 201, 203, as well as the expansion connector 205 and the PCMCIA board slot connector 321 have the PWRGOOD signal 210 included to supplement the standard RESETDRV ISA bus signal (one line on the ISA bus 202, 204) that is part of the ISA bus specification. The PWRGOOD signal 210 is an input to the VLSI SCAMP II chip 328 (see FIG. 3) of the motherboard 300, which in turn generates the RESETDRV ISA bus signal on the ISA bus 202, synchronized to a BUSOSC clock signal (not shown in FIGS. 2 and 3, but see FIG. 4b) received from the clock synthesis circuit 334, and which may be delayed relative to the PWRGOOD line 210. The PWRGOOD line 210 is false (low) immediately upon system startup, and may serve as an early warning that RESETDRV is about to activate.

An Unprotected Raw Power line 370 serves as an alternative to drawing power from the other available sources described earlier. After passing through the protection circuits (not shown) of the power supply 320 (see FIG. 3), this raw supply current is passed back to all of the I/O module slots 201, 203 as well as the expansion connector 205. This "protected" raw power is used for driving target system devices that require a lot of current, rather than using the internal supplies of the NGT system 100 which are regulated but which have fairly low current limitations.

Also shown in FIG. 2a is a two-wire RS-485 interface 212A, 212B. This is an extension of the RS-485 interface provided on two of the pins of one of the connectors (RS-485 serial port 314 of FIG. 3) of the back face of the NGT system 100 with the other I/O ports. Since the RS-485 interface is a multi-drop or party-line type interface, multiple listen only or talk-listen devices may be put on the same lines. By running these signals 212A, 212B through the backplane board 311 to the expansion connector 205, docking stations or expansion boxes may be include an RS-485 connection on their packaging and/or include internal devices that communicate with the NGT system 100 through this RS-485 serial bus 212A, 212B.

The DOCKED# signal 214A, 214B from the expansion connector 205 to the motherboard 300 (via the backplane 311) informs the motherboard 300 circuitry and CPU (324 of FIG. 2a) when the system 100 is attached to a docking station. The docking station is expected to ground this line which is normally pulled high. The BIOS or application code can then modify internal NGT hardware configurations and software operation and options to coexist with and take advantage of any additional hardware that is available in the docking station. If the BIOS configuration of the docking station is required, a BIOS extension ROM may be placed on the ISA bus 202, 204 following the PC standards for ISA bus expansion card ROMs. These extensions will be detected by the "ROM Scan" routines of the system BIOS (stored in the Flash BIOS ROMs 308A, 308B of FIG. 3) at startup and will be executed.

The PCMCIA connector 321 and expansion connector 205 add two additional lines for the CARDRI# signal 216A, 216B and the EXTSMI# signal 218A, 218B. The CARDRI# signal 216A, 216B is generally generated by a PCMCIA modem card (not shown, but it is connected to the PCMCIA connector board 321) as an active low ring indication that may be monitored by the COMB UART circuitry (part of the Super I/O chip 342 in FIG. 3) of the motherboard 300 to allow communication software to follow the progress of a call and connection. The CARDRI# signal 216A, 216B is also routed to the expansion connector 205 so that an expansion module or docking station may use it if it contains an internal modem. The EXTSMI# signal 218A, 218B is used to generate a system management interrupt (SMI) to the CPU (324 in FIG. 3) in the motherboard 300. System management functions are typically used on laptop computers for power management features. In the preferred embodiment, the NGT system 100 does not implement any power management or other features through the use of the system management modes of the CPU, but the PCMCIA card (not shown, but it is connected to the PCMCIA connector 321) is capable of generating it. As such, the motherboard 300 can be configured in the future to implement this feature, and so the EXTSMI# signal 218A, 218B has been routed through the backplane 311 to the motherboard 300 for such a future improvement.

The system 100 is especially advantageous for portable diagnostic testing. The system 100 includes a portable power supply (320 of FIG. 3), with a power cord connection 321 (see FIG. 3). The system 100 is capable of receiving power directly from a system being tested such as an automotive vehicle 370. Such systems can vary significantly in voltage, and power may at times be lost or drop out (such as when cranking a vehicle's engine). As described below, to provide for the temporary dropouts, and to allow the user more freedom in moving around the shop, the system 100 includes a rechargeable battery 207 which has the capacity to run the system 100 for extended periods of time. Also as described below, the internal power supply includes a sophisticated quick charge circuit which replenishes the rechargeable battery 207 when external power is again available to the system 100.

Figure 2C:
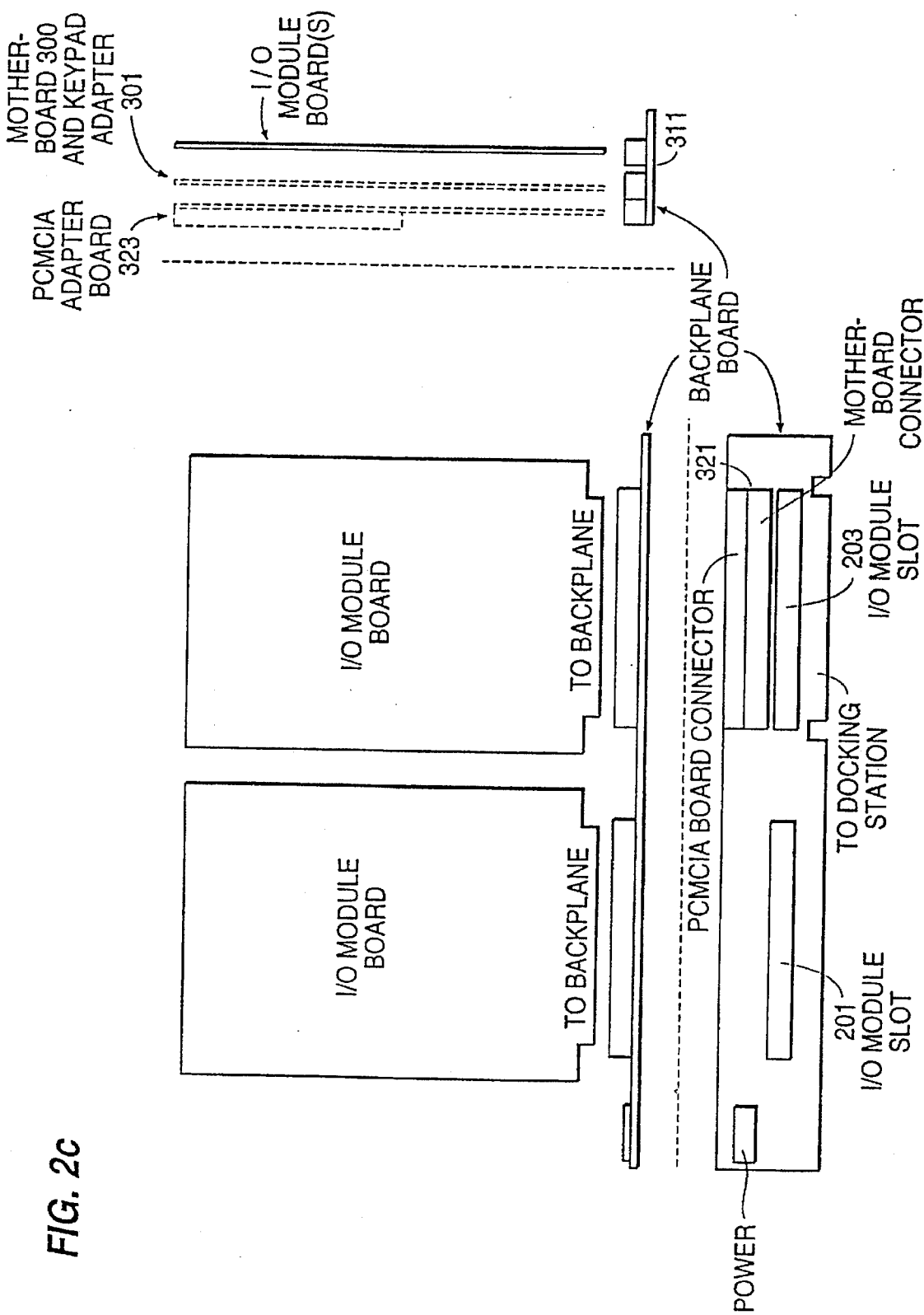
FIG. 2c is a diagram of the system layout at the I/O module level.

The physical relationship between the motherboard 300, the PCMCIA board 323, the backplane 311 and the I/O module slots 201, 203 is shown in FIGS. 2b, 2c and 2d. Each level of boards that plug into the vertical backplane board is shown on a separate drawing. That is, the motherboard level is shown in FIG. 2b, the I/O module level is shown in FIG. 2c, and the PCMCIA board level is shown in FIG. 2d. As shown in FIGS. 2b, 2c and 2d, the motherboard 300 and keypad adapter 301 occupy the same center plane or level, and are joined side to side by an abutting connector pair 255. The PCMCIA adapter daughterboard 323 lies above and parallel to the motherboard 300, and the layout and size of the PCMCIA adapter daughterboard 323 is shown in FIG. 2d. The two I/O module slots 201, 203 in the backplane 311 are spaced further away from the motherboard 300 than the PCMCIA board connector 321 in order to provide additional room for the plastic housings of the NGT main unit 100 and the removable I/O modules that surround the boards. A single I/O module level for two I/O module boards that are respectively connected to each of the I/O module slots 201, 203 is shown in FIG. 2c. However, the system 100 can be configured such that there is plenty of room for additional daughterboards in the I/O module level, if needed to perform a particular diagnostic test.

As illustrated in FIG. 2a, the backplane 311 serves to interface between the motherboard 300 and the keypad adapter 310 on one side and the PCMCIA adapter 323, the module slots 201, 203 and the expansion connection 205 on the other. A rechargeable battery 207 is also connected to the backplane 311.

The motherboard 300 is coupled to the backplane 311 for exchange of standard ISA bus protocols via bus 202. The motherboard 300 is connected to the backplane board 311 via the backplane connector 313 on the motherboard 300 (see FIG. 3). The backplane 311 is also connected to the module slots 201, 203, the expansion connector 205 and the PCMCIA board connector 321 for transmission of standard ISA bus protocols on bus 204. In addition to these standard ISA bus protocols which are related to the PC compatibility of the system 100, additional communication specific to the modular diagnostic test environment must be carried out. The motherboard 300 interacts with the modules via the back plane 311 using the module select, reset and power-down signals 206A, 206B, 208A, 208B for a particular module. The illustrated non standard signals will be more fully appreciated from the detailed description below.

The motherboard 300 contains the bulk of the circuitry of the test system 100. As illustrated in FIG. 3, the motherboard 300 includes standard PC motherboard components, integral VGA LCD/CRT display controller 302, integral board mounted hard disk support 306, Flash BIOS 308A, 308B, a system memory 310, serial 312, 314 and parallel 316 ports, an optional floppy controller 318, and a power supply 320.

The keypad adapter board 301 includes a keypad connector 305. The keypad adapter board 301 is connected to the keypad adapter board port 322 of the motherboard 300 via the keypad adapter circuit 303. In this manner the keypad adapter board 301 can be easily swapped out to support different keypad designs or other user input devices, such as touch panels.

The backplane 311 provides the interconnection between the motherboard 300, I/O module slots 201, 203, a PCMCIA daughterboard 323, and the power supply 320. It is noted that the system 100 may also be connected to a docking station to allow the device 100 to use a standard CRT display and keyboard. The backplane 311 includes an expansion connector 205 which may be used for interconnections to a docking station.

The PCMCIA adapter board 323 provides for one or two PCMCIA slots in the system 100. PCMCIA connector slots 325, 327 are mounted to this board, as well as a PCMCIA adapter circuitry 321.

The operation of the motherboard 300 will now be more fully described in connection with FIG. 3 and FIGS 4a through 4x. The motherboard 300 is made of a four layer construction with an internal power and ground plane. The four layer layout reduces the fabrication costs of the board, and places nearly all of the signal lines on the outside layers for easy access during debugging, testing, and any patching that is necessary. The planes can be segmented to provide partial separation of the digital and power supply areas of the board. The majority of the components are surface mounted, and all components can be mounted on one side of the board to simplify manufacturing and reduce costs.

Figure 4A:
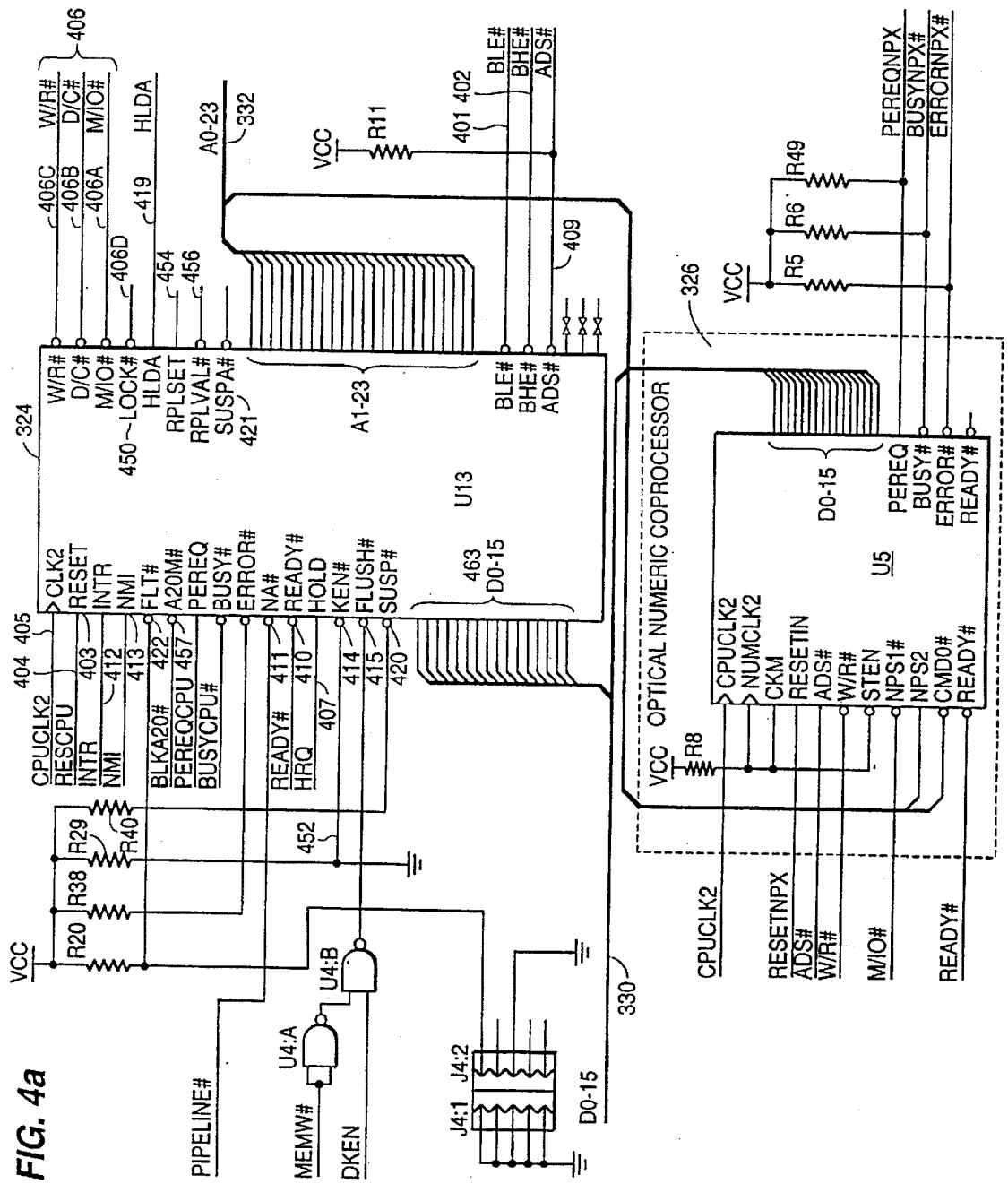
FIG. 4a is a schematic diagram of the processor and optional coprocessor that are housed in the motherboard according to the invention.

The motherboard 300 includes a central processing unit (CPU) 324, which is shown in FIG. 4a. In the shown embodiment this is implemented with a 486SLC microprocessor designed by Cyrix, and manufactured by Texas Instruments. Further details on the processors are available in data books dedicated to this chip, available from Cyrix or Texas Instruments. The processor 324 has an internal 32 bit data bus that is multiplexed through a 16 bit data port 330 to the outside world. The processor 324 includes an internal cache and improved instruction pipelining to increase the processing power of the chip. Sophisticated power management provisions are also incorporated into the processor 324 to support the low power battery operation. The cache and other unique features of the chip are controlled by internal configuration registers. The motherboard 300 provides for an optional external floating point processor 326 such as a 387SX, as shown in FIG. 4a, the details of which are provided more fully below.

The processor 324 is primarily interfaced to a system controller 328 which separates the processor's address and data buses and most of the control signals from the rest of the system. A 16 bit data bus 330 transfers data between the processor 324, the system controller 328 and the system DRAM memory 310 as illustrated in FIG. 3. The data bus 330 also connects to the optional numeric coprocessor 326.

The data bus 330 has no series terminations, but does have pull-ups to bring the bus to a known (high) state when the drivers float.

An address bus 332 is connected to the processor 324, the coprocessor 326, and system controller 328, as seen in FIGS. 4a and 4b. The lack of an A0 line (see FIG. 4a) for these elements 324, 326, and 328 means that all addresses are on word (two byte) boundaries. Detailed connections of a specific embodiment of the processor 324 to the system controller 328 and the optional coprocessor are illustrated in FIGS. 4a and 4b. The BLE# and BHE# signals 401, 402 are tri-state outputs from the processor 324 which indicate which bytes of the 16 bit word are active. One or both of these signals is always active (low) during any data transfer, so the data could be the full 16 bits, or the lower or upper 8 bits alone.

When implemented with the 486 SLC processor, the address bus 332 limits the addressable memory space to 16 megabytes. Expansion beyond this limit can be accomplished using a more powerful processor, or some type of paging scheme that is outside of the PC standard. During I/O operations (except for coprocessor access), lines A23–A16 of the address bus 332 (see FIG. 4a) are held low, limiting addressable I/O space to 64 kilobytes. Early PC's only decoded the first 10 bits of I/O addresses, limiting the range to from 0 to 3FFh ("h" signifies hexadecimal notation) addresses (1 kilobyte). Newer systems and I/O cards typically decode the full 16 bits of I/O address to allow full usage of the 64K address space. Any modules connected to the module slots 201, 203, 205 system modules of the system 100, must implement full decoding of any I/O ports in the module to prevent conflicts caused by a partially decoded port showing up at multiple locations outside of the original 1K range limitation.

Addressing of the numeric coprocessor 326 is done with I/O cycles, but with address line A23 of address bus 332 in FIGS. 4a and 4b held high. Thus the processor sends the coprocessor 326 commands at address 8000F8h, for example.

The general operation of the processor 324 when implemented with a 486 processor will now be described. The processor 324 is placed into a reset state when the RESET pin 403 is high. When the RESET pin 403 is lowered, the processor 324 will come out of reset and begin program execution at physical address FFFFF0h. The RESET pin 403 is driven by the RESCPU line 404 from the system controller 328, and is separate from other system reset signals to allow the processor 324 to be reset independently for operations such as changing between protected and real modes.

Most 486SLC processors require a clock frequency operating at twice the operating speed of the CPU. (For example, the 20 MHz CPU requires a clock input of 40 MHz.) The clock doubled chip versions, therefore are not actually doubling the clock, but rather are just not dividing the clock in half. The CPUCLK2 clock signal 405 driving the processor 324 CLK2 pin is generated by the clock synthesizer circuit 334 (FIG. 3) described below.

Four tri-state output pins 406 of the processor 324 (W/R#, D/C#, M/IO#, LOCK#) define the type of bus cycle operation being performed, allowing the system controller 328 to determine whether and how to route the data. Note that during DMA acknowledge cycles, these lines (except LOCK# 406D) are driven by the system controller 328, not the processor 324, to identify the DMA channel being granted.

The M/IO# line 406A indicates that the current cycle is a memory (if high) or I/O (if low) read or write. When high, the D/C# line 406B indicates that the current cycle is a data operation. When low, the cycle is a control function cycle, such as halt, interrupt servicing, or code fetching.

The W/R# line 406C indicates whether the current cycle is a write (if high) or read (if low) operation on memory or I/O space. The LOCK# line 406D, when asserted low, indicates that other system bus masters are denied access to the system bus. The LOCK# line 406D is asserted during descriptor updates, interrupt acknowledgment, and when executing the XCHG instruction. The LOCK# line 406D may also be explicitly activated during bus operations by including the LOCK prefix on certain instructions, such as block MOV's. The processor 324 will not respond to or acknowledge any bus masters request for the bus through the HOLD line 407 while LOCK# 406D is active. As illustrated in FIG. 4a, the LOCK# pin 450 of the processor 324 is left unconnected. This is because the ISA bus standard and the system controller 328 do not include provisions for the LOCK# signal 406D. The ISA bus does include a MASTER# pin 408 which tells the system controller 328 to ask the processor 324 to relinquish the bus 332 through the HOLD line 407.

Three bus cycle control signals indicate the beginning of a bus cycle and allow system hardware to control address pipelining and bus cycle termination. The address strobe line ADS# 409, is driven low by the processor 324 when a valid address has been defined by the outputs of the address lines A1–A23 332 and the bus cycle definition pins. During non-pipelined bus cycles, the ADS# line 409 is active low for the first clock of the bus cycle. During pipelined cycles, the ADS# line 409 remains active until the system returns a READY# signal 410 for that cycle.

READY# 410 is an input which is driven low to tell the processor 324 that the current cycle may be terminated. For example, during a read cycle, a low READY# 410 indicates to the processor 324 that the system has placed valid data on the bus 330. For write cycles, the READY# line 410 indicates that the system has accepted the output data from the processor 324. READY# is required to terminate every bus cycle, including halt and shutdown cycles.

The Next Address Request input line NA# 411, is used to request address pipelining by the processor 324, indicating that the system 100 is ready to accept the next set of bus cycle definition and address signals, even if the current cycle has not yet been terminated by a READY# signal on line 410. The processor 324 will place the address and bus cycle definition signals on the bus as soon as they are ready.

Two pins allow the processor's 324 normal execution stream to be interrupted to execute an interrupt service routine instead. The INTR input 412 is used to request handling of a maskable interrupt by the processor 324. This level sensitive input will be ignored if the IF mask bit in the processor Flags register is set. When not masked, the processor 324 responds to a high level with two locked interrupt acknowledge bus cycles. During the second cycle, the processor reads the 8 bit interrupt vector from the system interrupt controller. This vector determines the address of the address of the interrupt service routine to be executed.

A second interrupt request input at the processor 324, is the NMI line 413 which is rising edge sensitive. This line is non-maskable, and has a fixed interrupt vector value of 2. External interrupt acknowledge bus cycles are not used, since the interrupt vector value is set to 2 by the processor 324. NMI processing does not nest. The processor 324 will wait for the completion of the current NMI handling routine by the IRET instruction before another NMI servicing will begin. If an NMI rising edge is seen during the handling of a previous edge, that one (and only one) edge will be remembered by the processor, and another execution of the NMI interrupt servicing routine will start after the current one completes. Maskable interrupts, if unmasked, may interrupt the servicing of a non-maskable interrupt. The NMI edges are detected by sampling by the processor 324. In order to insure recognition, NMI must be low for at least eight CLK2 cycles, then high for another eight.

The 486SLC family of processors contain internal caches. Four pins control the cache and indicate the status. The cache enable input ENN# 414, tells the processor 324 to cache the data being read during the current cycle. If the line is high, the current data will not be cached. Additionally, caching of specific memory regions may be disallowed by the internal non-cacheable region registers of the processor 324. I/O access cycles, locked reads, and interrupt acknowledge vector fetches are never cached, regardless of the state of KEN#. After reset, the KEN# line 452 is ignored until the KEN bit of the CCR0 configuration register in the CPU is set.

In the system 100, the KEN# line 452 is tied low and the BIOS enables the cache through the KEN bit in the CCR0 register. The BIOS also disables caching of the upper part of the lower 1 MB of address space (640K to 1 MB—0A000h to 0FFFFh), as well as the 128K top memory region reserved for the module dual port RAMs described more fully below.

While the KEN# line 452 is able to tell the processor 324 not to cache specific data reads, the cache flush, FLUSH# line tells the processor 324 to invalidate and flush the entire contents of the internal cache. The FLUSH# pin 415 is ignored after reset until the FLUSH bit of the CCR0 processor 324 configuration register is set. The cache may also be set to flush on any HOLD cycle by setting the BARB bit of the CCR0 register. The BIOS enables the FLUSH# pin 415, but does not set the BARB bit, but rather uses external circuitry to provide a more selective flushing of the cache during certain HOLD cycles.

The system memory 310 uses DRAM with refresh cycles controlled by a memory controller present in the system controller 328, similar to normal DMA cycles. The refresh cycles thus are seen as HOLD cycles by the processor 324. In order to improve performance, the system 100 activates (lowers) the cache flush line FLUSH# 415 only when the DKEN line 416 is high and MEMW# 417 is low (FIG. 4b). Thus DMA writes, which can change the system memory 310 without the knowledge of the processor 324 and its copy of that memory area in cache, will flush out the cache to be safe. DMA reads, including refresh operations by the memory controller do not change the memory 310, and thus do not require a flush of the cache. Since refresh cycles occur so frequently, this restriction of cache flushes to DMA writes have a significant effect on the performance of the system 100.

The original PC was based on the 8086 processor, which had an address space that was limited to only 1 MB by its small 20 bit address bus A0–A19. The segmented addressing scheme, however, allowed the creation of logical addresses whose physical address equivalent was outside of this 1 MB address space. The 8086 would just wrap the segment back around to the bottom of memory, since it had no A20 line to allow any higher address than 0FFFFFh (1 MB). For example, with the segment register set to a value of F800h, an offset of 1000h would yield a physical address of F800:1000=F9000h, while an offset of 9000h would yield a physical address of F800:1000=101000h which on the 8086 would wrap around to 01000h near the bottom of memory.

When the AT and the 80286 were introduced, a potential problem had to be dealt with. Some code that had been written that counted on the wrap-around that was possible with the 8086 in order to be able read the top of the 1 MB memory space where the BIOS and its fixed tables resided, and the bottom of memory where the BIOS and DOS data areas were, all with the same segment register setting. The 80286 had a larger address space, however, and would not naturally wrap at the 1 MB boundary. The solution was to add a mask or gate for the new A20 address line. If the gate was closed, the A20 line would always stay low to allow the wrap to occur for code that expected it. If the gate was open, the A20 line would function like any other address line, and programs written for the 80286 and beyond would be able to address the memory above the 1 MB boundary as they would expect.

Later, it was determined that almost 64 KB of memory could be added to the 1 MB limitation of real mode operation on an 80286 or above processor by opening the A20 gate (letting A20 operate as a normal address line) and setting the segment register near the top of the 1 MB. For example, the valid real mode logical address of FFFF:FFFFh is equivalent to a physical address of 10FFEFh, or nearly 64 KB beyond 1 MB. This is the way the new DOS versions implement the "High Memory" area (HMA) that can now hold parts of DOS and its data to free up more of the lower memory areas.

The A20 mask is a simple implementation when all memory is external to the processor, but in the case of processors like the 486SLC that have internal caches, they need to be told when to mask the A20 line as well, so the internal cache can keep its address calculations in line with those for the external memory. The 486SLC has a pin 457 labeled A20M# for this purpose. When A20M# is low, the A20 line is always set low. The A20M# line is controlled by the VLSI SCAMP II chip 328 which controls the A20 gate for external memory.

Since the 486SLC implemented as the processor 324 does not have an internal numeric coprocessor like the Intel 486DX, it instead has provisions for the attachment of an external 387SX coprocessor 326. Opcodes that are intended for the coprocessor 326 are transferred through I/O port addresses 8000F8h, 8000FCh, and 8000FEh. Since no other I/O addresses (other than these for the coprocessor) are defined outside of the lower 64 KB range, the A23 line and M/IO# line 406A serve as a simple chip decode for the coprocessor.

The processor 324 can give up control of its local bus when it is requested by another bus master, including the DMA and memory controllers. All of the following lines are tri-stated during the hold acknowledge state: Address lines (A23–A1) 332; ADS# 409; BHE# 402; BLE# 401; Data lines (D15–D0) 330; D/C# 406B; LOCK# 406D; M/IO# 406A; RPLSET 454; RPLVAL# 456; W/R# 406C.

During the hold acknowledge state, the processor 324 will continue to operate as much as it can without using its bus by operating out of cache if possible.

The hold state is requested by the system controller 328 through its HRQ line 418 (see FIG. 4b) to the processor HOLD pin on line 407. When this line is raised, the processor 324 will finish the current bus cycle or locked cycle sequence before releasing the bus. Once the bus has been released, the processor 324 raises the HLDA line 419 to acknowledge that the request has been seen and granted. The bus will remain in the hands of the new bus master until the HOLD line 407 is released (lowered), at which point the processor 324 again drives the bus and lowers the HLDA line 419. The HOLD pin is ignored during processor RESET (which happens when switching from protected to real modes, even though the system reset is inactive).

One NMI edge can be stored for processing once the processor 324 returns to normal operation. Note also that the processor 324 can perform cache flushes based on the FLUSH# pin 415 even while in the hold state. This insures that the cache is properly invalidated if the new bus master performs any writes to system DRAM 310.

As described above, the system 100 is to be used in low power sensitive portable environments. The processor 324 can enter a low power suspend mode as a result of a hardware request or by the execution of the HALT instruction. The suspend request input pin, SUSP# 420, is used to start the sequence of putting the processor in the suspend mode. The processor 324 responds by lowering the SUSPA# suspend acknowledge pin 421 when it has entered that mode.

For factory test purposes, lowering the float control pin, FLT# 422 of the 486SLC puts it in a state where all bi-directional and output signals are forced to a tri-state condition. This FLT# pin 422 is pulled high in the shown system, but the signal is also brought to a header pad to allow easy access by a factory test adapter if desired. The processor 324 must be reset after exiting the float state.

The processor 324 contains several internal registers (not shown), including protected mode registers to hold descriptor table information, debug registers to hold breakpoints and control stepping, test registers, non-cacheable region control, and general configuration control registers. With the exception of the description below, these registers are configured in a standard manner for 386 and 486 processors.

The configuration (CCR0–CCR1) and non-cacheable region (NCR1–NCR4) registers are indexed registers in I/O space. The index value is written to I/O address 22h, after which the register may be read or written at I/O address 23h. Subsequent access to address 23h in the processor 324 will not be granted unless preceded by another write to the index register at address 22h. The register indexes are shown below:

| REGISTER | INDEX | BITS |
|---|---|---|
| CCR0 | C0h | 8 |
| CCR1 | C1h | 8 |
| NCR1 | C5h–C6h | 16 |
| NCR2 | C8h–C9h | 16 |
| NCR3 | CBh–CCh | 16 |
| NCR4 | CEh–CFh | 16 |

These registers are typically configured only once, at boot time, and are handled by the BIOS. A 486SLC processor has a small (typically 1 KB) internal cache. Other sizes are available within the SLC family. The cache may be configured by the CCR0 configuration control register to operate as a direct-mapped or 2-way set associative cache.

As described above, the processor 324 must be supplied with a clock at the CLK2 pin on line 405 which would generally be twice the desired execution speed of the processor 324. Some versions are available which can be configured to use this clock directly, rather than dividing it by two internally, thereby doubling the speed of internal operations. Bus operations external to the processor 324 would still be at the half speed rate. The cache is particularly important on the "clock doubled" chips since cache operations stay within the chip.

Figure 4C:
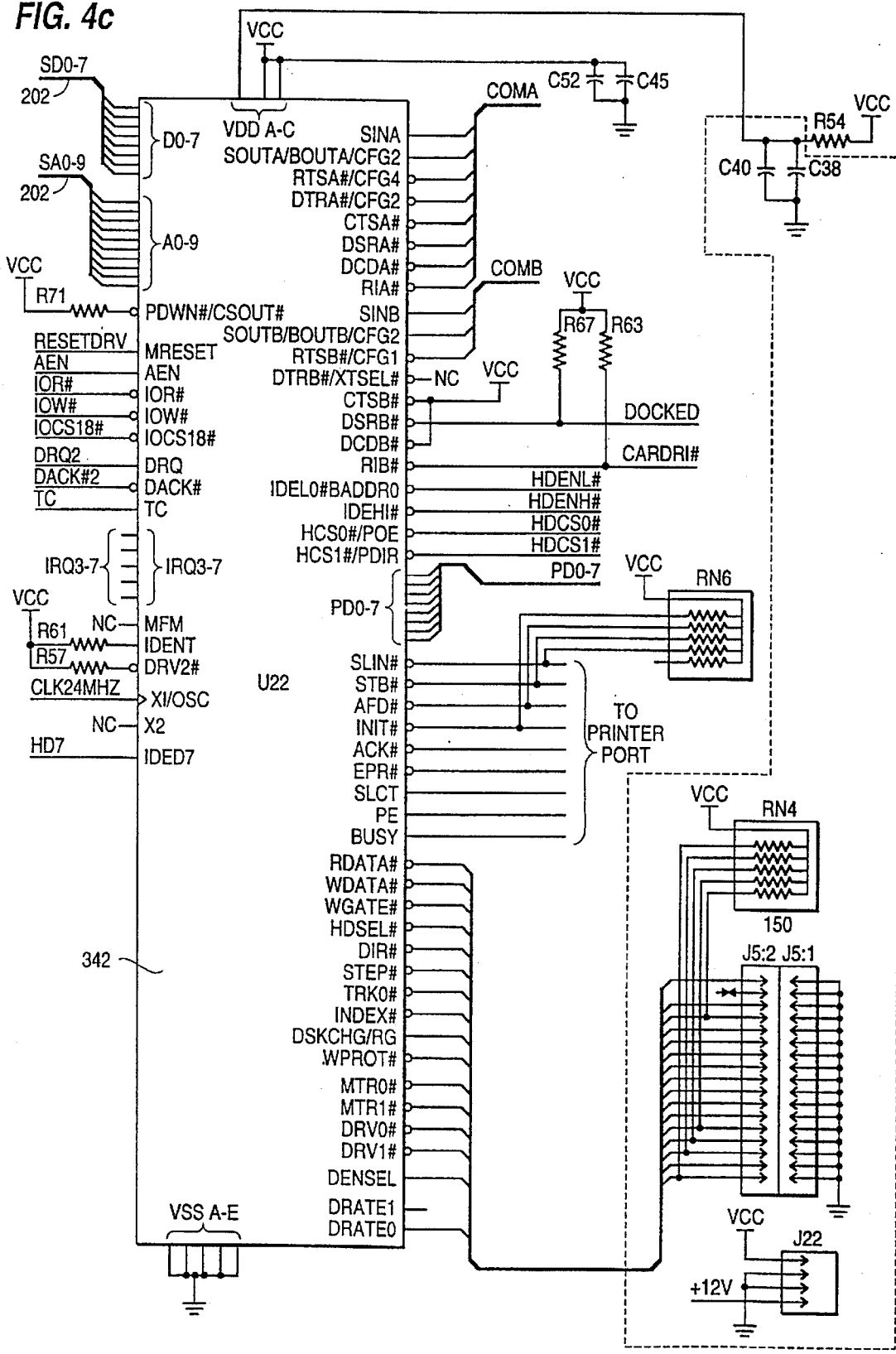
FIG. 4c is a schematic diagram of the Super I/O chip that is housed in the motherboard according to the invention.
Figure 4D:
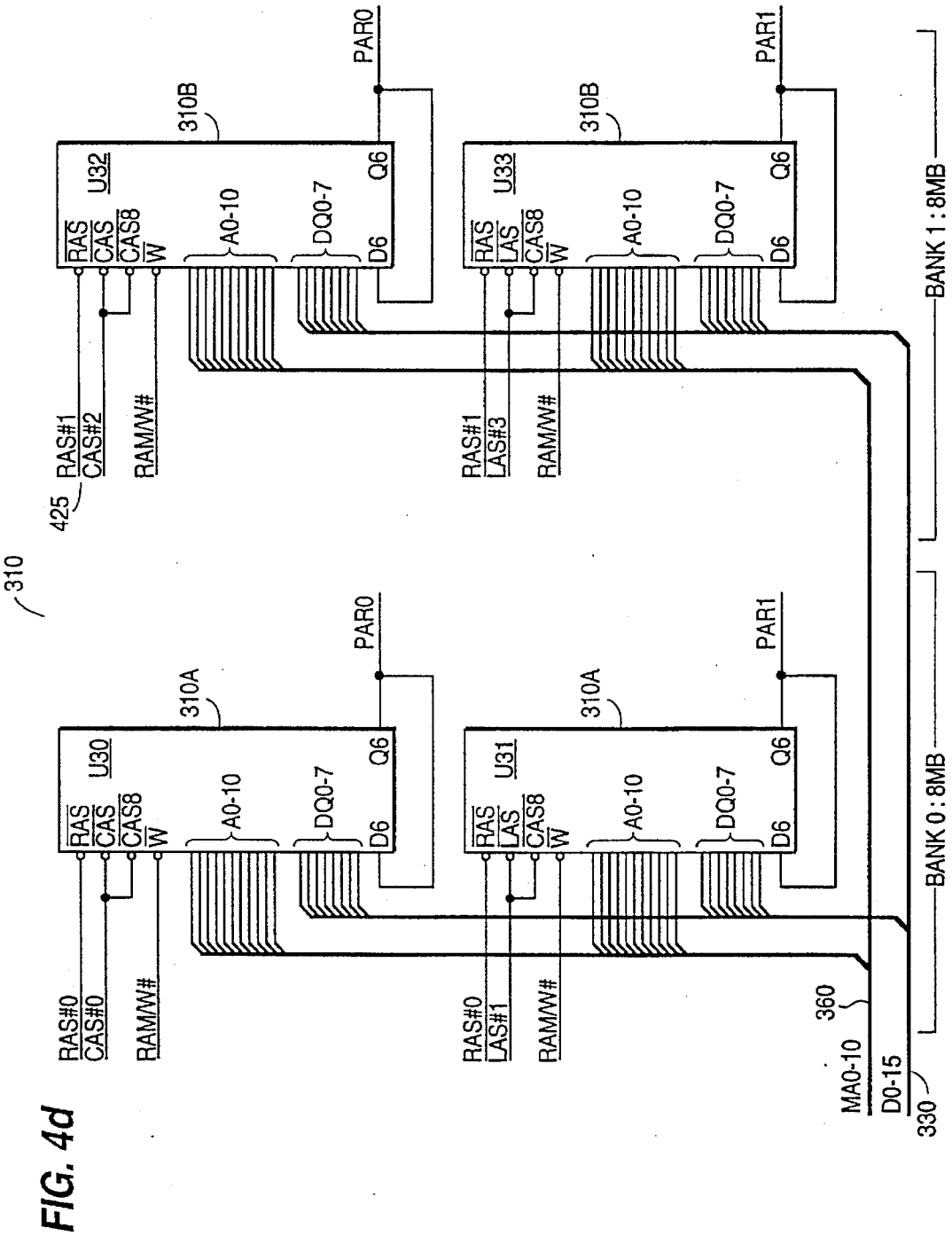
FIG. 4d is a schematic diagram of the DRAM banks that are housed in the motherboard according to the invention.
Figure 4E:
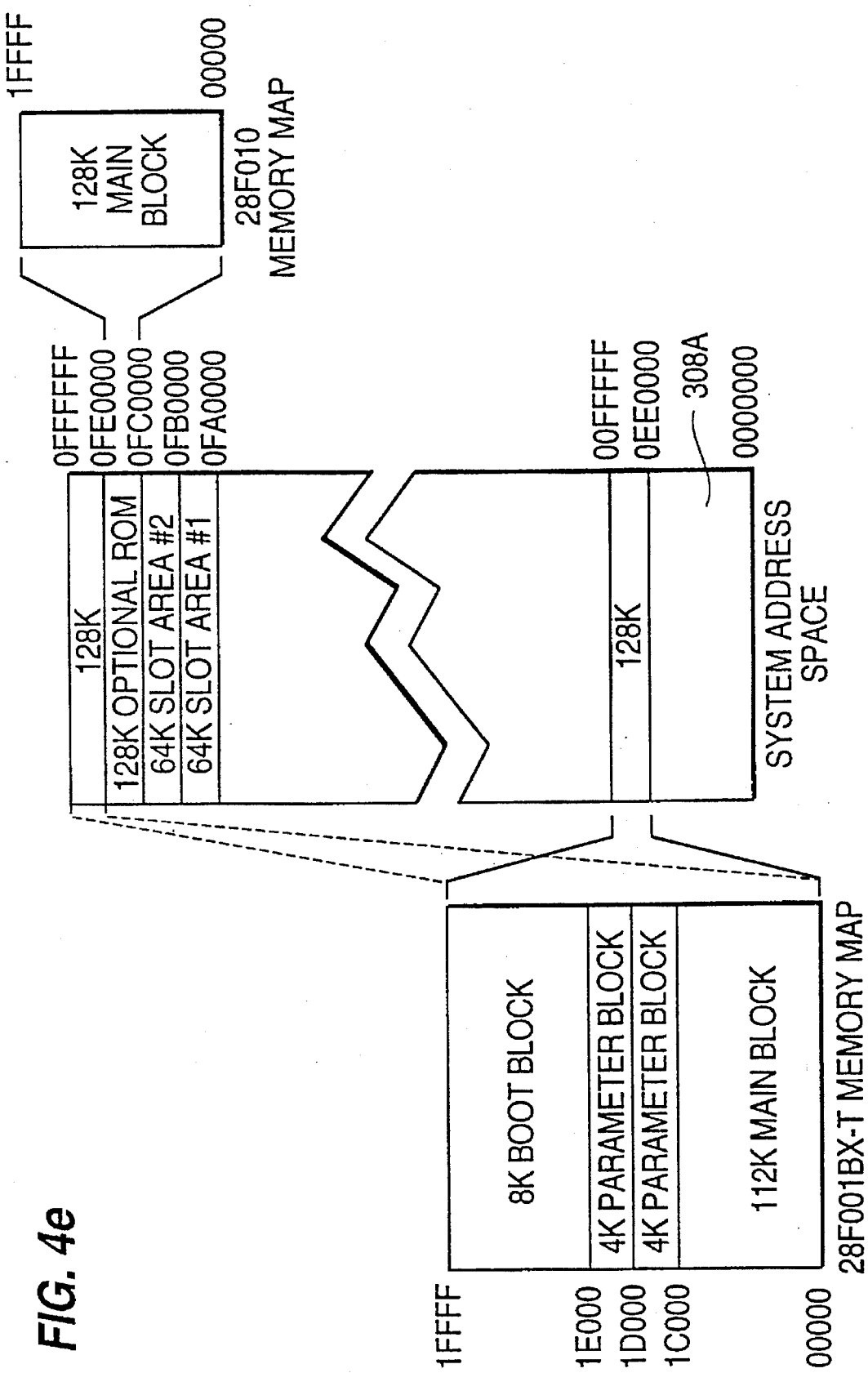
FIG. 4e is a diagram of the memory areas in both of the Flash BIOS ROMs that is housed in the motherboard according to the invention.
Figure 4F:
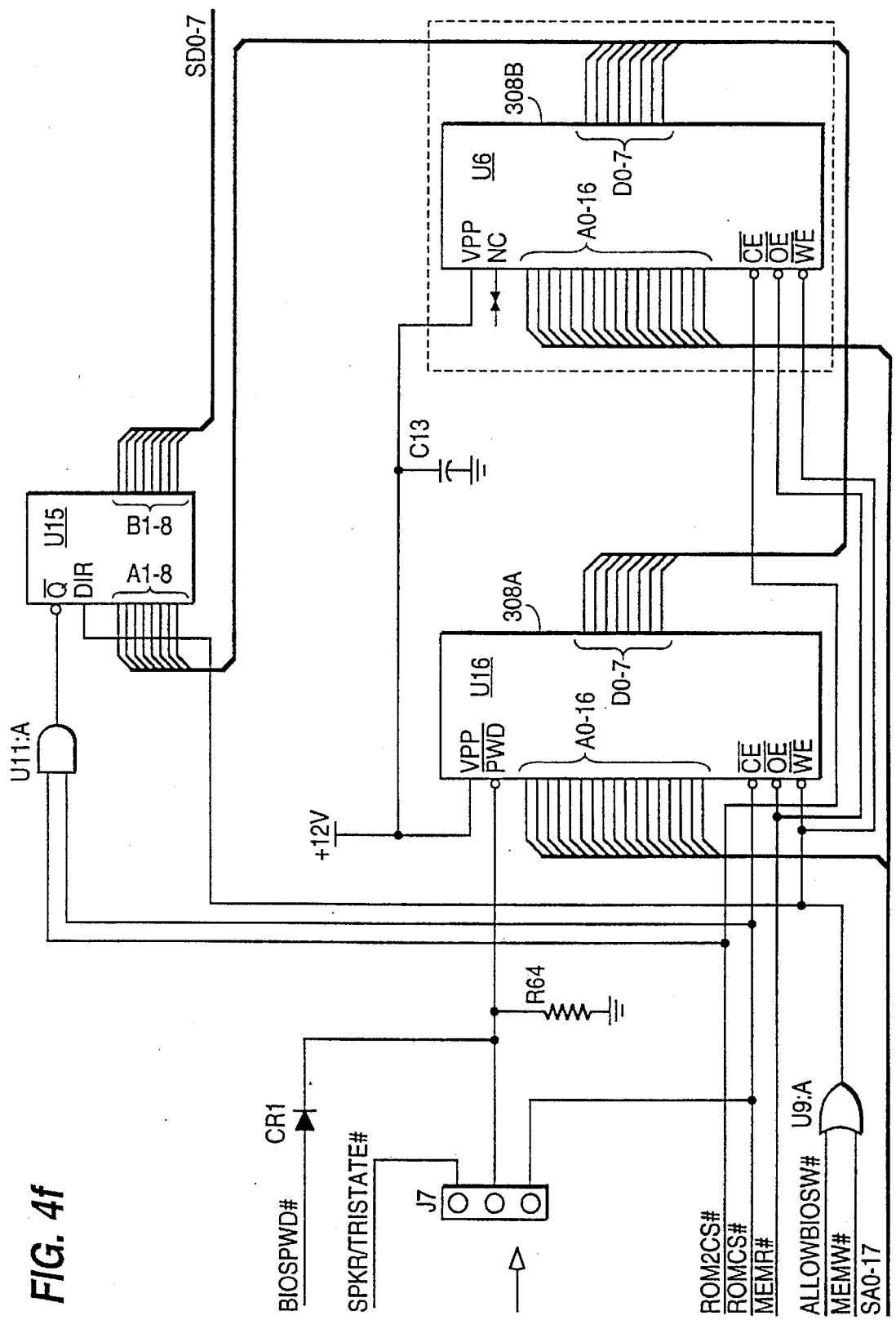
FIG. 4f is a schematic diagram of the Flash BIOS ROMs that are housed in the motherboard according to the invention.
Figure 4G:
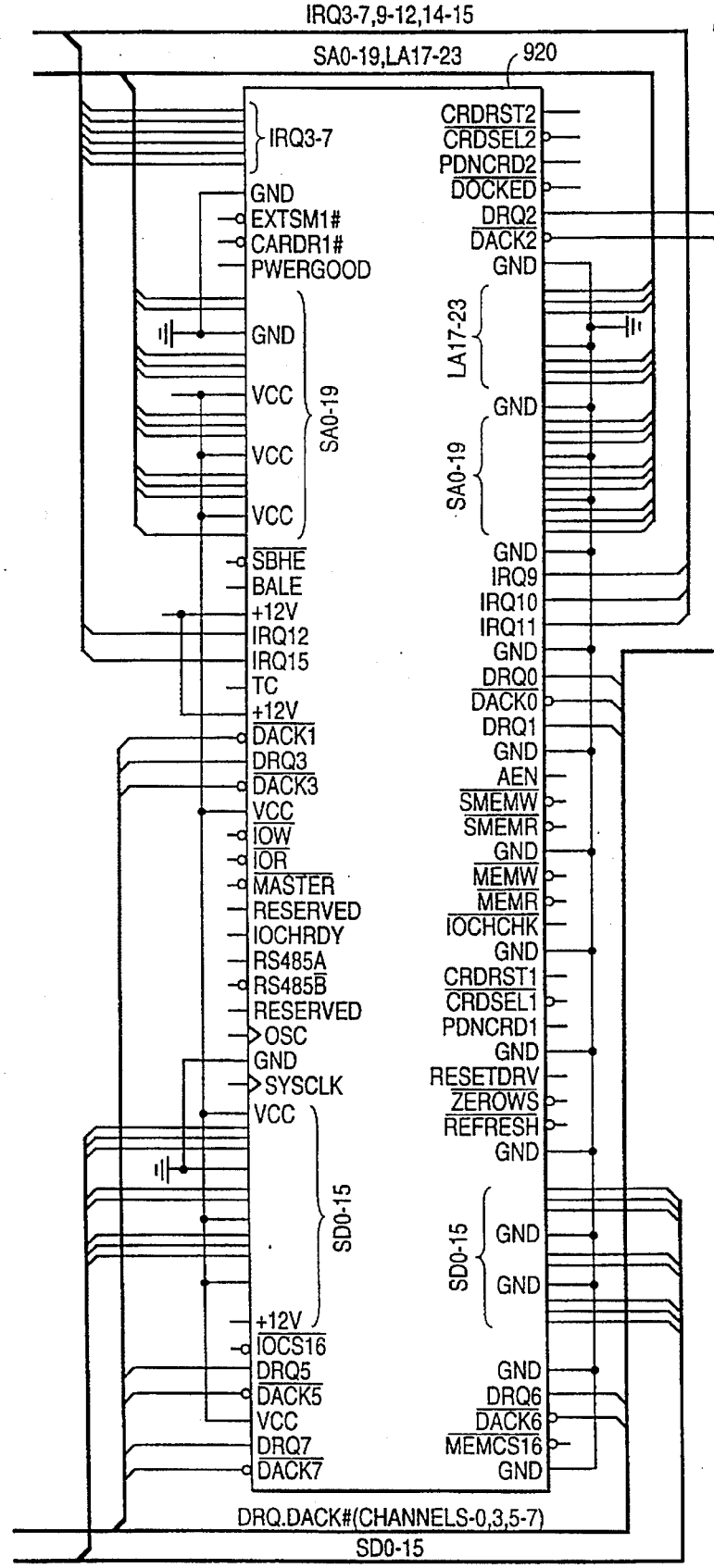
FIG. 4g is a schematic diagram of the backplane connector that is housed in the motherboard according to the invention.
Figure 4H:
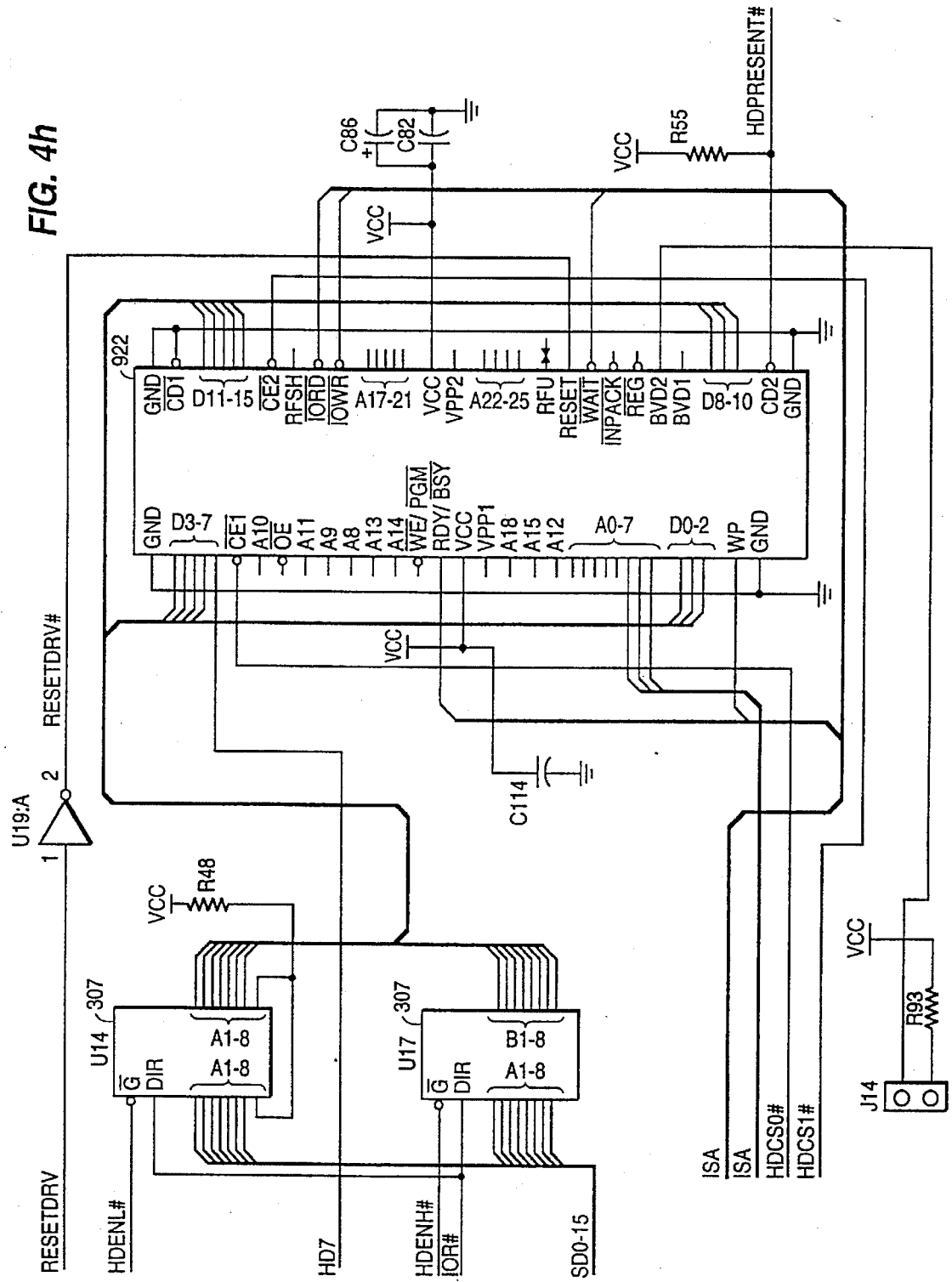
FIG. 4h is a schematic diagram of the IDE hard disk interface connection that is housed in the motherboard according to the invention.
Figure 4I:
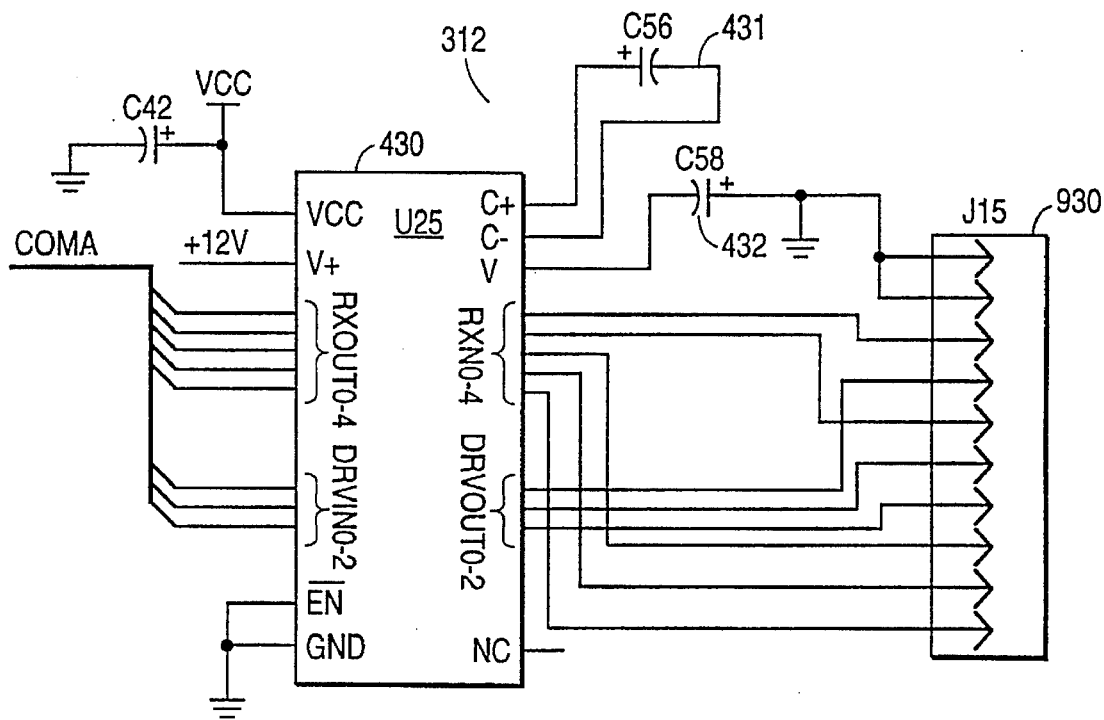
FIG. 4i is a schematic diagram of the RS-232 serial port that is housed in the motherboard according to the invention.
Figure 4J:
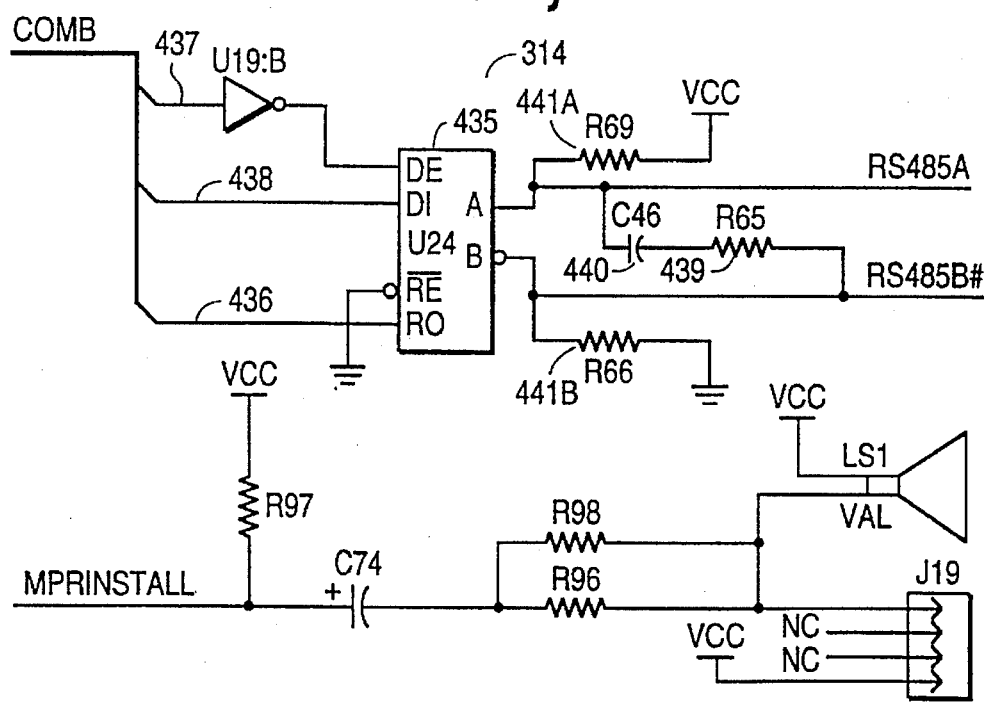
FIG. 4j is a schematic diagram of the RS-485 serial port that is housed in the motherboard according to the invention.
Figure 4K:
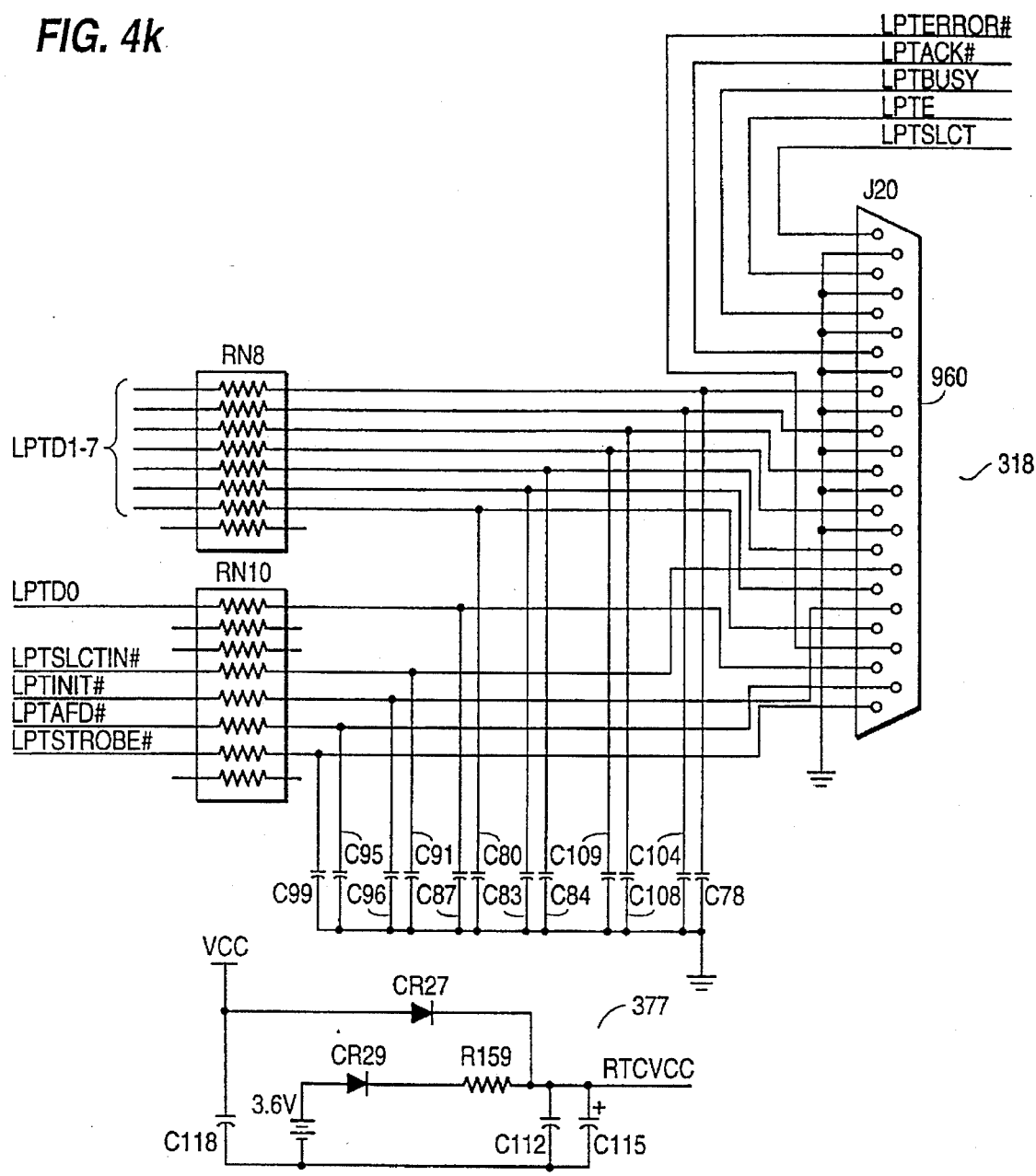
FIG. 4k is a schematic diagram of the parallel (printer) port that is housed in the motherboard according to the invention.
Figure 41:
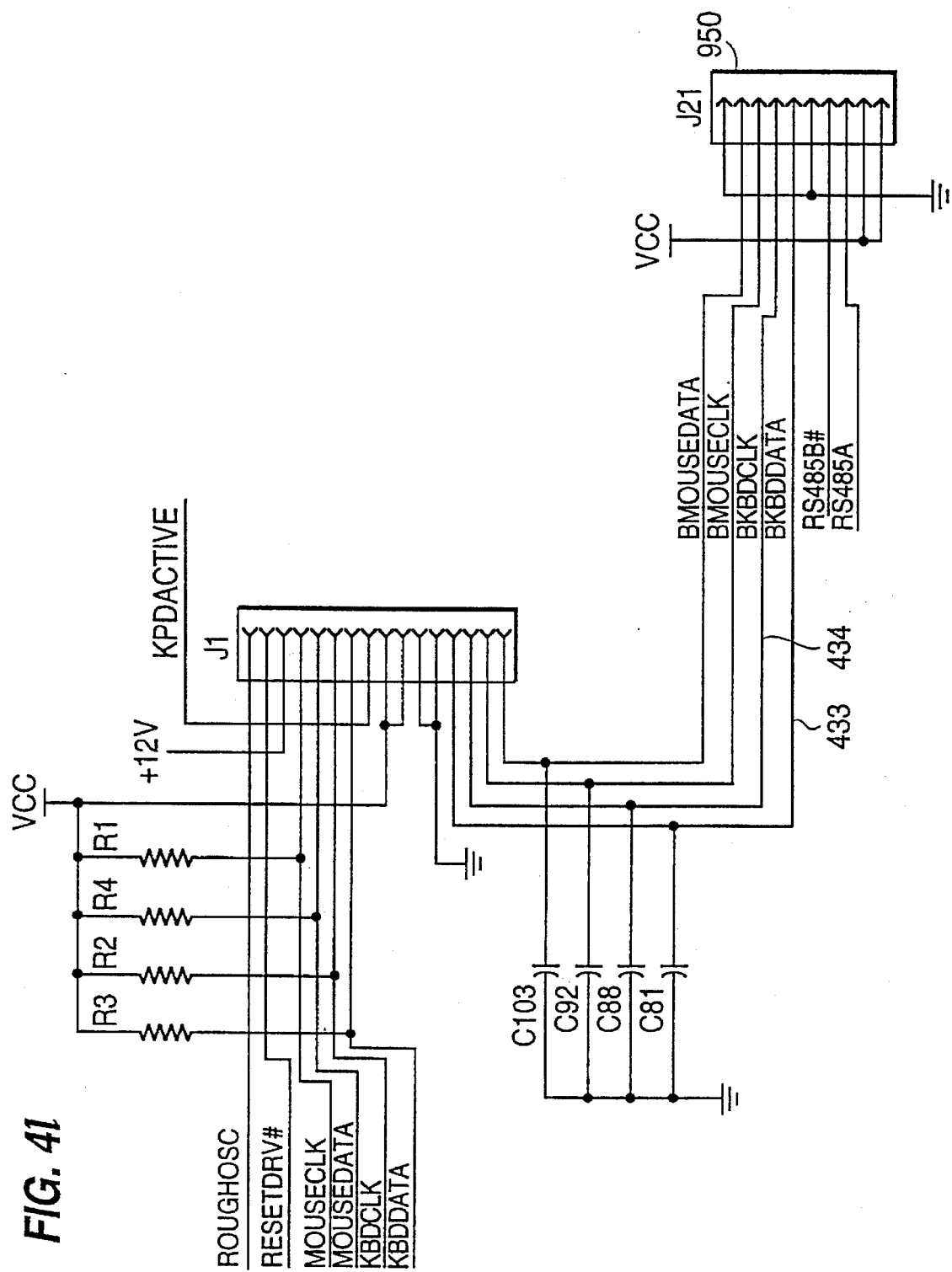
Figure 4M:
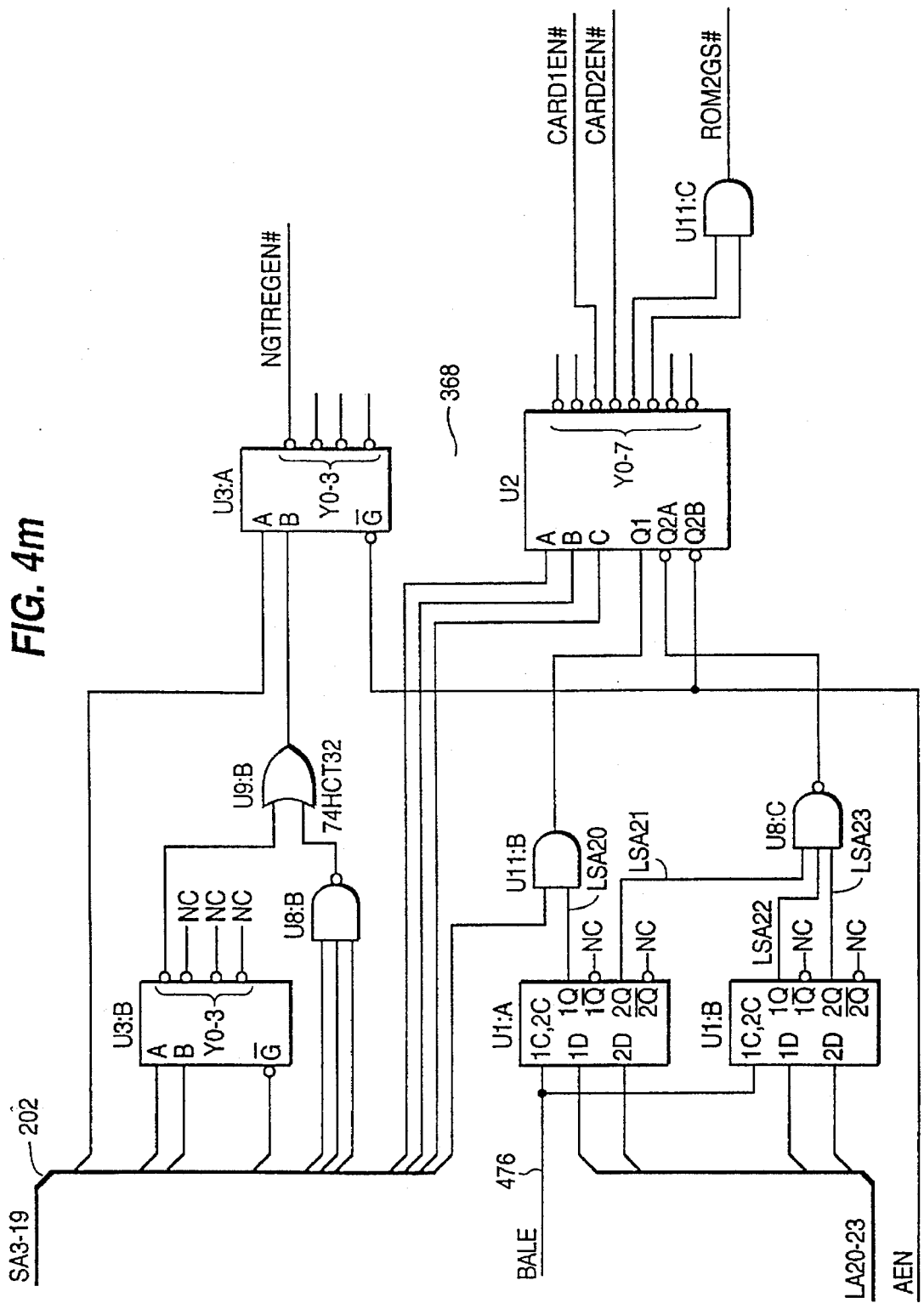
FIG. 4m is a schematic diagram of the address decoder housed in the motherboard according to the invention.
Figure 4N:
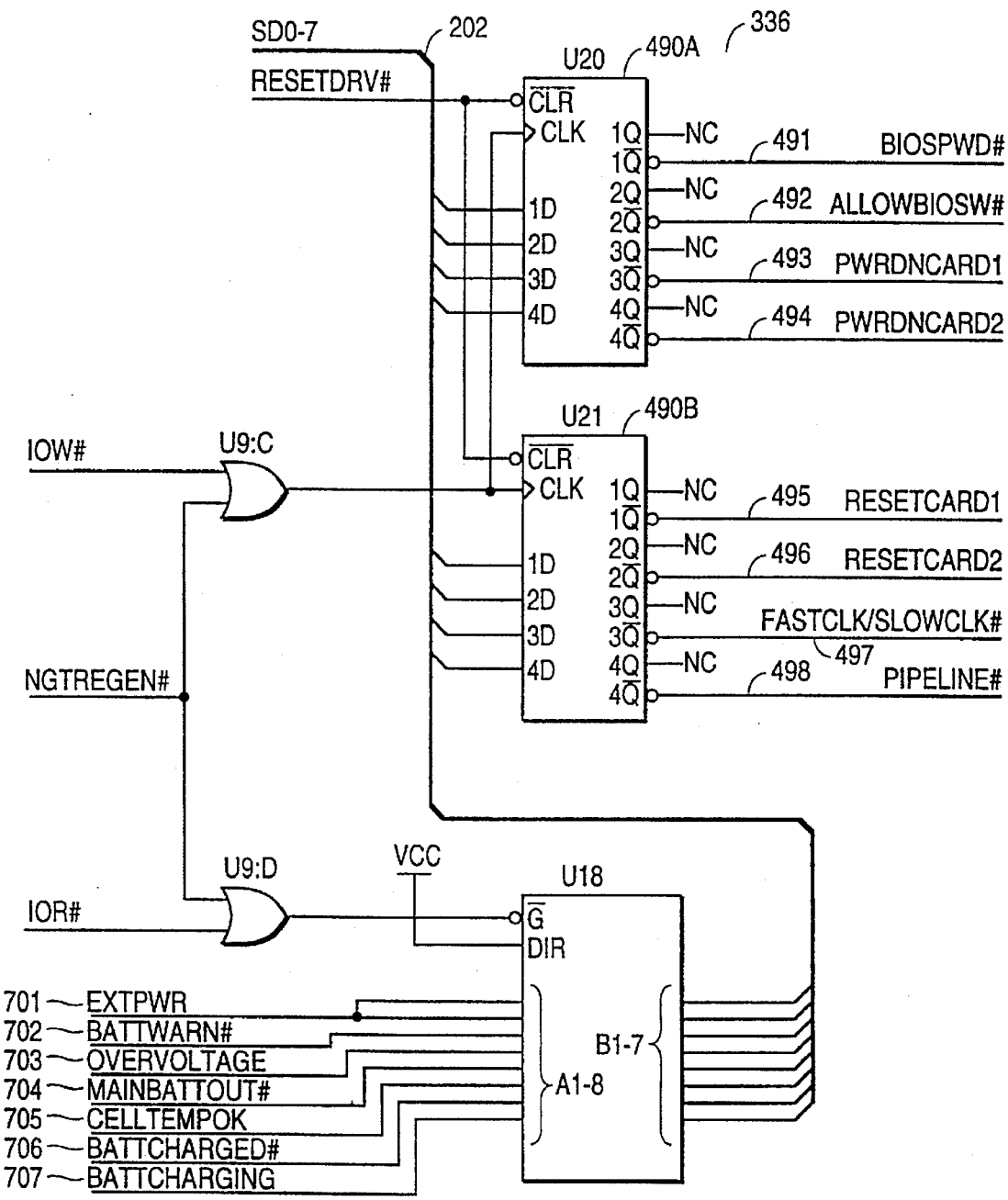
FIG. 4n is a schematic diagram of the NGT registers that are housed in the motherboard according to the invention.
Figure 4O:
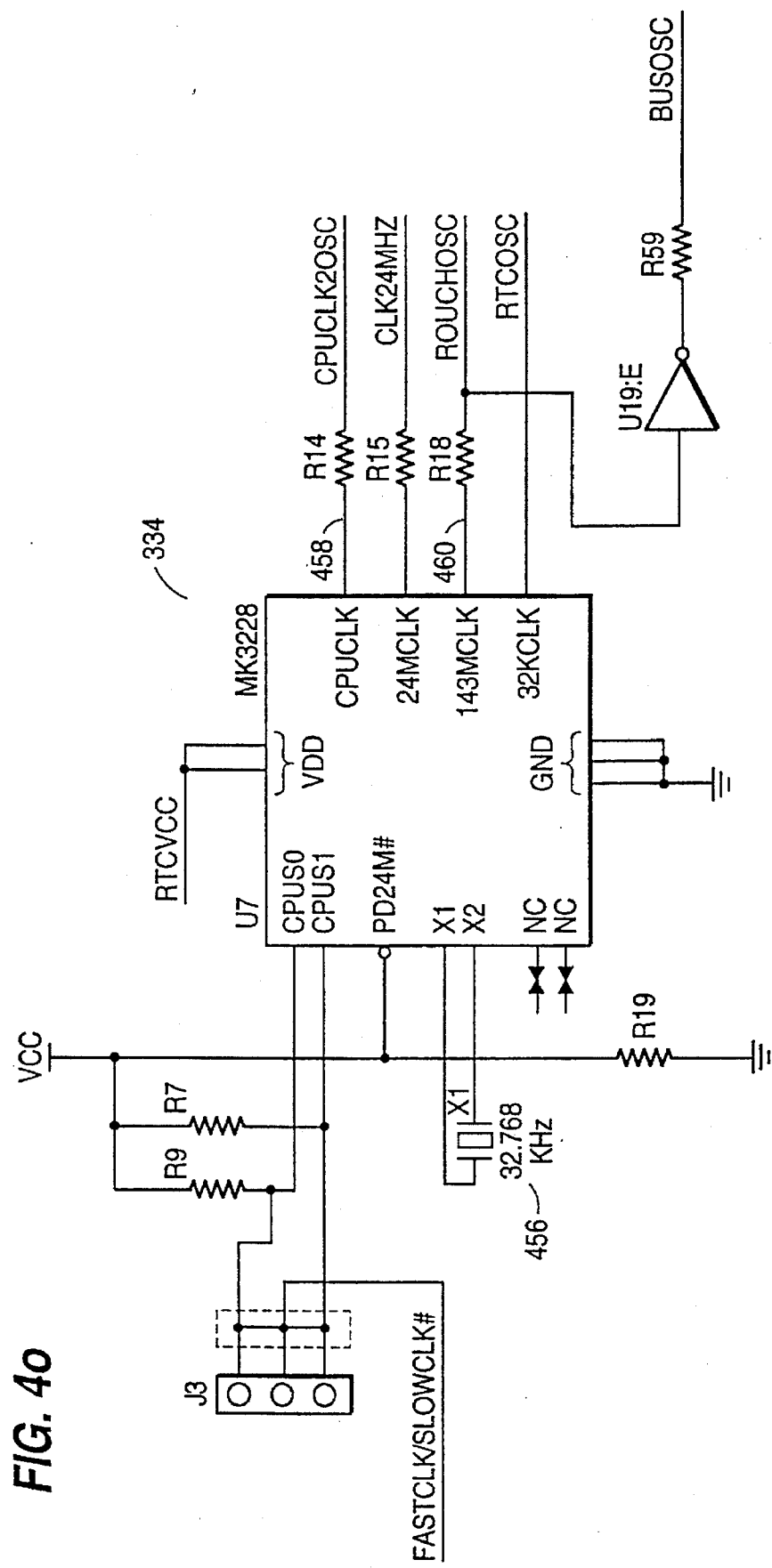
FIG. 4o is a schematic diagram of the clock synthesis circuit that is housed in the motherboard according to the invention.

Referring to FIG. 3 and FIG. 4o, the clock synthesis circuit 334 will be described. The system uses a clock synthesizer chip such as that produced by MicroClock. The clock synthesis circuit 334 derives several different clock rates from a single crystal 456 using digital phase locked loops (PLLs). The phase locked loop technology allows some of the output clock speeds to be changed while running. In the system 100, the CPU clock can be set to one of four different clock speeds (16, 20, 25, and 33 MHz) to be selected by register settings. The clock synthesis circuit 334 actually produces the CPUCLK2 signal 458, double the desired frequency, since the processor 324 divides it in half, unless a clock doubled chip is being used and is activated.

When the clock synthesis circuit 334 is initially powering up, it takes some time before the crystal oscillator 456 has stabilized and the phase locked loop has acquired a lock. The reset circuitry holds the system in a reset state long enough to provide plenty of time for this stabilization. When dynamically changing clock speeds during operation, the nature of a phase locked loop is such that it has stabilizing filters and therefore does not change speeds instantaneously. Thus, the clock speed will make a gradual transition between speeds. This factor must be taken into account when running software that counts on a specific clock rate by not assuming that the clock will immediately change to the new rate.

Figure 4Q:
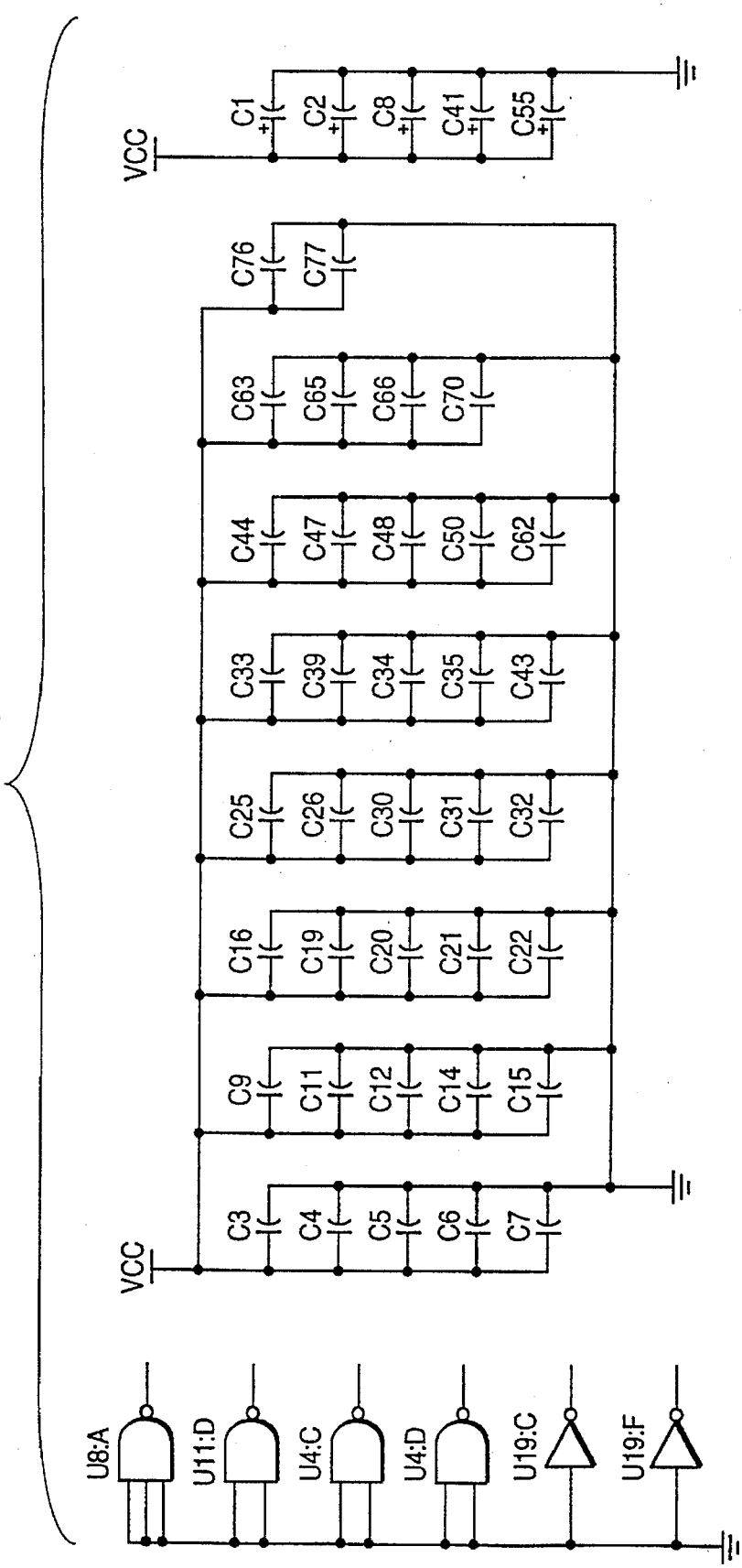
FIG. 4q is a schematic diagram of the spare logic components and bypass capacitors that are housed in the motherboard according to the invention.
Figure 4R:
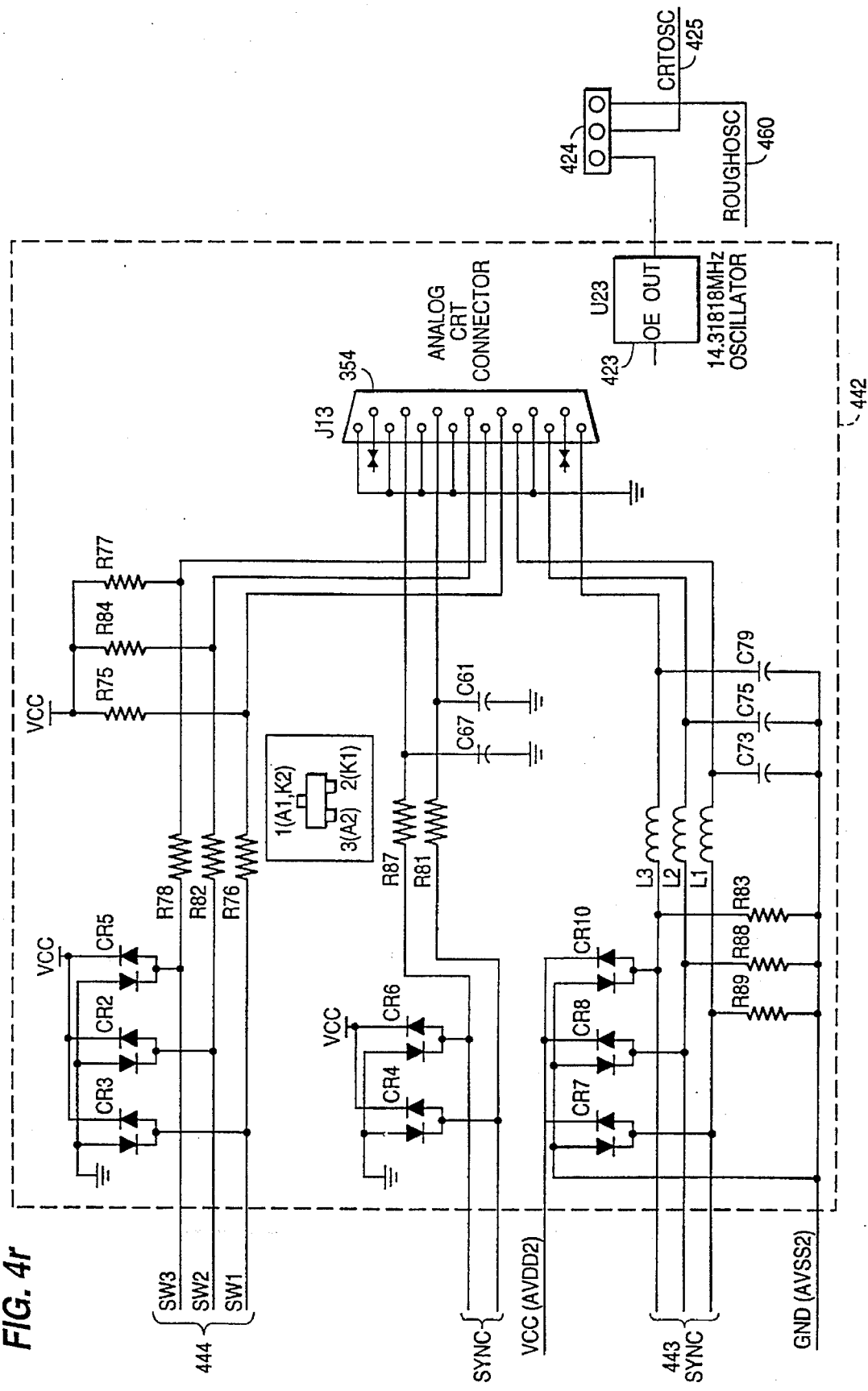
FIG. 4r is a schematic diagram of the protection clamps and filters and the VGA clock source selection jumper that are housed in the motherboard according to the invention.
Figure 4T:
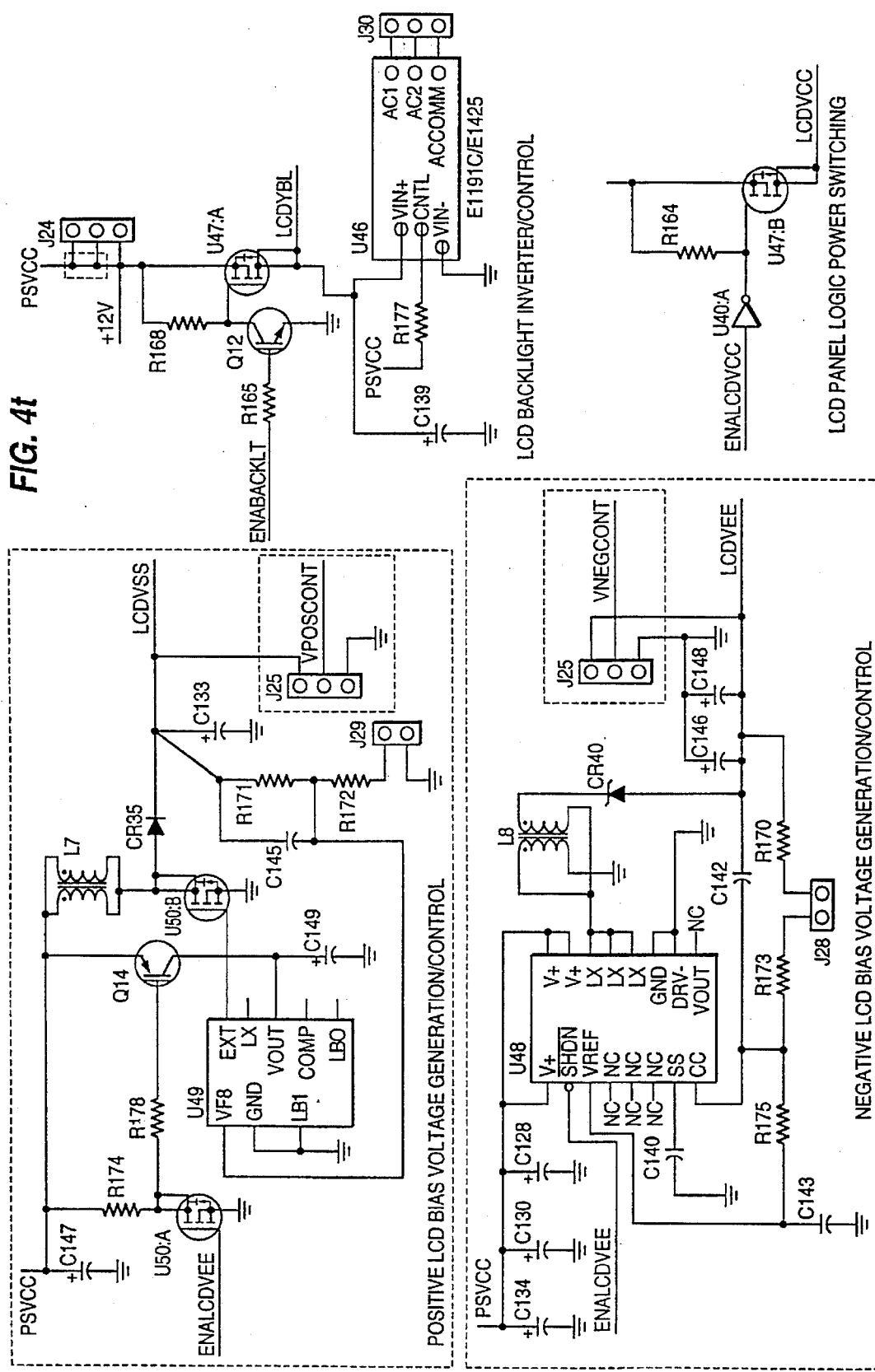
FIG. 4t is a schematic diagram of the bias voltage (LCD) generation and control that is housed in the power supply in the motherboard according to the invention.

The IBM PC standard defines the OSC clock, which is part of the ISA bus specification, to be 14.31818 Mhz. This signal was designed asynchronous (independent of other clocks) clock primarily for timing purposes. It is also used by many display controllers. The "14.3 MHz" clock output 460 is inaccurate (thus the name ROUGHOSC) by approximately 0.1%, with a frequency of 14.3196 MHz, due to inherent limitations of the digital phase lock loop design. While this inaccuracy is acceptable for most timing requirements, it is on the edge of the specified limits for deriving signals for CRT displays. To reduce cost when the system was being used with LCD panel displays only, the 14.3196 MHz clock may be used. If a CRT display is to be used, a 14.31818 MHz crystal oscillator 423 is added to support the CRT display. The oscillator 423 and a jumper selection 424 of the CRTOSC source 425 are shown in FIG. 4r, along with the other components needed to support external CRT displays.

In the illustrated system, clock distribution of the OSC signal is important to minimize ringing on the different branches of the circuit traces. The ROUGHOSC signal 460 is buffered before being sent off to the backplane 311 on bus 204 for use by the modules connected to slots 201, 203 and expansion/docking station connected to expansion connector 205 to prevent interference with other OSC uses on the motherboard 300 (FIG. 2a). Separate buffered OSC signals for the CRT display, backplane bus 204, and keypad daughterboard 301 are provided.

In order to prevent premature discharging of the real time clock battery when the main rechargeable battery is allowed to run down, caused by the system entering into states where the high speed clocks are still running but the RTCVCC line is drawing power from the Lithium cell rather than the now very low rechargeable battery, the real time clock is separated from the other clocks. Otherwise, the current drain is several orders of magnitude higher than that with only the 32 KHz real time clock oscillator running, and the Lithium cell is quickly discharged.

Alternatively, a MicroClock MK9154-04 synthesizer chip may be used to derive the high speed clocks. This chip is pin compatible with the most popular clock synthesizer chips in PC design rendering more accessible and less expensive than the MK3228 chip illustrated in FIG. 4o. The downside of this design, however, is that a 14.31818 MHz crystal is required in addition to the 32.768 kHz watch crystal 456 which has now been moved to connect directly to the real time clock port (not shown in FIG. 3) of the system controller 328. The use of a 14.31818 MHz crystal as the base for the clock synthesis circuit 334 means that for systems that are built to support a CRT output, a separate oscillator is not required since the OSC output 458 of the clock synthesis circuit 334 is extremely accurate (even more than the other clock outputs since it is the same frequency as the crystal and therefore is not derived by a phase lock loop circuit). Moreover, all power for the MK9154-04 can be derived from VCC, not the RTCVCC, so there is no chance of it running down the Lithium cell.

The operation of the system controller 328 will now be further described. As illustrated in FIG. 4b, the system controller 328 can be implemented with a VLSI SCAMP II chip. In many ways the system controller 328 is more the heart of the system than the microprocessor 324. The SCAMP II system controller 328 houses most of the standard functions of a standard PC, including a memory controller, ISA bus controller, keyboard and mouse controllers, real time clock, DMA controllers and page registers, programmable interrupt controllers (PICs), processor and numeric coprocessor interface, A20 line support, address mapping and address decodes, timer/counters, and some clock generation.

Two different versions of the SCAMP II chip 328 are available, VL82C315 and VL82C316. Both are currently manufactured in the same process, but then separated with bin selection during testing such that the VL82C315 parts are guaranteed to run at 25 MHz with the lower 3.3 V supply voltage, while VL82C316 parts are only specified to operate with 5.0 V supplies. Either part may be used in the system 100 according to the invention since it uses only 5 volts for its logic supplies (except for support for 3.3 volt operation of PCMCIA cards).

The SCAMP II chip 328 comes in a 208 pin plastic quad flat pack (PQFP) package. A separate data manual is available for the part from VLSI Technology, Inc. The interface to this chip is illustrated in FIG. 4b and described more fully below.

The system controller 328 is configured using a large set of internal registers described in detail in the above referenced VLSI data manual where there is approximately one hundred pages discussing the internals of the chip and its configuration.

Figure 4U:
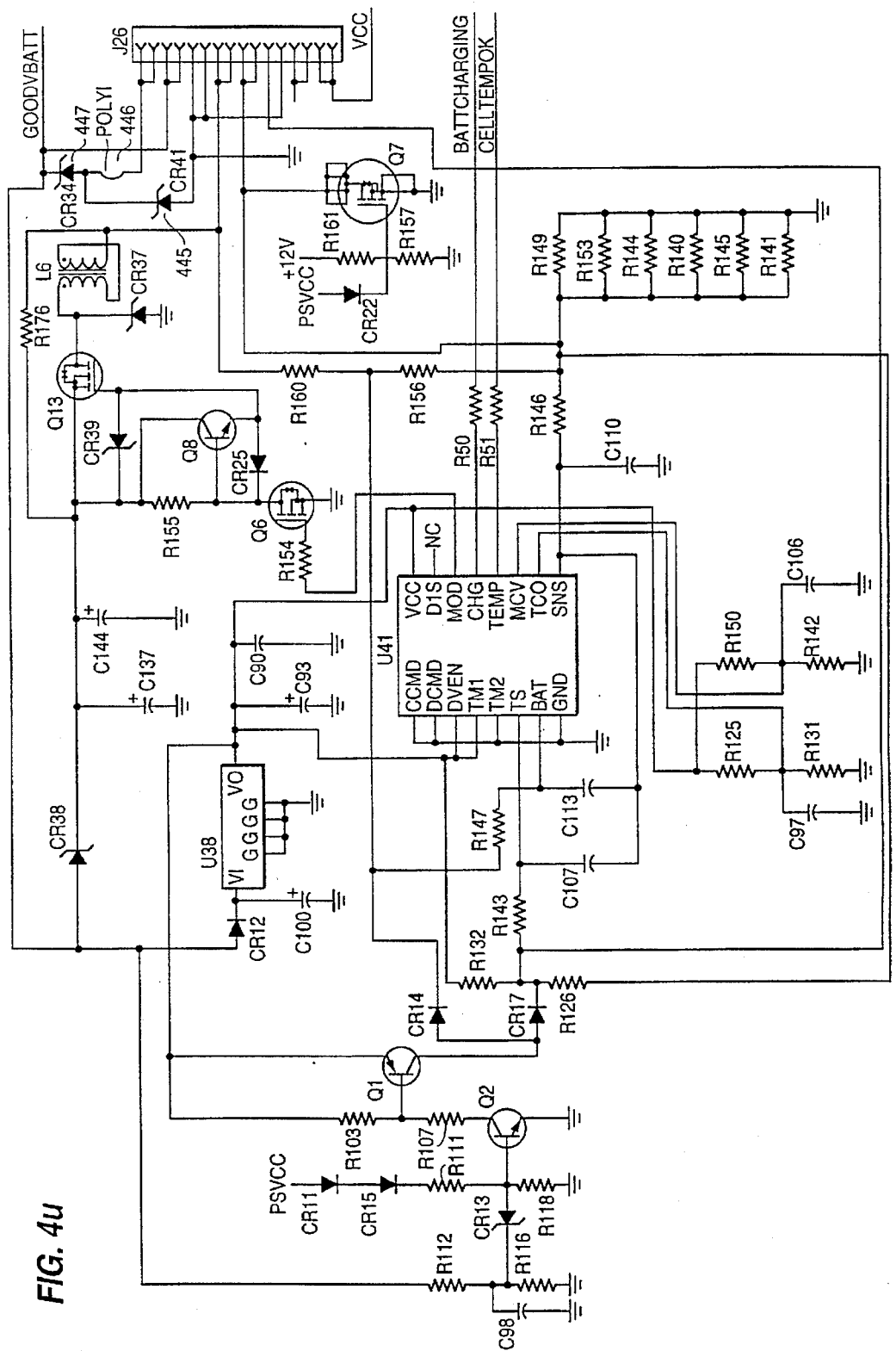
FIG. 4u is a schematic diagram of the battery charge control and input power protection that is housed in the power supply in the motherboard according to the invention.
Figure 4V:
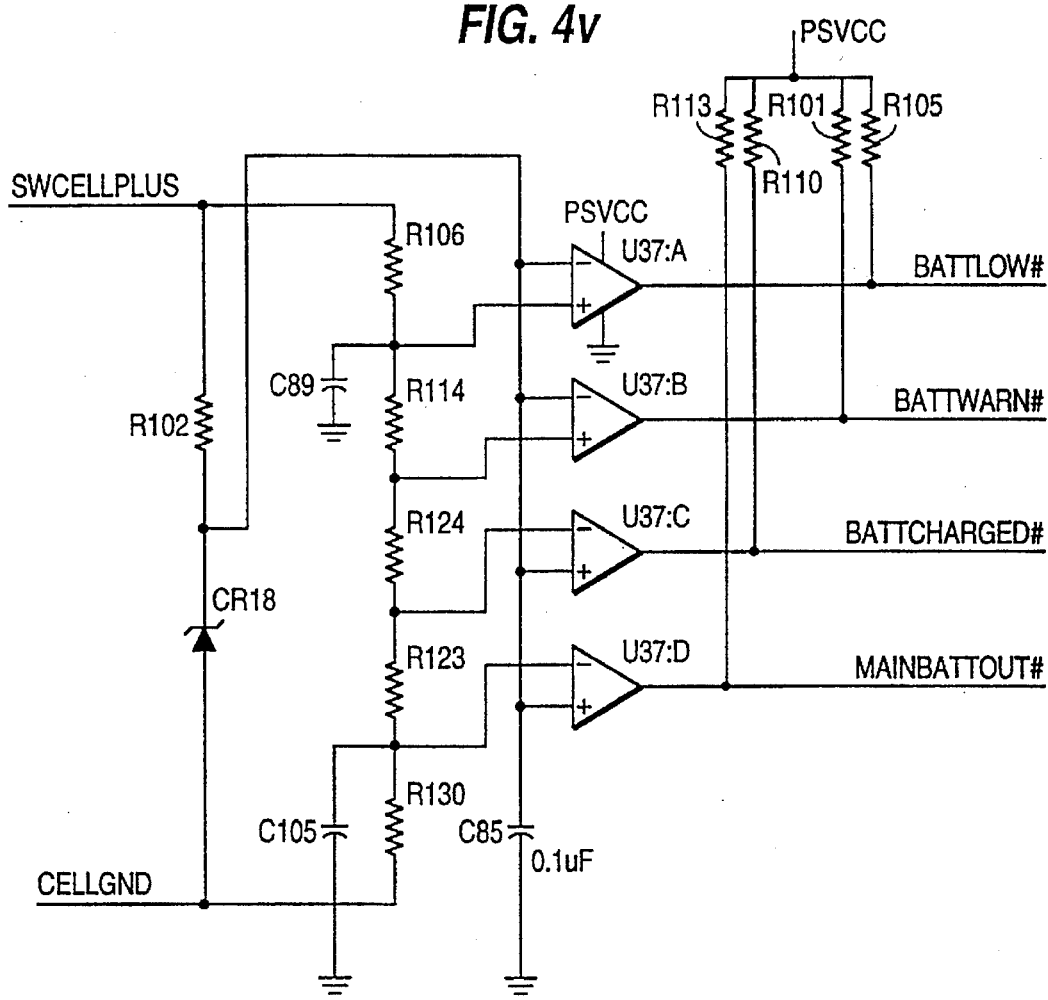
FIG. 4v is a schematic diagram of the battery state detection circuit that is housed in the power supply in the motherboard according to the invention.
Figure 4W:
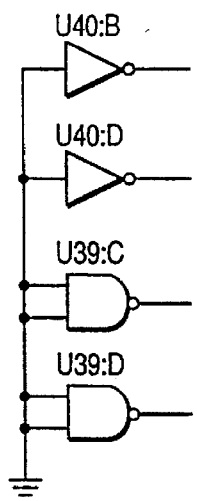
FIG. 4w is a schematic diagram of the spare components in the power supply that is housed in the power supply in the motherboard according to the invention.
Figure 4X:
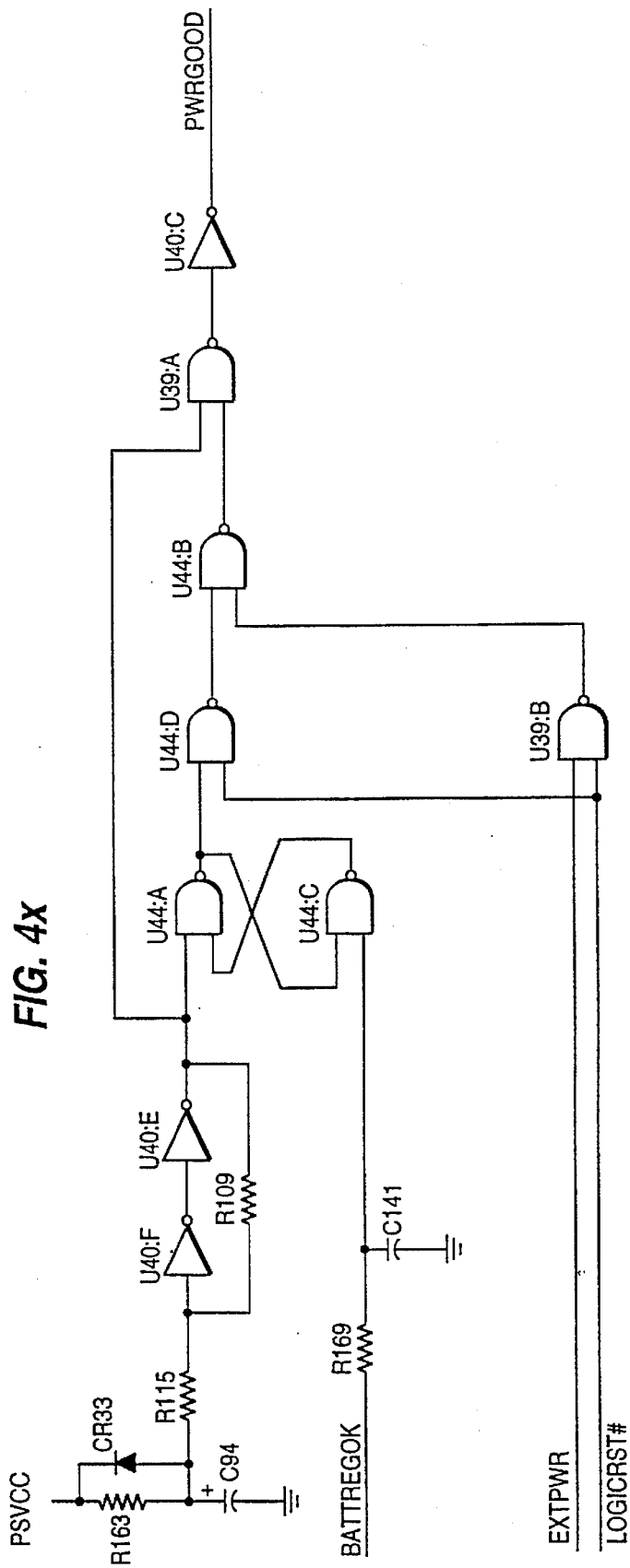
FIG. 4x is a schematic diagram of the reset signal generation circuit that is housed in the power supply in the motherboard according to the invention.

In the embodiment of the motherboard 300 as illustrated in FIGS. 4a through 4x, all configuration of the SCAMP II registers is performed by code in the BIOS source file stored in the BIOS ROMs 308A, 308B. Since the boot block code must at least partially set up the system to provide for the possibility of having to upload a new BIOS in case of a damaged BIOS, much of the SCAMP II setup is repeated in the boot block file.

The SCAMP II chip registers include the standard registers at standard I/O locations to support the traditional PC AT components such as the DMA and programmable interrupt controllers. These are well documented in the VLSI literature. Extension registers are provide for configuration and control of non-standard features of the SCAMP II chip 328, such as the memory controller, power management, clock controls, etc. These extension registers are indexed, and are accessible at I/O address 0EDh after setting the index register at I/O address 0ECh. All indexed registers are one byte wide. Since the extension registers are non-standard and improper use can cause unusual system operation or a system crash, the VLSI chip allows the locking of the indexed register area by any write to the I/O location 0F9h. The registers are unlocked by writing to I/O address 0FBh.

A few other registers are implemented by the SCAMP II chip 328 that are used on some newer PC's, and that reside in normal I/O space (i.e., not indexed). These include control of a faster A20 gate, a fast CPU reset, numeric coprocessor resets, and a CPU speed control. The fast A20 gate and fast CPU reset controls are also available at the PS/2 standard I/O port location 092h.

While many of the registers have a fixed configuration for the illustrated embodiment, others are dynamically determined by the BIOS at boot time based on the system configuration. The registers are used, for instance, to determine the amount of available DRAM memory during boot-up and then are set accordingly. Other settings that may need to change depending on configuration are the various clock divider settings. The ISA bus clock and wait states for the various types of cycles are set in the SCAMP II chip 328, for example, and the clock is generated by a combination of source selections and programmable dividers. If the source is the CPU clock and that is changed, then the divider may need to change to keep the ISA bus 202 within an acceptable range. The illustrated system may be run with a bus clock in the range of 8 to 10 MHz. For example if the CPU is at 20 MHz, the CLK2 frequency is 40 MHz, and the SCAMP II chip 328 would be set to divide CLK2 by 4 for a SYSCLK speed of 10 MHz.

Standard PCs include two 82C37A DMA controller chips combined with a 74LS612. All of this logic is emulated in the SCAMP II chip 328. The DMA circuits provide for the transfer of data between (to or from) an I/O port address and a block of memory without any involvement of the processor 324 in the transfer. The DMA controllers become temporary bus masters, placing the appropriate addresses on the bus and generating the control signals. While the 82C37 chips are capable of being wired and configured to perform memory to memory transfers as well, the PC AT design standard does not permit this, and the SCAMP II chip 328 adheres to this standard. DMA is usually used to read or write a stream of data from a single I/O address of a disk or tape controller, or a data gathering expansion card, to or from a memory buffer.

The DMA controllers include address latches for setting the medium address bits, while the 74LS612 sets the upper address bits of the target memory area. Counters then automatically step through this page during the transfer operation.

The PC AT standard, as implemented in the shown embodiment, provides for seven DMA channels. Channels 0 through 3 are 8 bits wide, while channels 5 through 7 are 16 bits wide. Channel 4 is unusable since it is dedicated to the cascade of the 8 bit DMA controller (channels 0-3) into the second (16 bit) DMA controller. Channel 2 is reserved for the floppy disk controller, if used. Channel 7 is reserved for the optional hard disk. All other channels are free to be used by the I/O modules connected to the module slots 201 and 203. An example of the channel assignments are shown below:

| Channel | Bits | Assignment |
|---------|------|------------|
| 0 | 8 | ** Available ** |
| 1 | 8 | ** Available ** |
| 2 | 8 | Floppy Disk |
| 3 | 8 | ** Available ** |
| 4 | 16 | Cascade for 0–3 (Internal) |
| 5 | 16 | ** Available ** |
| 6 | 16 | ** Available ** |
| 7 | 16 | Hard Disk |

DMA transfers are requested by hardware through the DRQ line 424 for that channel. These seven lines go directly into the SCAMP II system controller 328 from the system bus 320. The DMA controllers grant the request and start the transfer by lowering the corresponding DACK acknowledgement line 462. In order to reduce pin count on the device, VLSI multiplexed the DMA acknowledgement signals DACK#0–DACK#7 462 through the W/R#, D/C#, and M/IO# output pins. When the DKEN pin 416 is high, then an external 3 to 8 demultiplexer chip 464, a 74HCT138, is activated to decode the three lines and provide the proper DACK# acknowledgement. This is possible since only one DMA channel may be granted at a time, and since the processor 324 would be off of the bus and would not have a need to drive these three lines to the SCAMP II chip 328.

The 16 bit DMA transfers (channels 5–7) require that the address be divided by two (A0=0) and that the word count is the number of 16 bit words not 8 bit bytes that are to be transferred. Eight bit DMA operations use the byte address and count.

The DMA controllers are properly configured to the PC standard and initialized by the BIOS during system boot. Software running on the system must provide further configuration for DMA's to be used for a specific purpose.

The VLSI SCAMP II chip 328 also includes the equivalent of the two 82C59A interrupt controllers of the AT standard to provide a total of 16 prioritized hardware interrupts which are then delivered to the CPU through the INTR line. The interrupt assignments for the embodiment of FIGS. 4a through 4x are shown in the following table:

| Interrupt Level | Assignment |
|-----------------|------------|
| 0 | Timers (Internal) |
| 1 | Keyboard (internal) |
| 2 | Cascade IRQ8-15 |
| 3 | Normally COM2, COM3 |
| 4 | Normally COM1, COM4 |
| 5 | non MDA LPT (LPT1) |
| 6 | Floppy Disk |
| 7 | MDA LPT (not used) |
| 8 | Real Time Clock (internal) |
| 9 | VGA Vsync (jumper option, not normally used) |
| 10 | ** Available ** |
| 11 | ** Available ** |
| 12 | PS/2 Mouse |
| 13 | 80387 Coprocessor (option) |
| 14 | Hard Disk |
| 15 | ** Available ** |

The interrupt controllers allow for individual interrupts to be masked (disabled). If an interrupt is not masked when it occurs, the SCAMP II chip 328 will generate an INTR signal 425 to the processor 324, determine the priority if multiple interrupts are pending, and supply the appropriate interrupt vector to the processor 324 across the data bus 330.

The interrupt controllers are properly configured to the PC standard by the BIOS during system boot. The BIOS also takes care of most of the interrupt servicing of standard devices such as the Real Time Clock, timers, and disks. Software implemented on the system may take over the control of the mask and trigger resetting of individual interrupts as required.

A special feature of the SCAMP II chip 328 used by the instant system 100 provides deglitching of the interrupt lines. IRQ signals 466 must remain stable for longer than 105 nanoseconds to be recognized and considered valid.

The system controller 328 also includes a DRAM controller (not shown in FIG. 4b) which can be configured to support a wide range of DRAM types for a total system memory size of between 512 KB to 16 MB. Static RAM (SRAM) is not supported by the VLSI chip, but several configuration options allow reduced power with certain types of DRAM such as those that support self-refresh. Details of the configuration registers for the DRAM controller are found in the SCAMP II data manual, as well as the VLSI application note "Interfacing System DRAM to SCAMP II Controller" (document #295312-001).

The DRAM controller (internal to the SCAMP II chip 328) is capable of controlling up to a maximum of four banks, and all banks must be 16 bits. Parity generation and checking is optional. If parity is used, the banks will be 18 bits wide, since parity is generated for each individual byte. In the system 100, only two banks of two 30 pin SIMMs (single inline memory modules) each, and is limited to SIMM modules of 1M×8, 1M×9, 4M×8 or 4M×9, is used as the system memory 310. The DRAM memory 310 is shown in greater detail in FIG. 4d, and is shown as a first bank 310A of 8 Mbytes and a second bank 310B of 8 Mbytes. If two banks are stuffed, the SIMM module types must all match. This limits the total memory configurations to 2M, 4M, 8M or 16M. While finer granularity on the choice of total memory is possible, it requires four banks or eight total SIMM slots for which there is inadequate room in the area of the motherboard 300 as implemented on the system 100 which has enough headroom clearance under the display for the vertical SIMMs. The system 100 can be built without parity to lower cost. Eliminating the parity bit has become more common on computer-based systems in the last few years as the reliability of DRAM and the thorough memory check during system boot has greatly reduced the incidence of errors. All of the main system memory 310 options support shadowing, expanded and extended memory features.

The speed specifications of the DRAMs combined with their operating mode (paged or normal) and the processor 324 speed determine whether wait states are required or not. The SCAMP II system controller 328 is capable of inserting 0, 1, or 2 wait states into memory accesses. Performance is improved with the use of page mode DRAMs by reducing the number of wait states when a sequence of memory accesses are in the same page.

When both banks of the system memory 310 are populated, interleaving is enabled which swaps the memory accesses between banks on 1K boundaries rather than using a linear mapping. When combined with page mode operation, this has the effect of doubling the effective page size since the other bank's CAS line 425 can be pre-charging while the first is being accessed. Thus, 4M and 16M systems are generally faster than 2M or 8M systems.

The SCAMP II system controller 328 is capable of driving the memory address lines 360 with one of two different drive levels, depending on the capacitance of the system memory 310 configuration. Since the system 100 is designed for only two banks 310A, 310B with a total of 4 SIMMs, the lower drive level is used (configured by the BIOS) in order to reduce power.

The SCAMP II system controller 328 supports several speeds and modes of DRAM refresh to reduce power during suspend operations. If a suspend mode is not to be implemented, the DRAM controller can be configured to provide a standard AT refresh period of 15.625 microseconds. The DRAM controller accesses the system memory 310 without the processor 324, thereby refreshing that section of the DRAM 310, through hold cycles similar to DMA where the processor 324 gives up the bus so the refresh controller can drive the address lines. Address counters rotate sequentially through the memory so that the complete system memory 310 is refreshed every 4 milliseconds.

The system bus includes the ISA bus standard signal REFRESH# 427, and the SA0-SA7 and MEMR# 474 are driven to support the automatic refresh DRAM of any I/O module connected to the slots 201, 203 or expansion module connected to the expansion connector 205 as desired. This does not interfere with the refresh of on-board DRAMs of memory 310 since their data would be driven onto the local D0-D15 bus 330, not the ISA SD0-SD15 data bus 202, 204, and therefore does not present a conflict. Refresh mode configuration bits are stored in a register (not shown) and are set in a BIOS source file.

The SCAMP II system controller 328 generates the ISA bus control signals IOR# 478, IOW# 480, MEMR# 474, MEMW# 472, SMEMR# 470, SMEMW# 468, and BALE 476. It also drives the bus REFRESH# line 427 during refresh and the MASTER# line 408 during external bus master operations. It controls the timing of the bus cycles according to the configuration settings as well as input from the MEMCS16# 484, IOCS16# 482, IOCHRDY 486, and ZEROWS# 430 signals from the bus.

There are four basic types of ISA bus cycles that have configurable timing options, 8 bit I/O, 8 bit memory, 16 bit I/O, and 16 bit memory. For each type, the command signal (IOR# 478 or IOW# 480 in the case of I/O cycles, MEMR# 474 or MEMW# 472 in the case of memory cycles) may be set for one of two different standard wait states for that type of cycle, and one of two starting times of the command signal (normal and delayed) measured in SYSCLK 429 (the ISA bus clock) periods.

Standard cycles may be shortened by fast devices that can pull the ZEROWS# line 430 low early enough in the cycle. Conversely, slow devices (memory or I/O) may extend the standard cycles by pulling the IOCHRDY line 428 low before the last normal wait cycle and holding it low until they are ready.

It is noted that the ISA bus clock, SYSCLK 429, sometimes skips cycles. While the edges are at predictable places if they occur, they do not always occur. A half period (low or high) of the clock may stretch to the next edge at times to synchronize with other signals. This phenomenon occurs with standard PCs as well as the disclosed system. As a result, and due to the fact that the clock speed is subject to change by reconfiguring of the SCAMP II system controller 328, or changes in the clock source such as the processor clock, the SYSCLK 429 is not be used for driving timers. The BUSOSC signal 488 is available on the system bus for timing purposes.

The system 100 utilizes PC standard device decoding and other address decoding internal to the SCAMP II system controller 328, VGA and Super I/O chips 342. In addition, the system 100 requires additional unique address decodes. The address decoder 368 is illustrated in FIG. 4m, and generates four decodes, one I/O and three memory address ranges.

The system registers, an 8 bit read and 8 bit write register at the same address, are decoded as binary address xxxx xx11 1000 0xxx, where xs represent "don't care" bits. The registers thus respond to any of the I/O addresses in the range of 380h-387h. This decoding is ambiguous in the upper address bits A10-A15, compatible with the original PC which defined the I/O space as being limited to 1K, and thus used I/O addresses that were only 10 bits long. Most newer I/O cards provide full 16 bit decoding of I/O addresses, so that addresses like the system's 380h doesn't also show up in the memory map at 780h, B80h, 1380h, etc. The VLSI SCAMP II system controller 328, for instance, provides the option of 10 bit (original PC) or full 16 bit decode of all I/O address decoding that it generates. The system register can be implemented with only 10 bit decoding to save costs unless more bits are needed.

The BIOS is held in a 128K Flash ROM 308A shown in detail in FIGS. 4e and 4f, that is decoded by the VLSI SCAMP II system controller 328 to appear in the lower 1M of the system address space. The second 128K Flash ROM 308B is supported and is decoded at memory address range FC0000-FDFFFFh (110x xxxx xxxx xxxx xxxx) near the top of physical memory.

FIG. 4g shows the connector 920 that is used in the backplane connector 313 of FIG. 3. The connector 920 is used to connect the motherboard 300 to the backplane board 311.

FIG. 4h shows the connector 922 that is used for the IDE hard disk interface 306 of FIG. 3.

The two I/O module slots 201, 203 of the system 100 have their own slot select lines, CARD1EN# 821 and CARD2EN# 822 (see FIG. 8a), to provide decoding for dual port RAMs or on-board ROMs in the modules as more fully described below. These select lines are decoded as 64k memory blocks at FA0000-FAFFFFh and FB0000-FBFFFFh.

Since the secondary Flash ROM 308B and the two I/O module slot decode areas overlap with DRAM if the system 100 has the maximum of 16M of DRAM installed, special configuration is needed to make these areas readable. The SCAMP II chip 328 insures that there is no bus contention by either enabling the DRAM to the CPU data bus, or routing the ISA data bus SD0-SD15 202 through to data bus 330 used by the processor 324, but never both at once. During boot-up, the BIOS configures the chip, through the slot pointer register SLTPTR (not shown), to open a window of 384k at the top of system address space, thus making the I/O module slots 201, 203 and extra Flash ROM 308B visible to the system 100 at the expense of reporting 384k less DRAM on a 16M system memory 310. Software running on the system 100 can use the SLTPTR to open and close (or resize) this window to access a "hidden" area of DRAM or to protect memory in the I/O module.

To provide for control and monitoring of the system specific hardware, an 8 bit register (not shown) has been implemented. This single register is accessible at any I/O address in the range of 380h to 387h (i.e., the register is partially decoded as xxxx xx11 1000 0xxx). Additional registers could be used and a single address, 380h, can be used to access the first register to provide for the use of the other addresses in this range for the other registers. Any I/O read from this address returns 8 status bits, while any I/O write to this address will write to the 8 data latches which drive the corresponding 8 control lines. Since the output latches cannot be read back, the BIOS maintains a variable to mirror the state of the output latches to allow application software to read the current state in order to modify individual bits of the control register while leaving the others intact.

As seen in FIG. 4n, the control register 336 is implemented with a pair of 4 bit latches 490A, 490B. These latches are chosen, rather than a single 8 bit latch, because of their #CLR pin which allows the latches to be set to a known initial state by the system reset signal RESETDRV#. The latches 490A, 490B have complementary outputs, and in this case all of the output signals are driven by the negative logic output. Thus all of the output lines are initialized to a logic high on reset. Software which manipulates this register can invert the desired logic levels to compensate for the use of the inverting output pins. The system BIOS functions which support the system output register make all of this transparent to the calling function.

The function of the 8 bits of the control register 336 are as follows:

Bit 0—BIOSPWD# 491—Writing a 1 (lowering the output) will power down the main BIOS boot block Flash ROM chip 308A for a small power savings. The optional second Flash ROM 30SB is not affected, since it is not intended to be a boot block type part and would not have a power down pin.

Bit 1—ALLOWBIOSW# 492—Setting this bit to a 1 (lowering the output) is required to enable writes to the Flash ROM memory chips. Both chips always have the required 12V supply for programming and erasure, so this control line serves as a write protect or enable. Writes are initially disabled on system reset.

Bit 2—PWRDNCARD1 493—This bit controls the module specific power down line for the first slot 201. A module card may or may not implement this function. If implemented, the module is expected to power down some or all of it's circuitry when this line (206B, FIG. 2a) is high (the bit is set to 0), and be fully powered up when the line 206 B is low (the bit is set to 1).

Bit 3—PWRDNCARD2 494—This bit has the same functionality as the previous bit, except that it controls the second slot 203.

Bit 4—RESETCARD1 495—This bit controls the module specific reset line 206B for the system slot 201. A module card may or may not implement this function. If implemented, the module is expected to be in a reset state when this line 206B is high (the bit is set to 0), and release from reset when the line 206B is low (the bit is set to 1).

Bit 5—RESETCARD2 496—This bit has the same functionality as the previous bit, except that it controls system slot 203.

Bit 6—CPUCLKSEL0 (or FASTCLK/SLOWCLK#) 497—This bit is one of two used to control the clock synthesizer 334 speed selection, subject to the limitations of the processor and bus speed limits. The initial speed setting upon reset is 25 MHz. Four different CPU speeds are available as follows:

| CPUCLKSEL1 | CPUCLKSEL0 | CPUCLK |
|---|---|---|
| 0 | 0 | 20 MHz |
| 0 | 1 | 16 MHz |
| 1 | 0 | 33.33 MHz |
| 1 | 1 | 25 MHz |

Bit 7—CPUCLKSEL1 (or PIPELINE#) 498—This CPU line is hardwired, and any pipeline control is done through an internal register of the processor 324. This bit is used as one of two that select the processor clock speed as detailed in the bit above.

The system status register is simply an octal buffer which allows the processor 324 to read the following signal lines:

Bit 0 and 1—EXTPWR 701—Both of these pins are tied to the EXTPWR line which is high whenever external power is detected, and low when running off of the rechargeable battery.

Bit 2—BATTWARN# 702—This bit will be 0 when the rechargeable battery voltage reads low, indicating that a short amount of time is left before the system shuts down due to lack of battery power.

Bit 3—OVERVOLTAGE 703—The power supply 5 V switcher section is designed to operate with a supply input voltage in the range of 8 V to 32 V. If the voltage goes above this range, damage could occur to the power supply components, or at the very least, the supply will not be operating within its design parameters, and thus may not maintain the output voltage within regulation and ripple requirements. This status bit indicates when the power supply is seeing above approximately 33 V. The BIOS allows this bit to be read easily, but leaves the responsibility for alerting the user to higher level application software.

Bit 4—MAINBATTOUT# 704—This bit goes low when the main (rechargeable) battery is removed from the system, assuming of course that external power is still available to keep the system running without the battery.

Bit 5—CELLTEMPOK 705—Battery charging is inhibited when the system 100 is running to prevent the overheating that could occur from simultaneous system operation and charging functions. Nonetheless, this bit indicates whether the rechargeable battery temperature is in the range (neither too high nor too low) where charging would be allowed if the system were not running.

Bit 6—BATTCHARGED# 706—This bit goes low when the battery reading above approximately 5.9 V (1.18 V/cell), indicating a full or nearly full charge.

Bit 7—BATTCHARGING 707—As mentioned in the description for bit 5 above, the charge function is inhibited during system operation. This bit should therefore always read low (false) when the system is running. Alternatively the system 100 may allow simultaneous system operation and charging, so this bit is reserved for monitoring the charger status.

Referring again to FIG. 3, the system 100 provides connections at the back of the system 100 for standard PC ports including parallel 318, serial 312, keyboard 338, and mouse 340, as well as an RS-485 link 314. The detailed circuitry related to these connectors and their local interface and drive circuitry are illustrated in FIGS. 4i through 4l. The higher level controllers are contained in the Super I/O chip 342 illustrated in detail in FIG. 4c (for the serial 312, 314 and parallel 316 ports) and the VLSI SCAMP II system controller 328 (for the keyboard 338 and mouse 340).

FIG. 4i shows the component ADM239L 430 and the connector 930 that are used in the RS-232 serial port 312 of FIG. 3. FIG. 4j shows the component LTC485CS8 435 and various other elements that are used in the RS-485 serial port 314 of FIG. 3. FIG. 4k shows the connector D825F 940 that is used in the parallel printer port 318 of FIG. 3. FIG. 4l shows the connector IDC10M 950 that is used to connect the keyboard port 338, the mouse port 340 and the RS-485 serial port 314 to the female DB-9 port of FIG. 3.

An RS-232 connector 344 (a male DB-9) is provided with the PC-AT standard pinout and connected to the serial port 312. The details of this port are shown in FIG. 4i. The DB-9 connector 344 is mounted to the backplate of the system 100 above an optional CRT connector 354. The signals may be brought down to the motherboard with a short ribbon cable to a 2×5 0.100" pitch header. The signals are arranged on the dual row header to allow standard IDC type connectors on both ends of the ribbon connector for ease of assembly.

By way of example, the proper RS-232 standard +12 V and −12 V signal levels are sent and received by an Analog Devices ADM239L 430 as illustrated in FIG. 4i. This chip 430 is supplied with the +12 V supply from the main system power supply, and generates the −12 V with a charge pump that relies on two 1.0 microfarad polarized capacitors 431, 432 between pins C+, C−, V− (which should regulate to −12 V) and ground. Note that the polarity of the capacitors 431, 432 is important to prevent reverse bias, and that the polarity may seem unusual at first glance since the one between V− and ground has the positive end at ground (which is higher than V−). Note also that the capacitors 431, 432 are specified at a 16 V minimum to be able to handle the −12 V level.

As illustrated in FIG. 3, to reduce the cost, and size required to supply connections for the RS-485 link, the external keyboard and mouse, all three ports 338, 340, 314 are combined in the system into one female DB-9 connector 348. The RS-232 port 312 uses a male DB-9 344, so they cannot be accidentally confused. The combination of the keyboard 338, mouse 340 and RS-485 314 ports requires an adapter cable to provide the standard mini-DIN connectors used for external keyboard and mouse devices on laptop and PS/2 computers. This can be done since the external keyboard and mouse connections would be used primarily for development purposes or in a docking station which could easily have the required adapter already wired to a local mouse and keyboard. Further, the DB-9 connector 348 is a less fragile connection, and requires only a single plug rather than two or three when attaching to the docking station. The details of these port connections are illustrated in FIGS. 4i and 4l.

The female DB-9 connector is mounted to the system backplate above the parallel port connector 346, and connected to the motherboard with a ribbon cable to a 2×5 0.100" center dual row header in a similar fashion to the RS-232 port.

Although the system 100 includes an integral keypad 106 (see FIG. 1) and keypad adapter 310 that sends PC keyboard compatible codes to the motherboard's keyboard interface 322, there are cases such as development and testing where a full size PC keyboard may be desired. The system's 100 external keyboard interface 338, 348 provides connectivity to a standard XT or AT style keyboard. An adapter cable is required to provide the proper socket for the keyboard (5 pin DIN or 6 pin mini-DIN as needed to match the particular keyboard). The keyboard clock (BKBDCLK) 434, keyboard data (BKBDDATA), 433 (see FIG. 4l), ground and power (to power the external keyboard) lines are all that is needed for the keyboard interface. The clock and data lines are routed through the internal keypad controller board which multiplexes its own signals in with the external signals as described more fully below. The XT/AT and PS/2 standard pinouts are shown in the tables below:

| Pin | PS/2 (Mini-DIN) Signal |
|---|---|
| 1 | Keyboard Data |
| 2 | NC (reserved) |
| 3 | Ground |
| 4 | +5 Volts |
| 5 | Keyboard Clock |
| 6 | NC (reserved) |

| Pin | XT/AT (DIN) Signal |
|---|---|
| 1 | Keyboard Clock |
| 2 | Keyboard Data |
| 3 | NC (reserved) (Reset # on XT) |
| 4 | Ground |
| 5 | +5 Volts |

Since the system 100 is powering the external keyboard, battery life will be affected depending on the power requirements of the keyboard. A separate power supply could be implemented from the docking station.

Figure 5A:
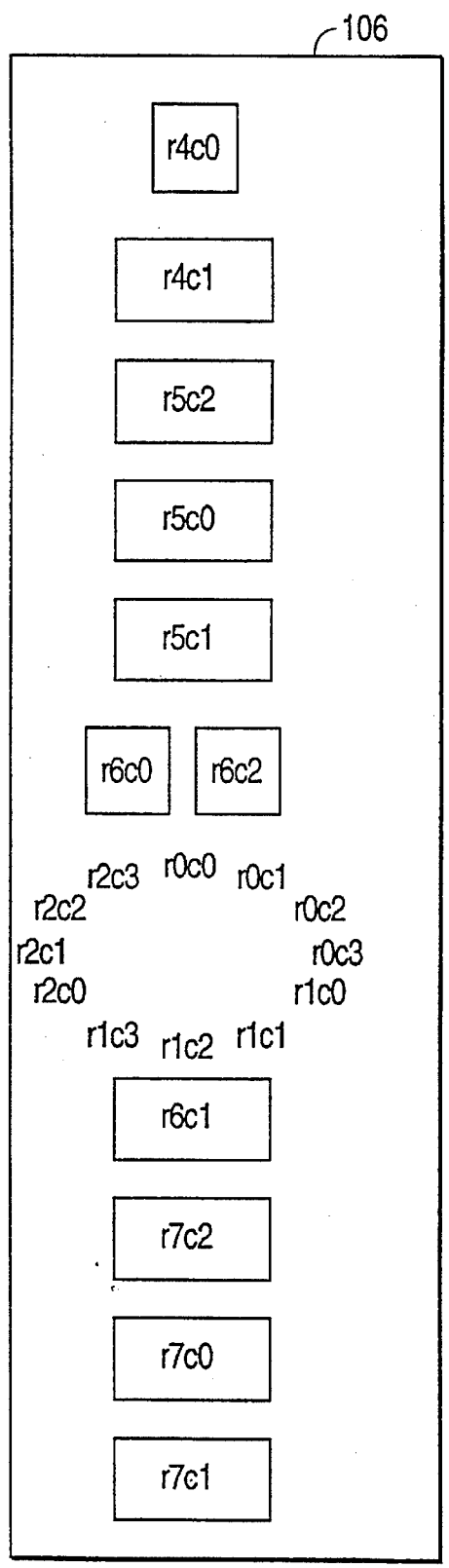
FIG. 5a is a diagram of a keypad that can be attached to the system according to the invention.

Since the BIOS talks to and initializes the internal keypad controller during the boot up process, it is not necessary to have an external keyboard attached during boot-up operation to avoid error messages, as required by most personal computers. FIG. 5a illustrates a layout for the keypad 106 and an internal keypad scanner and MUX control 511 for the external keyboard and PS/2 mouse. Thus, the external keyboard may be attached at any time before or after system boot.

IBM PS/2 computers and most laptop machines include a 6 pin mini-DIN connector for an optional external mouse. The external mouse must talk over a clock and data line interface in the same way as the keyboard does, as opposed to older mouse interface designs using standard serial ports or bus card interfaces. Like the keypad and keyboard support, the system 100 includes a cursor control pad that takes the place of a two button mouse, but also allows an external PS/2 interface mouse to be used. An adapter cable is required by the system to route the BMOUSECLK and BMOUSEDATA lines 513, 515 to a mini-DIN connector, along with power and ground to supply power to the mouse. The proper connections are shown in the table below:

| Pin | PS/2 (Mini-DIN) Signal |
|---|---|
| 1 | Mouse Data |
| 2 | NC (reserved) |
| 3 | Ground |
| 4 | +5 Volts |
| 5 | Mouse Clock |
| 6 | NC (reserved) |

The system 100 includes an RS-485 port 314 to support future peripherals and to interface some existing devices and systems already in use in the diagnostics market. This is a multidrop (party line) serial interface using two complementary signal lines. All devices on the line that are capable of sending (some devices may only listen) should be able to tri-state (float) their outputs to allow other devices to talk on the same lines at times, and should withstand a collision (two or more devices trying to "talk" by driving the line at the same time) without damage to the drivers.

The system's RS-485 interface, illustrated in FIG. 4j, is implemented with a Linear Technologies LTC485CS8 device 435 that supports both sending and receiving. The device 435 is wired with the RE# (receive enable, active low) grounded to always enable listening to the line with the COMBRXD serial port input 436 at the second UART in the Super I/O chip 342. Sending is enabled by lowering the RS485DE# line 437 which is driven by the Super I/O's second UART RTS# line. The output data COMBTXD 438 comes from the second UART serial output line of the Super I/O chip 342. Thus, the RS-485 link is controlled by only three pins of the second UART, leaving the other pins that are normally required for an RS-232 port to be used for other purposes.

An RS-485 system is designed to have a characteristic cable impedance and matching terminations. A common termination is a simple resistor across the two wires of the interface, but this would draw a steady current whenever a driver was active. The illustrated system uses a 120 ohm resistor 439 in series with a 0.01 microfarad capacitor 440 for termination. This provides the correct impedance to transient signals, but an open circuit to DC voltages to reduce power.

The RS-485 link includes 100K pull-up and pull-down resistors 441A, 441B at the A and B# lines, respectively. This is used to insure that the line always "idles" at a logic "1" state when no devices are driving the link, rather than just floating to an indeterminate state.

The placement of the two RS-485 signal pins in the DB-9 connector follows no particular standard. Typically any using of this port requires custom cabling. The interface looks basically like a standard RS-232 COM port, except that not all the input and output handshaking lines are used, and the fact that the software must check for collisions before assuming that it has ownership of the line and can start sending safely.

A PC-AT standard female DB-25 connector 346 is connect to the parallel port 316. This provides for parallel port connection for external printers and other parallel port devices such as external disks, tape systems, network interfaces, etc. The front end 377 of the port circuit, illustrated in FIG. 4k, provides RF noise filtering and rudimentary electrostatic discharge protection with an RC filter on each of the output lines. The AT standard DB-25 connector pinout provides several ground pins for plenty of ground returns in the cabling to lower the amount of crosstalk in the cable, which typically caries much higher speed signals than serial cables.

The parallel port interface to the ISA bus 202 is provided by the Super I/O chip 342. This is implemented as the new bidirectional standard, enabling faster bidirectional transfers than the traditional bidirectional transfers that were accomplished by sending a few bits back across the printer status input lines (such as the standard Interlink cables). Proper cabling and driver or application software is required to take advantage of this performance improvement, in addition to the support on the other end by the external device.

The Super I/O chip 342 may be implemented with a chip produced by National Semiconductor, PC87311 or PC87312 as illustrated in FIG. 4c. These chips have an integral floppy disk controller (not shown). All that is needed to support standard 3.5" (720K and 1.44M) and 5.25" (360K and 1.2M) floppy drives is the floppy data and power connectors, a few pull-up resistors, and a filtered analog 5 V supply. The motherboard 300 includes all of the pads and traces to support a floppy drive. A floppy port 318 can then be connected to a floppy drive 352 if desired.

As described above in relation to the combination keyboard/mouse/RS-485 port connector 348, the system 100 includes a built-in keypad 106 connected to the keypad adapter board 301. The keypad 106 produces standard PC compatible scan codes that the motherboard's standard PC keyboard interface would understand. A keypad controller resides on the keypad adapter (daughter) board 301. The keypad adapter port 322 has connector pins that allow for all of the keyboard and mouse clock and data lines from the keyboard controller in the VLSI SCAMP II system controller 328 to pass through the keypad adapter circuitry 303 before returning to the motherboard 300 and on to the connector at the rear of the system 100 for external keyboard and/or mouse connections.

Figure 5B:
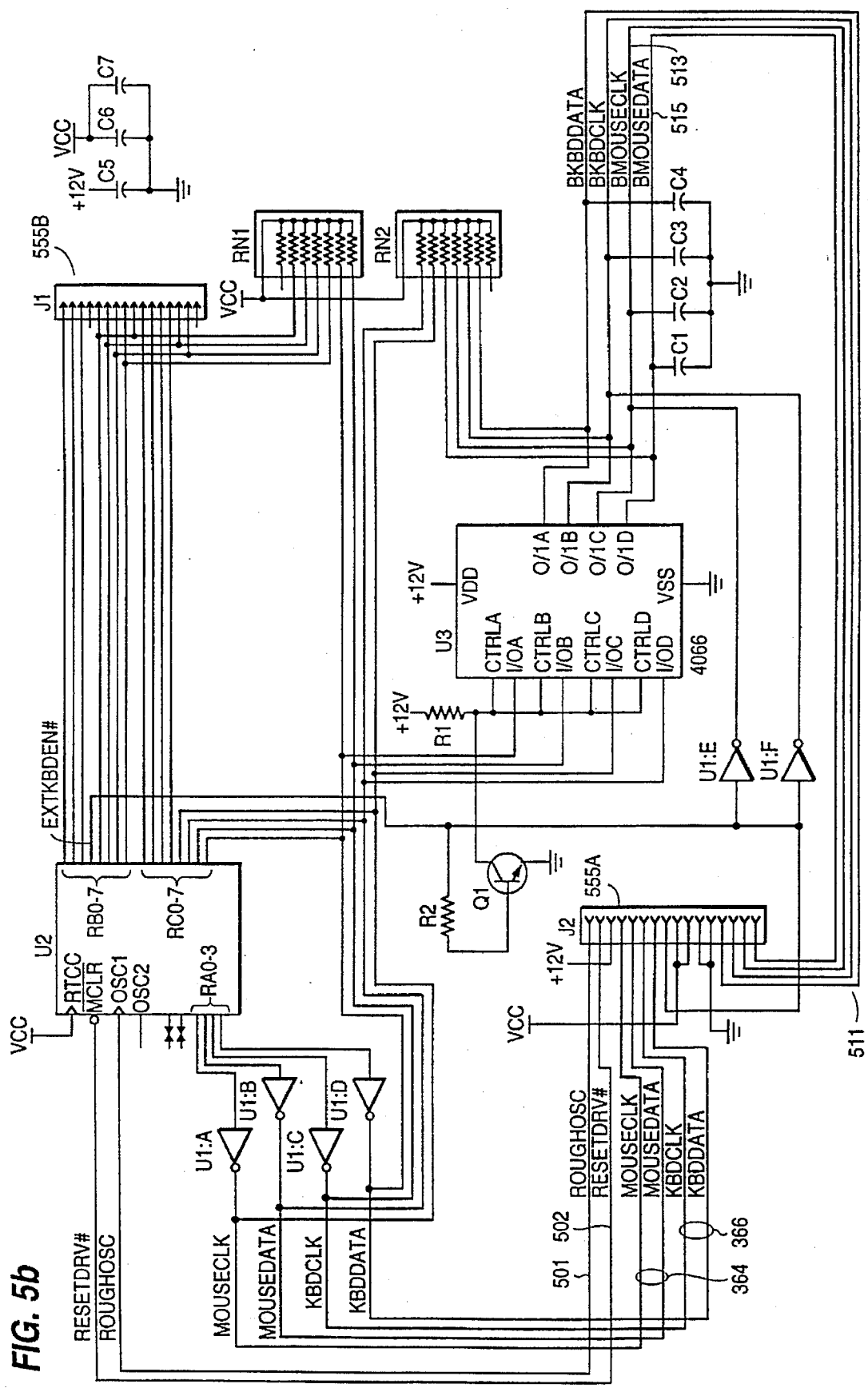
FIG. 5b is a schematic diagram of the internal keypad scanner and MUX control that is housed in the keypad adapter board according to the invention.

This arrangement makes it possible for the daughterboard to allow the mouse or keyboard connections to pass through unchanged, or to multiplex in any signals generated locally. The multiplexing may be accomplished by several means, including switching or by passing all signals through a microprocessor which would buffer and merge the local and external signals before resending. The keyboard and mouse clock/data pairs 364, 366 may be dealt with separately. For example, a system could be built with no local mouse emulation that relies on an external mouse or other pointing device connection but does multiplex an internal keypad with an external standard keyboard. FIGS. 5a and 5b provide a detailed illustration of the keypad layout and associated circuitry.

The clock and data lines have pull-up resistors on the SCAMP II side to insure proper termination of these open collector lines, regardless of whether the termination is supplied on the keypad daughterboard and whether it actually exists. On the clock and data lines running on the motherboard 300 between the keypad controller card 301 and the rear connector 338, 340 for the external keyboard and mouse support, low-capacitance capacitors (e.g., 27 pf) are placed close to the rear port connector to reduce the escape of RF emissions through the connector to the outside world on the keyboard or mouse cabling, as illustrated in FIG. 5b.

In addition to the eight clock and data lines in and out of the board, the motherboard 300 also delivers ROUGHOSC 501 and RESETDRV# 502 as well as power (both 5 V and +12 V) and ground. The keypad controller card circuit should drive the KPDACTIVE return line to indicate keyboard activity. When raised, KPDACTIVE tells the VGA/LCD controller chip that a key has been pressed. If configured for this feature, the VGA controller chip may use this to reset timers used for automatic powerdown of the LCD screen backlight and/or display. Typically, the algorithm is used to shut down portions of the display circuitry when no keyboard activity has been seen for some period of time, and to reactivate the display as soon as a key is pressed.

The ROUGHOSC signal 501 is intended as a possible clock source for the daughterboard processor, saving the cost of a local crystal or oscillator on the daughterboard. The impedance mismatch at the connector 555A, and the fact that the clock signal travels on one of the connector pins that is to the outside of the right angle board edge connectors and thus is raised a bit off the boards, and is also on the corner of the connector 555A (pin 1) without grounding on both sides, means that the connector beams RF energy generated by the edges of the clock.

The RESETDRV# signal 502 is the system wide and bus reset signal. It is intended to be used as the primary reset for the circuitry on the keypad daughterboard 301. A local power on reset may also be used, but the board should respond to the RESETDRV# signal 502 as well, since it may be generated by events other than power on. The system 100 uses a 16 pin dual row right angle connector pair 555A, 555B for mating the motherboard 300 and keypad controller 301 side by side on the same plane.

The system 100 incorporates some type of VGA compatible 640×480 pixel liquid crystal display (LCD). Flexibility in the choice of the panel type and size can be achieved by using the Cirrus Logic CL-GD62xx chip family as the display controller 302 as illustrated in FIG. 4p. This chip family supports monochrome (grey-scale), passive color, active matrix color (Thin Film Transistor or TFT), and the newer dual-scan color display panels. The motherboard 300 is designed to use any of the three chips from this family. The appropriate chip can be selected as shown in the table below.

| Chip Type | Monochrome | TFT Active Matrix | Passive Color | Dual Scan Color |
|---|---|---|---|---|
| Cl-GD6205 | ✓ | ✓ | | |
| Cl-GD6225 | ✓ | ✓ | ✓ | |
| Cl-GD6235 | ✓ | ✓ | ✓ | ✓ |

The system 100 also supports an external CRT at a variety of standard super-VGA resolutions including up to 1024× 768. The display controller 302 is able to drive an LCD panel and CRT simultaneously in VGA (640×480) or EGA (640×350) resolutions respectively connected to the connectors 356 and 354. LCD and CRT only modes are also available to reduce power and (in the case of CRT only mode) provide a wider range of available resolutions and scan rates. FIG. 4q shows spare logic circuits and bypass capacitors that are housed in the motherboard 300, and which can be used for future upgrades of the motherboard 300.

The circuit elements needed for the optional external CRT support are illustrated in FIG. 4r. In addition to the CRT connector 354 itself, the circuitry consists of passive components 442 to provide filtering and circuit protection. If the motherboard 300 generates an accurate OSC signal, the additional oscillator 423 for CRT support is not required.

The CRT connector 354, a right angle high density female DB15 connector, is mounted directly to the motherboard 300. This is done to protect the integrity of the sensitive analog signals in the CRT lines, and to minimize transmission of noise from these signals, by keeping them on the board as much as possible.

To protect against transient voltages from the external CRT cabling that could damage the display controller 302, all of the signal lines attached to the CRT connector 354 use dual diode packages with the diodes in a totem pole arrangement that clamp the lines to VCC and ground. This prevents latch up of the CMOS circuitry in the VGA controller chip. The transient clamp current is limited by inline resistors or inductors between the clamps and the connector that are also used for filters.

The output signals to the CRT connector 354 are filtered for two purposes. First, to reduce the transfer of digital RF noise to the outside world through the CRT cabling, and second, to remove digital noise that would degrade the quality of the display signal and image. The horizontal and vertical synchronization signals use simple RC filtering, while the higher speed RGB lines use LC filtering with the inductor being a wire bead element. The inductor was chosen to be a good compromise between a high enough inductance to furnish adequate noise reduction and a low enough value to prevent blurring of the detail of the image.

The three color signal lines 443, red, green, and blue (RGB), are terminated with 150 ohm resistors R83, R88, R89 to ground to match the impedance of the CRT monitor and cabling to minimize ringing and reflections on the lines. This is a standard termination. Three "switch" signals 444 are returned from the CRT to the VGA controller to indicate the CRT display type. These signals 444 have standard terminations with pull-up resistors. This enables the use of simple grounds or opens on the CRT end to signal the display type. When no CRT is attached, these lines also indicate the absence of an external display to the display controller 302.

As described above, the system 100 includes a totally self contained power supply system including the generation of all internal voltages for logic and displays, power conditioning and protection circuitry, and battery charging and management. The power supply 320 is physically located on the motherboard 300. The detail circuitry is illustrated in FIGS. 4s through 4x. The system reset circuitry is part of the power supply section of the board, but all other system digital circuitry is somewhat isolated from the power supply area physically, and with a split through the power and ground planes that runs between the sections except for a small crossover area.

The layout of the power supply 320 is driven by the primary goals of high efficiency, low thermal output even during charging, small area and low profile, and low weight. High frequency switching supply circuits utilizing newer MOSFETs with low on resistance and small size allowed these goals to be reached.

Unlike traditional laptop environments, the system 100 can expect to see a wide range of external voltages that may vary during operation. The system 100 runs with the bulk of the voltages that would be expected, and to protect itself against potentially harmful high voltages and spikes.

Specifically, when running without the internal rechargeable battery, the system 100 derives its power from the 5 V switcher supply circuit 677. Switching power supplies generally require a minimum voltage to start up that is higher than the minimum voltage required to sustain operation. In this case, the switching supply requires approximately 8 volts to start, but then may drop down into the range of 6.5 to 7.0 volts before shutting down. The consequence of this is that, if used for vehicle diagnostics, for example, the system 100 may shut down or reset during engine cranking with a low battery and cold engine, but typical starts would not be a problem. The rechargeable battery (207 of FIG. 2a) and fast switchover circuitry circumvents the problem by providing a safety net to keep the system 100 operational during cranking or other external power dropouts.

On the high voltage side, the power supply 320 is designed to handle external sources of up to 30–32 volts. Higher voltages for extended periods can damage filter capacitors and transistors in the power supply, as well as degrade regulation performance such as ripple current ratings. Short spikes of overvoltage should be absorbed by the Transorb type device 445 at the input of the external source voltage (see FIG. 4u).

In FIG. 4u, overcurrent protection is provided by a polyswitch 446 that acts like a resettable fuse. A removable fuse may also be supplied in wiring harness cigarette lighter plugs, etc. The system current requirements can vary greatly with configuration items such as hard disks and display types. External source voltage will also affect the current (power is roughly constant in a given state, so lower voltage means higher current).

It is expected that the system 100 will occasionally see reversed voltages at the power input. This may occur due to operator error in attaching power clips, for example, or in a vehicle with a miswired cigarette lighter. The system 100 includes a diode 447 after the polyswitch 446 to protect against this reversal. Care must be taken when designing a module to connect to slots 201, 203 since the module could circumvent this protection and feed harmful reversed voltages into the system bus. Any module power that is not derived from the protected supply of the system 100, such as high side solenoid drive circuits, must be considered for its effect on the system 100. The GOODVBATT power line to the slots would usually be a good choice for such circuits, as it is after the polyswitch, anti-reversal diode, and surge suppressor protection, but is unregulated and therefore can supply fairly large currents without any loading on the regulation supplies.

The system 100 is designed for use with a sophisticated module specifically tailored for testing and diagnostics. By way of example, a module for vehicle testing and diagnostic will be described. A detailed diagram of a Flexible Vehicle Interface (FVI) for use with the system 100 is depicted in FIGS. 6a through 6g. The FVI is implemented as a general purpose interface for all vehicle test and diagnostic applications the system 100.

Figure 6D:
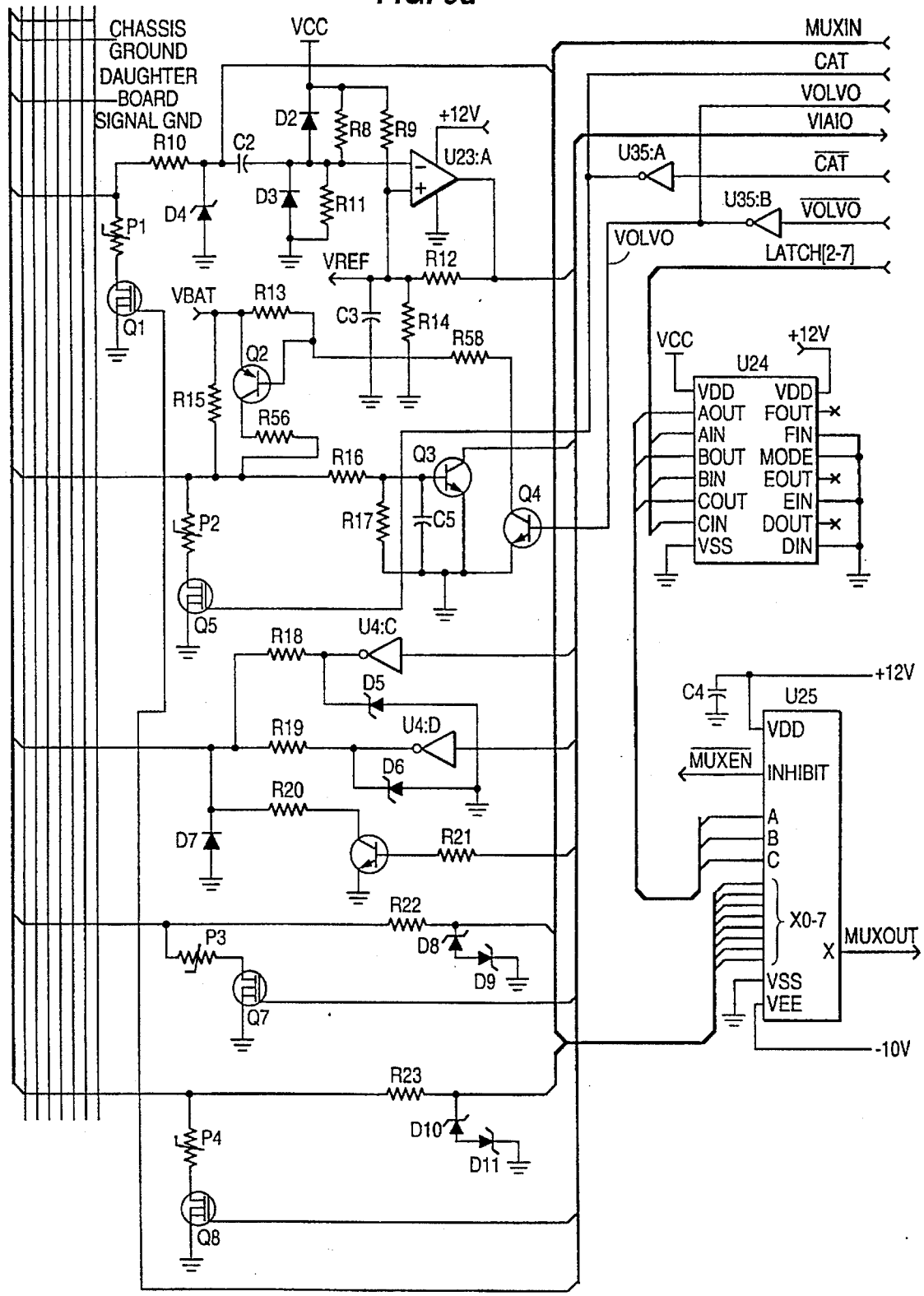
FIG. 6d is a schematic diagram of the first I/O section of the FVI.
Figure 6F:
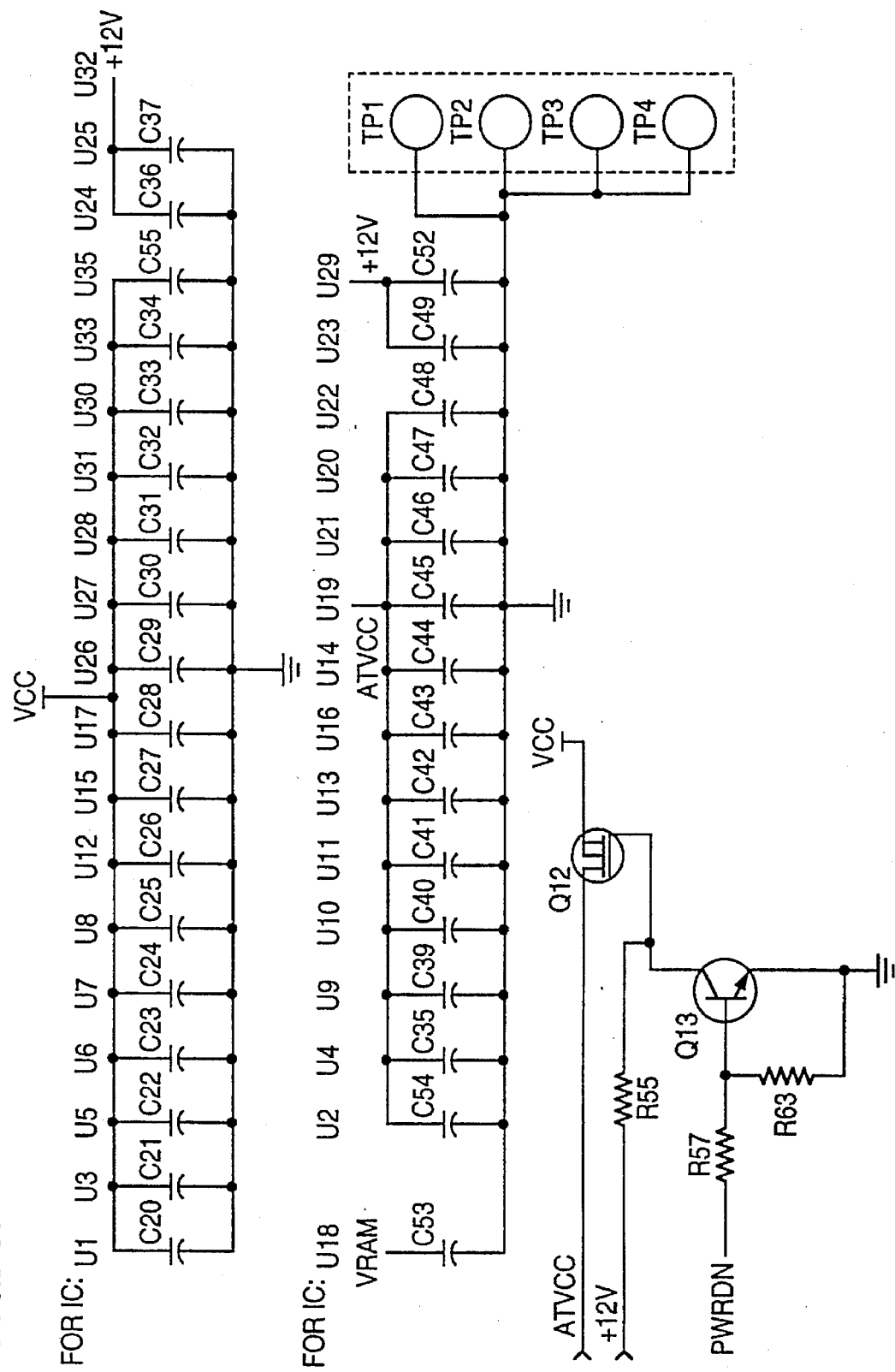
FIG. 6f is a schematic diagram of various power lines and capacitors that are housed in the FVI.

The FVI has several main components. A CPU 601 and various connections are shown in FIG. 6a. FIG. 6b illustrates a dual port RAM used for interface with the system 100. FIG. 6c illustrates the ISA bus interface for the FVI. FIGS. 6d and 6e illustrates first and second I/O sections of the FVI. The various power lines and capacitor are illustrated in FIG. 6f. FIG. 6g illustrates and example sequence of a read operation read for reading one byte from address zero (0).

The FVI can be partitioned into three major sections: the interface with the system 100 (System Interface); the interface with the vehicle being tested (Vehicle Interface); and the internal operations of the FVI (Internal FVI). The first two sections are relatively straight forward and are driven by the configuration of the system 100 and the type of vehicle being tested. The third section includes the hardware required to support the operation of the interfaces of the first two sections.

The System Interface is a slight modification of the standard ISA interface found in standard PC-AT type computers. In addition to the standard ISA interface, the System Interface has been modified to include a different connector to allow better grounding, provide additional power connections to permit external power input from the vehicle being tested. The System Interface also includes provision for host card select generation, and card power and reset pins to permit control of the FVI by the system 100.

The System Interface divides into two functional areas. First, a Dual-Port RAM interface, which is used as program memory for the FVI's CPU 601 and FVI-System communications. Second, an Interrupt/Serial ID interface is provided, which allows control of the FVI interrupt level and information on board configuration by software running on the system 100.

The dual port RAM interface provides access by the system 100 to the RAM without interfering with access by the FVI CPU 601 to the RAM to fetch instructions or data. The FVI CPU 601 is shown in FIG. 6a as being implemented with a 68HC11 processor. The above operation of the dual port RAM is need since the 68HC11 lacks a WAIT input to hold off memory accesses. The dual access is accomplished using a state machine which synchronizes the system 100 access request to the internal FVI memory cycles and executes the operations during the CPU 601 bus idle times. All access to the SRAM is disabled when the FVI is powered down by the system 100. When the FVI is held in reset by the system 100, the system 100 is permitted unrestricted access to the RAM.

The state machine has the following states: (1) IDLE; (2) SYNCHRONIZATION; (3) ACCESS START; (4) DELAY; (5) DATA ENABLE; and (6) END-OF-ACCESS WAIT.

The FVI CPU 601 (68HC11) access control is accomplished through combinational logic rather than a state machine. An interrupt/serial ID interface function is enabled only when the FVI is powered down and reset under System control. Interface selection is based on address bits 1 and 0: when address=3 the interrupt interface is selected; address=2 enables (write) or disables (read) the Serial ID PROM. Addresses 1 and 0 are used for PROM communication. For the Interrupt interface, a strobe is generated to latch the lower 4 bits of data to set the interrupt level for the FVI. The IOCHRDY line remains in the ready state.

The Serial ID requires a sequence of accesses to load the start address and read out the data. Commands are entered into the EPROM by toggling address bit 0. An enabling jumper may be used to make it possible to write to the Serial ID Prom.

The Vehicle Interface has five general types of vehicle interfaces: (1) Discretes; (2) Slow Single-Wire Serial (less than 1000 baud); (3) Past Single-Wire Serial (greater than 1000 baud); (4) Differential Serial; and (5) Analog Input. The discrete inputs, discrete outputs, and Slow Single-Wire Serial interfaces are handled by using level translators interfacing to an interface adapter IC. Bit state detection is done by software for the inputs. Output is performed by driving output level translators in software through an interface adapter IC. Fast single-wire and differential serial channels use hardware UARTs. The Analog input is handled by Analog-to-Digital converters built into the FVI CPU 601.

The Internal FVI section includes the FVI CPU 601 (68HC11), the DUART, VIA, address decode PLD, and other supporting hardware. The FVI CPU 601 initializes the other devices and performs whatever other functions are required to operate the external interfaces.

Referring to FIGS. 6a through 6g, the operation and design of the above described three sections will be described. The dual port interface of the System Interface is partitioned into two PLD's (22V10), 610 and 611 which control the SRAM and system 100 interface and the FVI CPU 601 interface plus the Interrupt and Serial ID control logic, respectively. Both PLD's are clocked by the 14.3196 MHz RAWOSC signal 612 provided by the system 100. The SRAM control PLD 610 also protects the upper 16K bytes of RAM from writes by the FVI CPU 601. This function is provided to keep a software error from overwriting the interrupt vector addresses located at the top of the memory address space.

A typical access cycle by the system 100 is as follows. The system 100 asserts the memory read 613 or write 614 line and the card select line 615. If asserted during the time ECLK 616 is low, the request is held until ECLK 616 is high. This permits use of the entire ECLK 616 low period for system 100 access to RAM. The IOCHRDY (I/O channel ready) line 617 is forced immediately to the "not ready" state.

When ECLK 616 next goes low, the state machine enables the system address into the dual port RAM. For a write operation the data is also enabled in. For a read operation, the data outputs are not yet enabled to minimize noise due to changing outputs from the RAM.

A delay cycle occurs now to allow for RAM access delays. At the next clock, the write enable to the RAM is driven high during a write cycle. For a read cycle, the data is enabled out to the system 100 and latched. At this clock, the IOCHRDY line 617 is driven to the ready state. All control lines activated for the system access are deasserted except for the read data enable for the system bus. The state machine remains in this state until the system 100 terminates the memory read (or write) line 613 (614) and the card select line 615. The system 100 is not permitted a second access to the FVI dual-port RAM until it has cleared the previous access request.

The FVI CPU 601 (68HC11) access is a simple combinational output, with write access qualified by the upper two address lines (A15, A14) to block writes to the top of memory. The FVI CPU 601 is granted exclusive access to the RAM while ECLK 616 is high.

Interrupt/Serial ID functions are accessible only when the PWRDN 618 and CRDRST 619 inputs are active from the system 100. The interrupt level is set by writing to a four bit register in the FVI. Each bit corresponds to an interrupt level connected to the FVI. Multiple interrupt levels can be made simultaneously active by writing data with more than one '1' to the interrupt level select register.

All interrupts are disabled on reset. The reset to the register is driven from the PLD 611 which inverts 620 the RESETDRY line 619 from the system interface for the reset. The two least significant bits (LSBs) of the system address are used to select the interrupt register. If a write to address 3 occurs, the four least significant bits of the data bus are clocked into the interrupt register.

The clock for the interrupt level register is generated by a combination of CRDSEL 615 and MEMW 614 Serial ID Interface. The normal readout sequence for the serial ID is as follows.

Serial ID access is started with a write to address 2. This must occur at least 500 nanoseconds before the next step. Next, an instruction is loaded, most significant bit (MSB) first, by reading or writing addresses 0 and 1 in the proper sequence. Two accesses are required per bit for this and following operations. Next an address is loaded, MSB first, by reading or writing addresses 0 and 1 in the proper sequence. After the address is loaded, a single address may be used for data readout. The data is then read out MSB first. Finally the serial ID access is ended with a read of address 2. FIG. 6g illustrates a sequence which reads one byte from address 0.

Instructions are an 8 bit field, and consist of: (1) Write enable (WREN)-06H; (2) Write disable (WRDI)-04H; (3) Read (READ)-03H; and (4) Write (WRITE)-02H (1 to 4 bytes at a time).

Write operations are disabled on the board by a 1K pulldown on the _WP (Write Protect) line. This may be overridden by installing a connector, and jumpering the WP line to Vcc. Address is 8 bits, but need only be loaded at the beginning. As long as the _CS line is held active the address will be automatically incremented after each byte is read out. Data is 8 bits wide. The clock for the serial ID is generated by a state machine toggles the clock line each time address 0 or 1 is accessed when the FVI is powered down.

The Fast Serial (J1708) interface is implemented using a standard differential transceiver 667 (FIG. 6e), shown as the Texas Instruments' 75176A chip, with biasing as specified in the SAE spec. As the driver and receiver sections are capable of handling signals of over 1 MHz, the required 9600 baud maximum data rate is easily managed.

Enable controls are used to multiplex the users of the DUART channels. The serial data input and output is handled by the DUART. The baud rate is set by the output of a Programmable Timer.

The RS-232 interface uses a MAX222 621 (FIG. 6e) to provide level translation between the TTL level signals of the on-board DUART and the external ±10 V signals for input and output. A shutdown control is provided to permit multiplexing of the pins used for the RS-232 interface.

The Slow Serial (ATEC 160) interface uses an analog multiplexer to route the serial data stream to a comparator circuit. This circuit filters and level shifts the input signal to a clean TTL level input which is routed to a port on the FVI CPU 601 and the VIA.

Output signals are generated by software control of a transistor which grounds the output line. This line is routed through the analog multiplexer to the appropriate connector pin.

Output discretes are controlled by VIA outputs which turn on transistors. These transistors connect the lines to ground or, in the case of a Volvo, to the high voltage rail (FIG. 6d). Input discretes are routed through the same analog multiplexer as the Slow Serial channels. They are made available through the FVI CPU 601 input port.

The illustrated example of the FVI is provided for specific types of vehicles. These are describe briefly below.

The GM Fast Serial (8192) interface uses an analog multiplexer to route the serial data stream to a comparator circuit. This circuit filters and level shifts the input signal to a clean TTL level input which is routed to channel A of the DUART. Output signals are generated by the DUART control of a transistor which grounds the output line. This line is routed through the analog multiplexer to the appropriate connector pin. The slow Serial (160 baud) interface uses an analog multiplexer to route the serial data stream to a comparator circuit. This circuit filters and level shifts the input signal to a clean TTL level input which is routed to a port on the 68HC11 and the VIA. Output signals are generated by software control of a transistor which grounds the output line. This line is routed through the analog multiplexer to the appropriate connector pin. Output discretes are controlled by VIA outputs which turn on transistors. These transistors connect the lines to ground. Input discretes are routed through the same analog multiplexer as the Slow Serial channels. They are made available through the FVI CPU 601 input port. The analog interface uses a buffer and noise filter which connects to an analog to digital converter channel in the FVI CPU 601.

The Ford Fast Serial (DCL) interface is implemented using the TI 75176A standard differential transceiver, with biasing as specified in the DCL spec. As the driver and receiver sections are capable of handling signals of over 1 MHz, the required 19200 baud maximum data rate is easily managed. Enable controls are used to multiplex the users of the DUART channels. The serial data input and output is handled by the DUART. The baud rate is set by the output of the Programmable Timer. Output discretes and the slow serial interfaces are controlled by VIA outputs which turn on transistors. These transistors connect the lines to ground. Input discretes are routed through the same analog multiplexer as the Slow Serial channels. They are made available through the FVI CPU 601 input port and the VIA.

The Chrysler Past Serial (CCD) interfaces uses a special IC interface a DUART channel to the CCD channel. Connection to the output pins is controlled by an analog switch that protects the IC against damaging voltages while the FVI is being used in other applications. Control lines from the VIA are used to multiplex the serial data onto DUART channel B. The Slow Serial (SCI) interface uses an analog multiplexer to route the serial data stream to a comparator circuit. This circuit filters and level shifts the input signal to a clean TTL level input which is routed to a port on the DUART. Output signals are generated by DUART control of a transistor which grounds the output line. This line is routed through the analog multiplexer to the appropriate connector pin. Output discretes are controlled by VIA outputs which turn on transistors. These transistors connect the lines to ground. Input discretes are routed through the same analog multiplexer as the Slow Serial channels. They are made available through the 68HC11 input port.

Details of the Internal FVI operations are described. The FVI CPU 68HC11 processor 601 provides multiple functions. Running in expanded mode to fetch its instructions from the external RAM, it controls the realtime operation of the FVI's vehicle interfaces. It also provides the analog-to-digital converters needed in the GM Brake application. An internal UART and an SCI interface is made available for expansion.

A simple combinational decode of the 68HC11 address 688 (FIG. 6a) is used to select what device should respond on the internal bus. The SRAM line is qualified by ECLK 691 to prevent contention on the bus. A decode line is also provided for expansion.

A 128K by 8 bit static RAM 697 (FIG. 6b) is used for both program and data by the 68HC11 CPU 601, though only 64K is actually used due to the limits of the 68HC11's address space. The most-significant address line is tied to ground to avoid problems caused by a floating address line. While it functions as a dual port RAM, this function is transparent to the 68HC11 CPU 601. Proper operation of the FVI requires the system 100 to initialize the SRAM 697 with software to initialize and operate the vehicle interface.

An Exar 88C681 Dual UART 698 and an 82C54-type Programmable Timer 699, are provided and work in concert to allow the FVI to operate at the wide range of baud rates required. The 82C54 timer 699 takes the divided RAWOSC clock 651 and divides it down to the required clock rate as programmed by the 68HC11. Two of the three outputs are used by the 88C681 while the third is reserved for expansion. The DUART also provides some output lines for vehicle interface control.

The VIA 639, a 65C22 chip, provides most of the control outputs for the FVI vehicle interface. Some inputs are used to sense the state of input lines on the vehicle interface as well. All functions are under software control.

To provide for vehicle interfaces as needed, particularly OBD II and ISO9141, provision is made for connection 602 of a daughterboard to add the additional functions. All the FVI CPU 601 (68HC11) address, data, and control lines are routed to the daughterboard connector 602. Also provided are clocks and a select line to define the address space allocated to the daughterboard. The 68HC11 SCI and UART interfaces are dedicated to the daughterboard. A second connector routes all the pins from the external connector to the daughterboard.

FIGS. 7a and 7b show the detailed circuitry and signal lines used in the PCMCIA board interface 321. In FIG. 7a, these include a CL-PD6720 chip 721, which functions as the PCMCIA adapter board 329, a slot A connector 325, and a slot B connector 327 of FIG. 3. FIG. 7b shows the connector 811 that joins the PCMCIA board interface 321 to the backplane board 311. FIG. 7b also shows two possible options in providing power to a PCMCIA board that connects with the PCMCIA board connector 321.

FIGS. 8a and 8b show the detailed circuitry and signal lines used in the backplane board 311. FIG. 8a shows the motherboard connector 313, the I/O slot zero connector 201, and the I/O slot one connector 203. FIG. 8b shows the expansion board connector 205 and the PCMCIA board connector 321.

While preferred embodiments of the invention have been described herein, modifications of the described embodiments may become apparent to those of ordinary skill in the art, without departing from the scope of the invention as set forth in the appended claims.

What is claimed is:

1. A PC-based diagnostic system for diagnosing a unit under test, comprising:

a motherboard housed on a first circuit board;

a backplane housed on a second circuit board and coupled to said motherboard through a first bus, control lines and power lines, said second circuit board including a first and a second I/O module connection port;

a connection circuit housed on a third circuit board and connected to said backplane through a second bus; and a keyboard adapter circuit housed on a fourth circuit board and connected to said motherboard through a data and control bus, said keyboard adapter circuit providing for connection of a keyboard to said motherboard, said keyboard providing for operator-entered data to be sent to said motherboard;

wherein said backplane board provides data and instruction transfer between a processor housed on said motherboard and one of a first I/O module connected to said first I/O module connection port on said backplane board, a second I/O module connected to said second I/O module connection port, and a third module connected to said connection circuit, at least one of said first and second I/O modules being coupled to said unit under test to enable transfer of data between said PC-based diagnostic system and said unit under test, said data being used by said PC-based diagnostic system to diagnose said unit under test, and wherein said first and second buses are coupled to each other via said backplane board to provide for transfer of information between said first, second and third I/O modules and said motherboard.

2. A PC-based diagnostic system according to claim 1, wherein said first and second buses are industry standard architecture (ISA) buses.

3. A PC-based diagnostic system according to claim 1, wherein said connection circuit is configured to provide a connection to a PCMCIA module.

4. A PC-based diagnostic system according to claim 1, wherein said backplane board is configured such that said motherboard is positioned closer to said connection circuit than to said first and second I/O module connection ports when said motherboard and said connection circuit are connected to said backplane board.

5. A PC-based diagnostic system according to claim 1, wherein said motherboard further comprises:

a local control bus, address bus, and data bus;

a system controller connected to said processor by said local control bus, address bus, and data bus, said system controller providing a data and control signal interface between said processor and an externally-mounted keypad, and said system controller providing an industry standard architecture (ISA) bus interface between said motherboard and said backplane;

a power supply connected to an external power source for providing power to said system;

a plurality of BIOS ROMs for storing input/output programs;

an address decoder connected to said system controller and configured to provide a decoded address for retrieving said input/output programs from said BIOS ROMs under control by said system controller; and an I/O chip for providing a parallel port interface, an RS-232 port interface, a floppy drive interface, a hard disk drive interface, a keyboard interface, a mouse interface, and an RS-485 interface, wherein said I/O chip provides information transfer between said system and external devices coupled to said interfaces.

6. A PC-based diagnostic system according to claim 5, wherein said backplane board further comprises:

a first I/O module connector for providing a connection to said first I/O module;

a second I/O module connector for providing a connection to said second I/O module;

an expansion connector for providing a connection to a docking station; and a PCMCIA board connector for providing a connection to said connection circuit, wherein said first I/O module connector is coupled by a raw power line to said power supply of said motherboard to provide an alternative source of power to said system through said first I/O module, said alternative source of power being provided by said unit under test.

7. A PC-based diagnostic system according to claim 1, wherein said motherboard includes a plurality of layers including a ground-plane layer and an internal power layer, each layer providing partial separation of digital and power supply areas on said each layer, and wherein said motherboard includes a plurality of surface-mounted components which are all mounted on one side of one layer of said motherboard.

8. A PC-based diagnostic system, comprising:

a motherboard which houses a processor and a system controller;

a plurality of I/O module connection ports for respectively connecting to one or more I/O modules, each of said I/O modules including a dual-port-RAM for performing specialized diagnostic testing of devices respectfully connected to said I/O modules; and a backplane a backplane board connecting said motherboard to said plurality of I/O module connection ports, said backplane board providing for transfer of information over a first bus between said motherboard and said backplane board and a second bus between said backplane board and said one or more I/O modules, and providing for module selection control, module resetting control, and module power down control to said one or more I/O modules via control signals sent from said system controller, through said backplane board, and to said plurality of I/O module connection ports, wherein said first and second buses are coupled to each other via said backplane board to provide for transfer of information between said one or more I/O modules and said motherboard.

9. A PC-based diagnostic system according to claim 8, wherein said backplane board further comprises:

an expansion connector port; and a PCMCIA board connector interface, wherein said motherboard provides a first signal to said expansion connector port and to said PCMCIA board connector interface via said backplane board to determine if a call initiation request made by said processor to a board connected to one of said expansion connector port and said PCMCIA board connector interface has been acknowledged, and said motherboard provides a second signal to said expansion connector port and said PCMCIA board connector interface via said backplane board to act as an interrupt signal that is sent to said motherboard by said one or more I/O modules.

10. A PC-based diagnostic system according to claim 9, wherein said expansion connector port provides a coupling of said system to a diagnostic docking station.

11. A PC-based diagnostic system according to claim 10, wherein said first and second buses are industry standard architecture ISA buses.

12. A PC-based diagnostic system for diagnosing a unit under test, comprising:

a motherboard housed on a first circuit board;

a backplane housed on a second circuit board and coupled to said motherboard through a first bus, control lines and power lines, said second circuit board including a first and a second I/O module connection port;

a connection circuit housed on a third circuit board and connected to said backplane through a second bus; and a keyboard adapter circuit housed on a fourth circuit board and connected to said motherboard through a data and control bus;

wherein said backplane provides data and instruction transfer between a processor housed on said motherboard and one of a first I/O module connected to said first I/O module, connection port on said backplane, a second I/O module connected to said second I/O module connection port on said backplane board, and a third I/O module connected to said connection circuit, said unit under test being connected to at least one of said first, second and third I/O module.

13. A PC-based diagnostic system according to claim 12, wherein said third I/O module is a PCMCIA module, and said connection circuit provides for coupling of said PCMCIA module to said backplane.

14. A PC-based diagnostic system according to claim 13, wherein said first and second buses are industry standard architecture ISA buses.

* * * * *

(12) EX PARTE REEXAMINATION CERTIFICATE (10482nd)

United States Patent
Cunningham et al.

(10) Number: US 5,659,680 C1
(45) Certificate Issued: Jan. 27, 2015

(54) PC COMPATIBLE MODULAR BASED DIAGNOSTIC SYSTEM

(75) Inventors: Glen B. Cunningham, Boston, MA (US); Andrew R. Reading, Rochester Hills, MI (US); Michael F. Kapolka, Sterling Heights, MI (US)

(73) Assignee: Cian IP LLC, Longview, TX (US)

Reexamination Request:
No. 90/012,410, Jul. 30, 2012

Reexamination Certificate for:
Patent No.: 5,659,680
Issued: Aug. 19, 1997
Appl. No.: 08/491,341
Filed: Jun. 30, 1995

(51) Int. Cl.
*G06F 11/00* (2006.01)
*G01R 31/28* (2006.01)

(52) U.S. Cl.
CPC .................................... *G01R 31/28* (2013.01)
USPC .......................................................... 714/25

(58) Field of Classification Search
None
See application file for complete search history.

(56) References Cited

To view the complete listing of prior art documents cited during the proceeding for Reexamination Control Number 90/012,410, please refer to the USPTO's public Patent Application Information Retrieval (PAIR) system under the Display References tab.

*Primary Examiner* — Mary Steelman

(57) ABSTRACT

A PC-based diagnostic system is modular-based, and includes a motherboard, a backplane board, a PCMCIA board, and a keypad adapter board. The motherboard communicates with I/O modules connected to the backplane board, PCMCIA modules connected to the PCMCIA board, and with a keypad or a mouse through the keypad adapter board. Based on the type of device to be tested, various diagnostic programs can be accessed internally to provide the signals used to perform the test. A system controller and a processor are provided on the motherboard to control the transfer of data and control from the motherboard, through the backplane, and to the I/O modules. Additional select lines are provided to select one or more I/O modules during a test. An ISA bus is also provided in a standard arrangement.

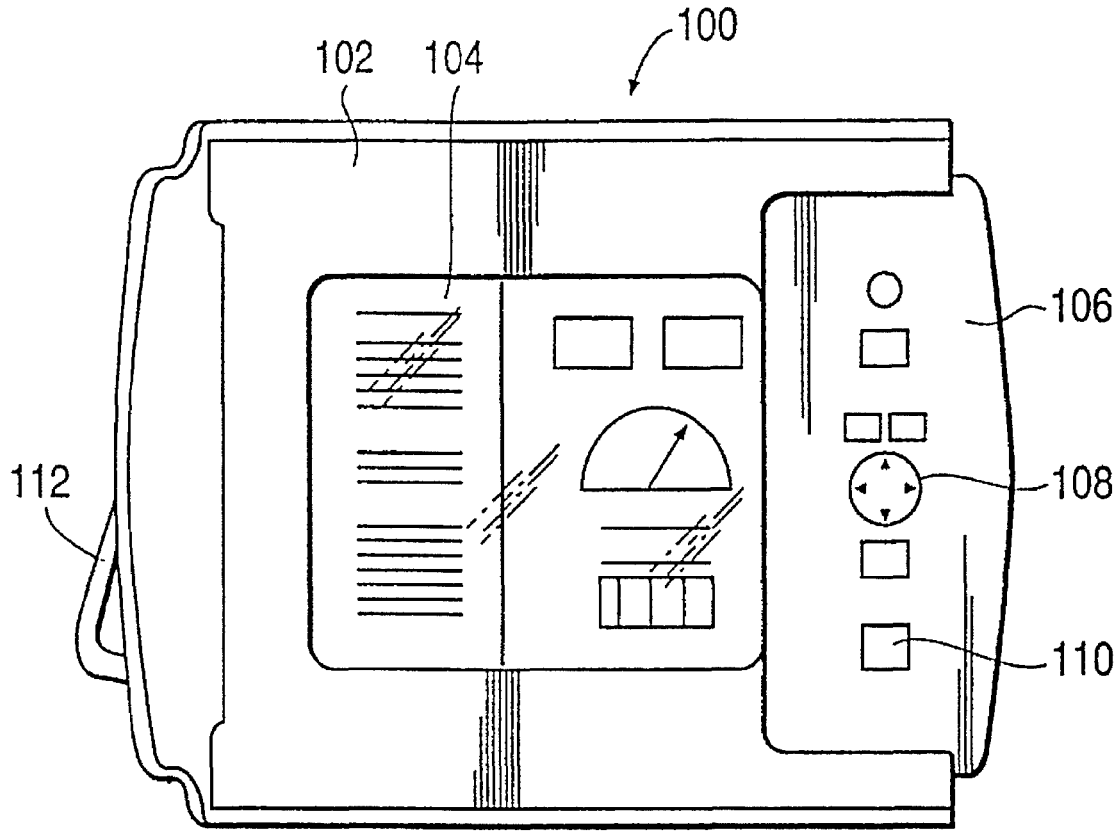

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-3, 8 and 12-14 are cancelled.

Claims 4-7 and 9-11 were not reexamined.

\* \* \* \* \*